(12) United States Patent
Dobashi et al.

(10) Patent No.: US 7,250,973 B2
(45) Date of Patent: Jul. 31, 2007

(54) IMAGE PICKUP APPARATUS FOR REFLECTING LIGHT AT AN AREA BETWEEN SUCCESSIVE REFRACTIVE AREAS

(75) Inventors: Hideki Dobashi, Tokyo (JP); Eriko Namazue, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 914 days.

(21) Appl. No.: 10/369,938

(22) Filed: Feb. 19, 2003

(65) Prior Publication Data
US 2003/0179457 A1 Sep. 25, 2003

(30) Foreign Application Priority Data
Feb. 21, 2002 (JP) ............................. 2002-044645
Feb. 21, 2002 (JP) ............................. 2002-044806

(51) Int. Cl.
*H04N 5/225* (2006.01)
*H04N 9/07* (2006.01)
(52) U.S. Cl. ..................... 348/340; 348/336
(58) Field of Classification Search ............... 348/340, 348/335, 336, 276; 359/634
See application file for complete search history.

(56) References Cited

U.S. PATENT DOCUMENTS 6,078,429 A * 6/2000 Lyon ........................ 359/634
6,259,083 B1 7/2001 Kimura
6,583,438 B1 * 6/2003 Uchida ....................... 257/59
6,590,270 B2 * 7/2003 Suzuki ...................... 257/436
7,110,034 B2 * 9/2006 Suda .......................... 348/340

FOREIGN PATENT DOCUMENTS

| EP | 0 948 055 | 10/1999 |
| JP | 06-224398 | 8/1994 |
| JP | 10-154805 | 6/1998 |
| JP | 2001-237405 | 8/2001 |

* cited by examiner

*Primary Examiner*—Vivek Srivastava
*Assistant Examiner*—Kelly Jerabek
(74) *Attorney, Agent, or Firm*—Cowan, Liebowitz & Latman, P.C.

(57) ABSTRACT

An image pickup element includes: a photoelectric conversion section; a wavelength selection section formed closer to an incident side of light than said photoelectric conversion section, for transmitting light in a predetermined wavelength range; a first area having a predetermined refractive index and being formed closer to the incident side of light than said wavelength selection section; and a second area having a predetermined refractive index and being formed closer to the incident side of light than said first area wherein the refractive index of said first area is higher than the refractive index of said second area.

14 Claims, 56 Drawing Sheets

FIG. 23

| LAYER | MATERIAL | BLUE [nm] | GREEN [nm] | RED [nm] |
|---|---|---|---|---|
| 11 | TiO2 | | 63 | 29 |
| 10 | SiO2 | | 95 | 88 |
| 9 | TiO2 | 78 | 126 | 58 |
| 8 | SiO2 | 99 | 95 | 88 |
| 7 | TiO2 | 67 | 63 | 58 |
| 6 | SiO2 | 101 | 95 | 88 |
| 5 | TiO2 | 67 | 63 | 58 |
| 4 | SiO2 | 101 | 95 | 88 |
| 3 | TiO2 | 67 | 126 | 58 |
| 2 | SiO2 | 101 | 95 | 88 |
| 1 | TiO2 | 61 | 63 | 29 |
| TOTAL | | 742 | 977 | 731 |

FIG. 55

| LAYER | MATERIAL | BLUE [nm] | GREEN [nm] | RED [nm] |
|---|---|---|---|---|
| 11 | TiO2 | | 63 | 29 |
| 10 | SiO2 | | 95 | 88 |
| 9 | TiO2 | 78 | 126 | 58 |
| 8 | SiO2 | 99 | 95 | 88 |
| 7 | TiO2 | 67 | 63 | 58 |
| 6 | SiO2 | 101 | 95 | 88 |
| 5 | TiO2 | 67 | 63 | 58 |
| 4 | SiO2 | 101 | 95 | 88 |
| 3 | TiO2 | 67 | 126 | 58 |
| 2 | SiO2 | 101 | 95 | 88 |
| 1 | TiO2 | 61 | 63 | 29 |
| TOTAL | | 742 | 977 | 731 |

IMAGE PICKUP APPARATUS FOR REFLECTING LIGHT AT AN AREA BETWEEN SUCCESSIVE REFRACTIVE AREAS

BACKGROUND OF THE INVENTION

1. Field of the Invention

The present invention relates to an image pickup element for picking up an object image.

2. Related Background Art

FIG. 1 shows a structure of a general image pickup element 61 for forming a color image, which has been used up to now. Reference numeral 501 denotes a silicon wafer; 502, a microlens; 503, a photoelectric conversion section having a function for converting a received photon into an electric charge; 504 (504r and 504g), color filters for separating wavelengths of a light; and 510, a Poly wiring layer serving as a gate for controlling an electric charge of the photoelectric conversion section. Reference numerals 511 to 513 denote wiring layers made of a metal such as aluminum. Among them, reference numeral 511 denotes an AL1 wiring layer serving as a connection between respective layers and an output line; 512, an AL2 wiring layer serving as a well power supply line and a control line; and 513, an AL3 wiring layer serving as a light shield and a power supply line. FIG. 2 is a view of the image pickup element 61 viewed from above.

Each pixel constituting the image pickup element 61 is provided with a primary color filter of R (red), G (green), or B (blue). In addition, as a color filter, there is a complementary color filter which uses three colors of C (cyan), M (magenta), and Y (yellow) as well. An image pickup technology is widely used in which: pixels are arranged in a mosaic shape; and then, luminance information and color information corresponding to the number of pixels are created by signal processing. As a color filter array of the image pickup element 61 used here, a structure called a Bayer array is often adopted. In FIG. 2, reference symbol 61nmg denotes a first green pixel; 61nmb, a blue pixel; 61nmr, a red pixel; and 61nmg2, a second green pixel. m indicates an array number of a pixel in a horizontal direction and n indicates an array number of a pixel in a vertical direction. These are regularly arranged as shown in FIG. 2 to constitute one image pickup element. In such a pixel array, the number of green pixels is twice as many as that of blue or red pixels. Although it is basically possible to create a color image if there are the same number of pixels for each of three colors, an image quality can be improved by increasing the number of green pixels having a rather high visibility.

However, the above-mentioned conventional example has problems as described below. In general, image pickup for obtaining satisfactory image characteristics consists of a first process for forming an object image with an optical apparatus, a second process for adjusting a high frequency component of a spatial frequency characteristic of the object image to suppress the component, a third process for photoelectrically converting the object image whose spatial frequency characteristic has been adjusted, and a fourth process for correcting a response according to a spatial frequency with respect to an obtained electric signal. In this case, since sampling of an optical image is performed with the image pickup element having a limited number of pixels, in order to obtain a high quality image output, it is necessary to reduce components of a Nyquist frequency or more peculiar to the image pickup element in the spatial frequency characteristic of the optical image in accordance with the sampling theorem. Here, the Nyquist frequency is a frequency that is a half of a sampling frequency depending upon a pixel pitch. Therefore, the optimized series of processes is for obtaining a high quality image, in which aliasing distortion is less conspicuous, that is, moiré is less conspicuous, by adjusting an optical image to be sampled such that it becomes an optical image having a characteristic according to the Nyquist frequency peculiar to the image pickup element.

A modulation transfer function (MTF), which is a spatial frequency transmission characteristic of an image, is an evaluation amount with which a characteristic concerning a sharpness of a digital still camera, a video camera, or the like can be represented well. Specific factors affecting this MTF are an imaging optical system serving as an optical apparatus, an optical lowpass filter for band limitation of an object image, an opening shape of a photoelectric conversion area of an image pickup element, digital aperture correction, and the like. An overall MTF representing a final image characteristic is given as a product of MFTs of the respective factors. That is, it is sufficient to find MTFs of the above-mentioned first to fourth processes and calculate a product of the MTFs.

However, since digital filter processing as the fourth process is applied to an image output which has already been sampled by the image pickup element, it is unnecessary to take into account high frequencies exceeding the Nyquist frequency.

Therefore, the structure for reducing components of the Nyquist frequency or more peculiar to the image pickup element in the spatial frequency characteristic of the optical image means that components of the Nyquist frequency or more are small in the product of MTFs of the first, second, and third processes excluding the fourth process. Here, in the case in which image pickup is performed on the premise that a still image is viewed as in a digital still camera, it is necessary to take into account the fact that an image with a higher resolution is easily obtained when a response in a frequency slightly below the Nyquist frequency is higher even if high frequencies exceeding the Nyquist frequency are not eliminated but remain more or less.

In the formation of an object image with the imaging optical system, which is the first process, in general, an optical aberration is easier to be corrected in a center of a screen than in a peripheral part of the screen. In the center of the image in order to obtain a satisfactory image in the peripheral part of the screen, it is necessary to obtain an extremely satisfactory characteristic close to a diffraction limit MTF, which depends upon an F number of an imaging lens. In recent years, since miniaturization of pixels of an image pickup element has been advanced, this necessity is increasing. Therefore, it is better to consider the MTF for the imaging optical system assuming that it is an ideal aplanatic lens.

In addition, in an image pickup element in which light receiving openings with a width d are laid without a gap, since the width of the light receiving openings coincides with a pixel pitch, a response value of the third process at the Nyquist frequency u=d/2 is rather high. Therefore, it is a general practice to trap the vicinity of the Nyquist frequency in the second process in order to decrease a total MTF in the vicinity of the Nyquist frequency.

In the second process, an optical lowpass filter is usually used. A material having a birefringent characteristic such as a rock crystal is utilized for the optical lowpass filter. In addition, a phase-type diffraction grating as disclosed in Japanese Patent Application Laid-Open No. 2000-066141 may be utilized.

When a birefringent plate is placed in an optical path of an optical apparatus and is arranged to be slanted such that its optical axis is in parallel with a horizontal direction of an imaging surface, an object image according to ordinary light and an object image according to extraordinary light are formed deviating from each other in the horizontal direction by a predetermined amount. Trapping a specific spatial frequency with the birefringent plate means that a bright part and a dark part of a stripe of the spatial frequency are shifted so as to be overlapped with each other. An MTF according to the optical lowpass filter is represented by expression (1).

$$R_2(u) = |\cos(\pi \cdot u \cdot \omega)| \quad (1)$$

Here, $R_2(u)$ represents a response, u represents a spatial frequency of an optical image, and $\omega$ represents an object image separation width.

If a thickness of the birefringent plate is selected appropriately, it is possible to eliminate the response in the Nyquist frequency of the image pickup element. In the case in which the diffraction grating is utilized, the same effect can be obtained through diffraction by separating the optical image into a plurality of images having a predetermined positional relationship and superimposing the images.

However, it is necessary to grow a rock crystal or a crystal of lithium niobate or the like and then grind it to be thin in order to manufacture the birefringent plate, which presents a problem in that the birefringent plate is extremely expensive. In addition, even if the diffraction grating is utilized, since a highly precise microstructure is required of the diffraction grating, it is still expensive.

Next, as to an efficiency of utilization of light, for example, in a CCD image pickup element in which pixels with a primary color filter, which is considered to have a high color reproducibility, are arranged in a mosaic shape, one each of optical filters of R (red), G (green), and B (blue) are arranged between a microlens 2 and a photoelectric conversion area 3.

In this case, in a pixel with the red optical filter, only red light are photoelectrically converted and blue light and green light are absorbed by the optical filter to be heat. In a pixel with the green optical filter, the blue light and the red light are not photoelectrically converted and become heat in the same manner. In a pixel with the blue optical filter, the green light and the red light are not photoelectrically converted and become heat in the same manner. That is, only light, which have been transmitted through a predetermined optical filter, in an incident light beam are photoelectrically converted and outputted as an electric signal in each pixel of the conventional color image pickup element. Thus, light which could not be transmitted through the optical filter are disposed as heat or the like.

FIG. 3 shows a spectral transmittance characteristic of R, G, and B color filters in an image pickup element. Since a transmittance of an infrared light is high, an infrared light cut filter for blocking a wavelength of 650 nm or more is actually further laid over these color filters between the image pickup element and an image pickup lens. As it is seen from this, only approximately one third of visible light are used effectively in one pixel.

Considering an efficiency of utilization for each color of R, G, and B more in detail, for example, an area ratio of R, G, and B pixels of a color image pickup element of the Bayer array shown in FIG. 13 is $1/4 : 2/4 : 1/4$ in case that an area of one unit constituting a regular array is assumed to be one. Thus, a utilization ratio of green light in case that a total amount of light is assumed to be one is $1/3 \times 2/4 = 1/6$ as a product of a term of wavelength selectivity and a term of an area ratio, and that of red light and blue light is $1/3 \times 1/4 = 1/12$. In total, a utilization ratio of the light is $1/6 + 1/12 + 1/12 = 1/3$. Therefore, the efficiency of utilization is still $1/3$. On the contrary, when a total amount of light is assumed to be one, $2/3 \times 2/4 = 1/3$ of the green light and $2/3 \times 1/4 = 1/6$ of the red light and the blue light are not effectively utilized.

The above description is made referring to the image pickup element using the color filters of primary colors. In an image pickup element using complimentary color filters, approximately $1/3$ of visible light are not photoelectrically converted and effectively utilized. In this way, no matter whether the color filters of primary colors or the color filters of complimentary colors are used, an efficiency of utilization of light is low in a conventional single plate image pickup element because an image pickup surface is divided by the color filters.

In addition, a structure for efficiently taking in light incident on an image pickup element is disclosed in Japanese Patent Application Laid-Open No. 06-224398 (FIG. 4). FIG. 5 shows a result of tracing incident light in the structure described in this patent application. Reference numeral 16 denotes a cap layer consisting of resin, which is formed of a material having a refractive index of approximately 1.6. Reference numeral 17 denotes a low refractive index layer, which is formed of resin having a refractive index lower than that of the cap layer 16 or formed in hollow (in which the air or an inert gas such as nitrogen is filled). Consequently, since an interface between the cap layer 16 and the low refractive index layer 17 becomes a surface on which light tends to be totally reflected, it is intended to take in oblique-incident light.

However, the above-mentioned conventional example has problems as described below. When a shape of an incidence section, which is the interface between the cap layer 16 formed of a high refractive index material and the low refractive index layer 17 and is on the object side, is an R shape as in FIG. 4, even if a part of oblique-incident light are reflected on the R surface, the light form an angle exceeding a total reflection condition on a surface on the opposite side and directly passes through the R surface to the low refractive index layer 17 as show in the result of tracing light of FIG. 5. The light having passed through the R surface may enter an adjacent pixel, which may also become a problem.

SUMMARY OF THE INVENTION

An object of the present invention is to realize an image pickup element in which an efficiency of utilization of incident light is enhanced.

In order to attain the above-mentioned object, according to an aspect of the present invention, there is provided an image pickup element including: a photoelectric conversion section; a wavelength selection section formed closer to an incident side of light than the photoelectric conversion section, for transmitting light of a predetermined wavelength range; a first area having a predetermined refractive index and being formed closer to the incident side of light than the wavelength selection section; and a second area having a predetermined refractive index and being formed closer to the incident side of light than the first area, wherein the refractive index of the first area is higher than the refractive index of the second area.

Further, according to another aspect of the present invention, there is provided an image pickup element including:

a first area having a first refractive index and guiding light to a photoelectric conversion section; and a second area having a second refractive index lower than the first refractive index and being formed in a peripheral part of the first area, wherein an interface formed between the first area and the second area includes a first interface and a second interface which is closer to an incident side of light than the first interface, and the first interface is substantially parallel with an optical axis of an imaging lens and the second interface is a slope having a substantially uniform angle with respect to the optical axis of an imaging lens.

Other objects and features of the present invention will be apparent from the following specification and drawings.

BRIEF DESCRIPTION OF THE DRAWINGS

FIG. 23 is a table showing a structure of a dichroic film;

FIG. 55 is a table showing a structure of a dichroic film;

DETAILED DESCRIPTION OF THE PREFERRED EMBODIMENT

First Embodiment

Figure 6:
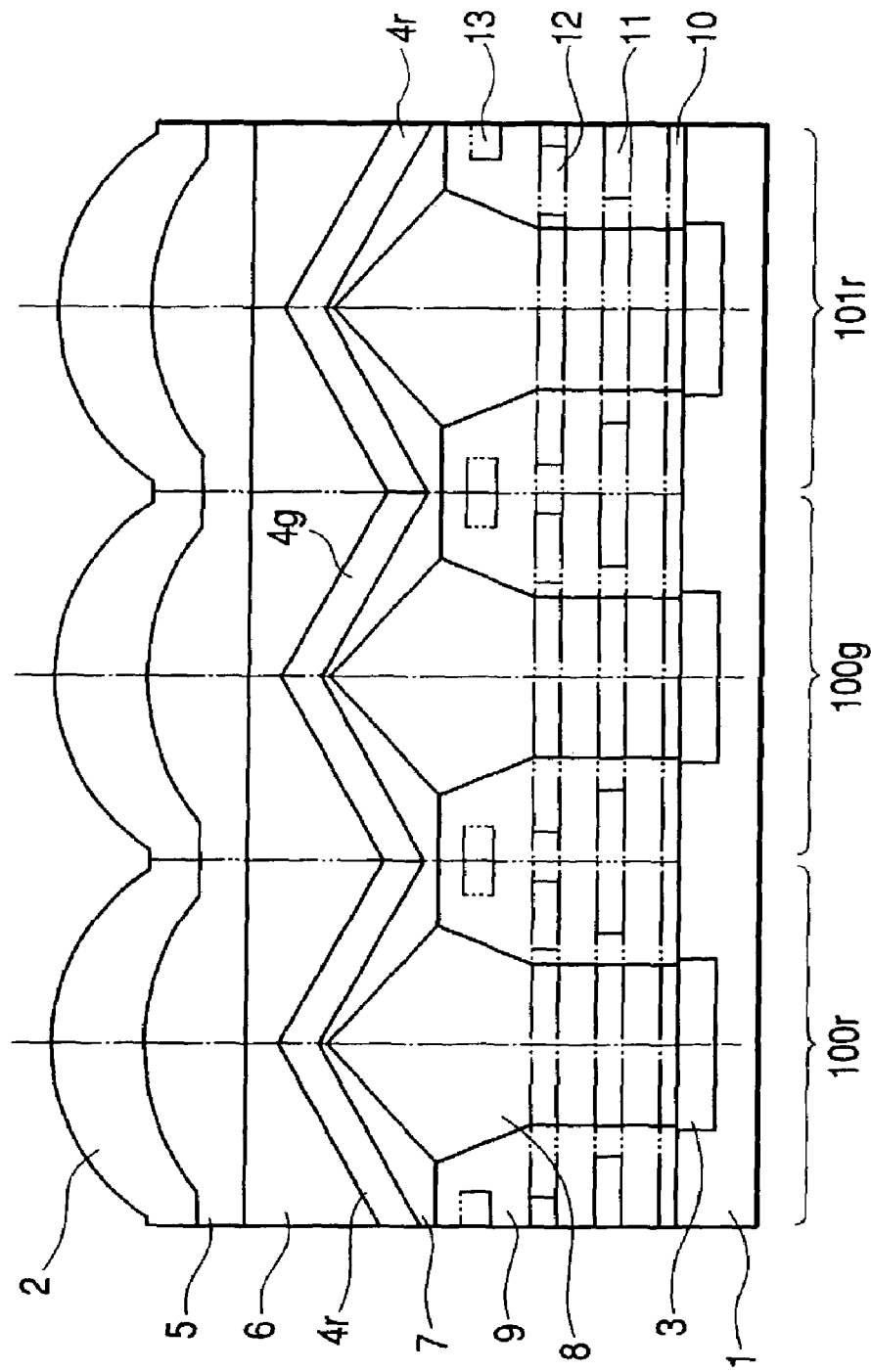
FIG. 6 is a view showing a first embodiment of the present invention.
Figure 7:
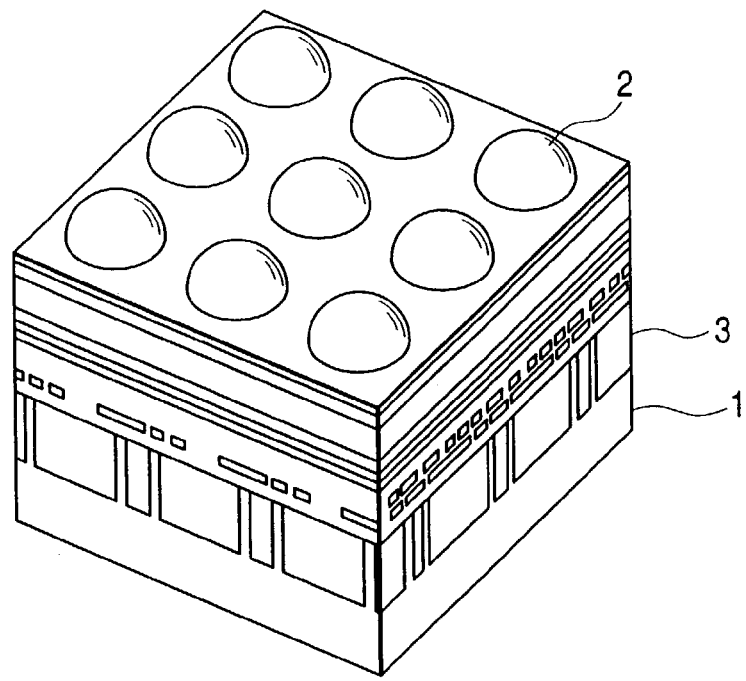
FIG. 7 is a perspective view of the first embodiment of the present invention.
Figure 8:
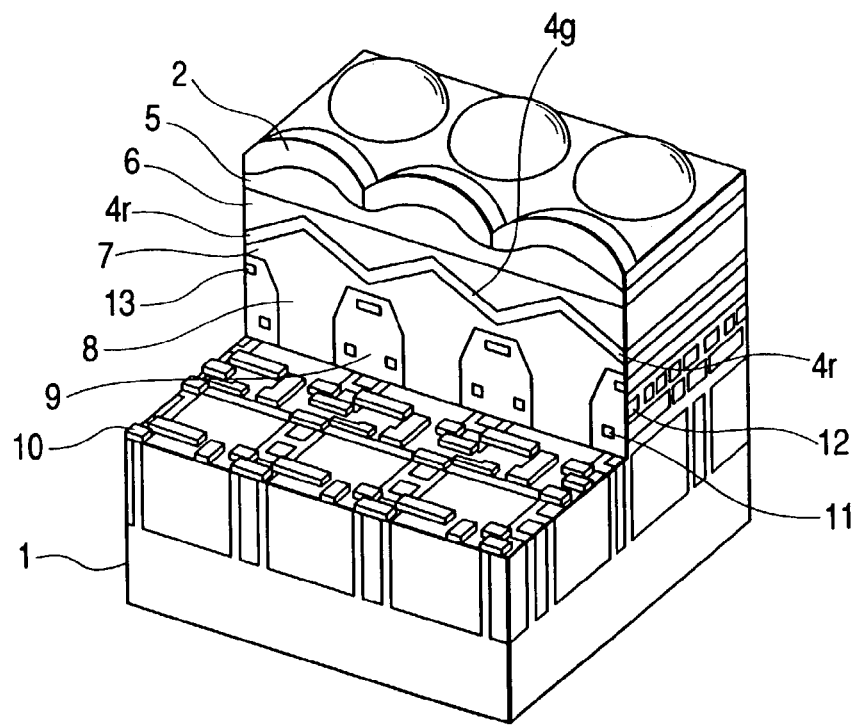
FIG. 8 is a sectional perspective view of the first embodiment of the present invention.

FIGS. 6 to 29 show a first embodiment of the present invention. FIG. 6 is a sectional view of an image pickup element. In the figure, reference numeral 1 denotes a silicon wafer; 2, a microlens; 3, a photoelectric conversion section having a function for converting a received photon into an electric charge; 4 (4r and 4g), dichroic films serving as a wavelength selection section for separating wavelengths of a light; 6, a first refractive index area having a first refractive index; 5, a second refractive index area having a second refractive index; 8, a third refractive index area having a third refractive index; 9, a fourth refractive index area having a fourth refractive index; 7, a fifth refractive index area having a fifth refractive index; and 10, a Poly wiring layer serving as a gate for controlling an electric charge of the photoelectric conversion section. Reference numerals 11 to 13 denote wiring layers made of a metal such as aluminum. Among the wiring layers, reference numeral 11 denotes an AL1 wiring layer serving as a connection between respective sections and an output line; 12, an AL2 wiring layer serving as a well power supply line and a control line; and 13, an AL3 wiring layer serving as a light shield and a power supply line. In addition, FIG. 7 schematically shows only nine pixels extracted out of a large number of pixels in the form of a perspective view of the image pickup element viewed obliquely from above. Moreover, FIG. 8 shows a sectional view cut along the structures from microlens 2 to the AL3 wiring layer through the dichroic film 4 in the central part of FIG. 7.

In FIG. 6, the microlens 2 is formed in an upwardly convex spherical shape and has a positive lens power. Therefore, the microlens 2 functions to condense light which has reached on the microlens 2 to the photoelectric conversion section 3. Consequently, since more light beams can be taken into the photoelectric conversion section 3, it becomes possible to increase a sensitivity of the image pickup element. The second refractive index area 5 adjacent to the microlens 2 plays an extremely important optical role in this structure in combination with the first refractive index area 6. The second refractive index area is formed of a material with a low refractive index. For example, magnesium fluoride ($MgF_2$) with a refractive index of 1.38 or the like can be used as the material. In addition, the first refractive index area 6 sandwiched between the second refractive index area 5 and the dichroic film 4 is formed of a material with a high refractive index. For example, titanium dioxide ($TiO_2$) with a refractive index of 2.5 or the like can be used as the material. By employing such a structure, light traveling from the first refractive index area 6 to the second refractive index area 5 is given a characteristic that the light tends to be totally reflected on an interface between these areas.

The third refractive index area 8, the fourth refractive index area 9, and the fifth refractive index area 7 form a second important optical element in this structure. The first refractive index area 8 is formed of a material with a high refractive index such as titanium dioxide and the fourth refractive index area 9 is formed of a material with a low refractive index such as silicon dioxide ($SiO_2$) or magnesium fluoride having a refractive index of 1.46. Consequently, since light incident on the third refractive index area 8 tends to be totally reflected on an interface between the third refractive index area 8 and the fourth refractive index area 9, these areas play a role of a light guide path leading to the photoelectric conversion section 3. It is necessary to form the fifth refractive index area 7 using a material having a refractive index equal to or lower than that of the third refractive index area 8 such that light is not totally reflected on an interface between the fifth refractive index area 7 and the third refractive index area 8. However, since a difference of refractive indexes between the first refractive index area 6 and the fifth refractive index area 7 is desirably not too large, for example, silicon nitride ($Si_3N_4$) with a refractive index of 2.0 or the like can be used.

Figure 24:
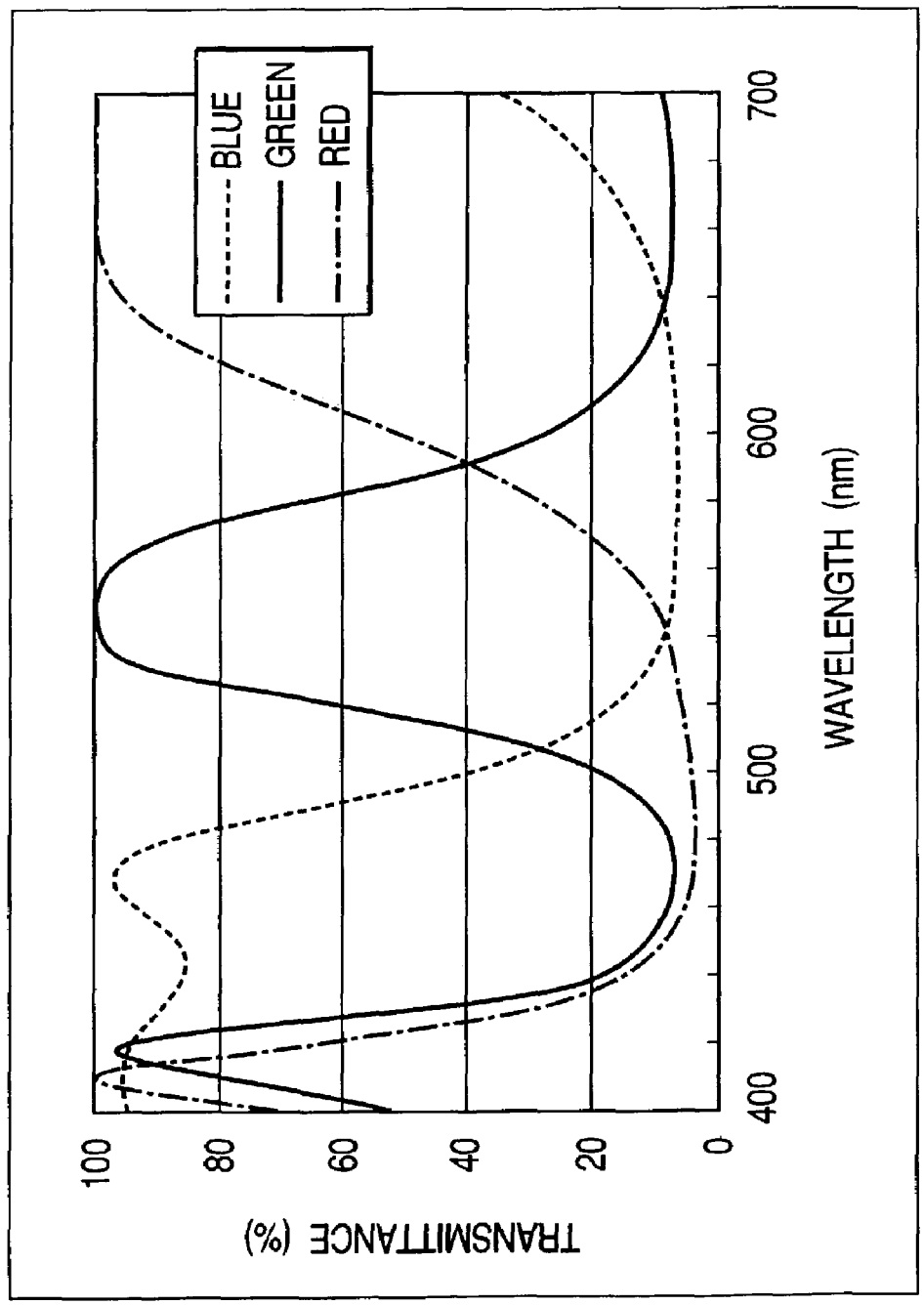
FIG. 24 is a graph showing characteristics of the dichroic film.

In general, a dichroic film is formed by alternately stacking a substance with a high refractive index and a substance with a low refractive index with a film thickness which is an integer times of ¼ of a wavelength λ of interest. By adopting such a structure, a wavelength of a transmitted beam can be selected. FIG. 23 shows an example of the dichroic film 4 used in this embodiment. Titanium dioxide and silicon dioxide is used as a material with a high refractive index and a material with a low refractive index, respectively, and film thickness and the number of layers are set as shown in the table. Transmission characteristics of the dichroic film 4 are shown in FIG. 24. As it is seen from a characteristic graph of FIG. 24, the dichroic film 4 has characteristics which are close to characteristics shown in the characteristic graph of color filters using the conventional dyes shown in FIG. 3.

Therefore, even an image pickup element using the dichroic film 4 with this structure can have characteristics close to characteristics of the conventional image pickup element. These stacked films can be produced easily by using Physical Vapor Deposition (PVD).

Figure 9:
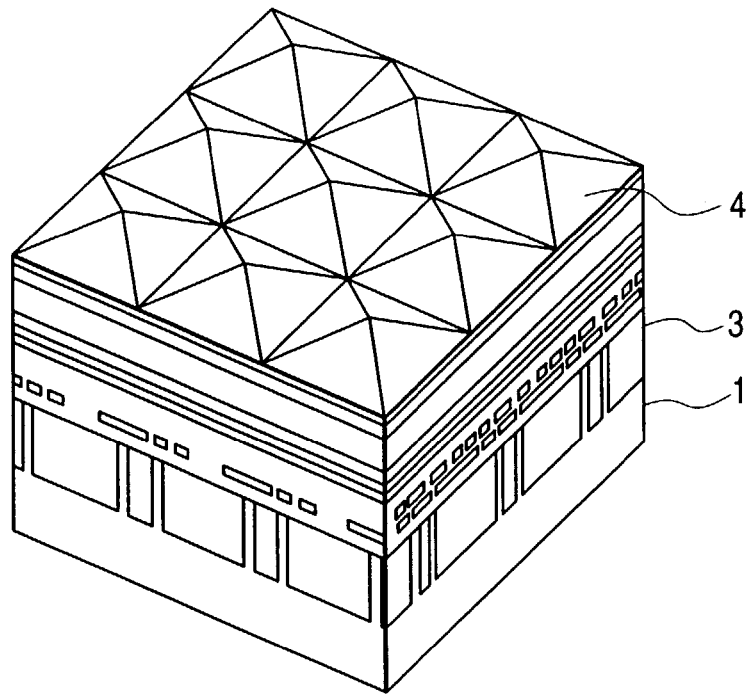
FIG. 9 is a perspective view showing a dichroic film section.
Figure 11:
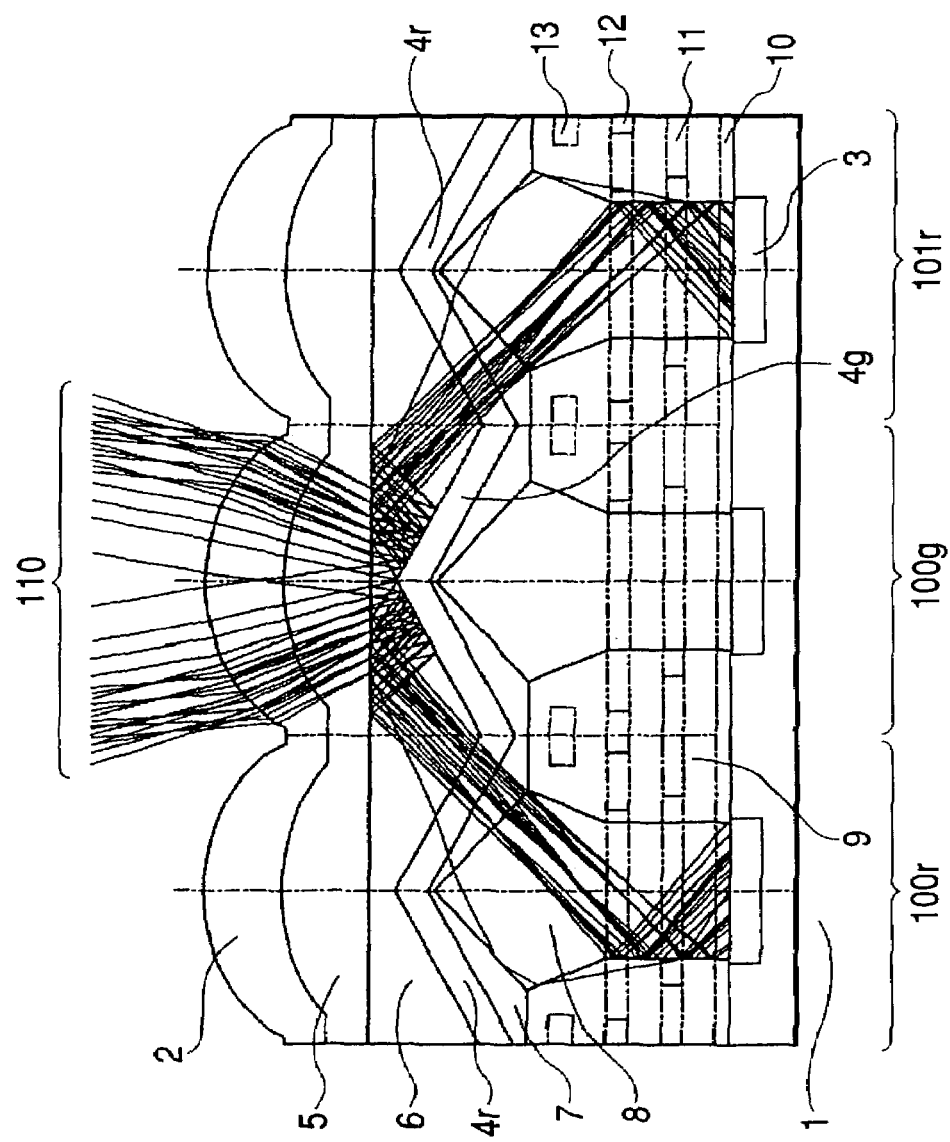
FIG. 11 is a traced view of light (reflected light) of the first embodiment of the present invention.

Next, behaviors of light in the image pickup element in this embodiment will be described with reference to FIGS. 11 and 12. FIG. 11 shows behaviors of only light which is incident on a pixel 100g for receiving green light and reflected by a dichroic film 4g, that is, light including blue light and red light. Light which has exited a pupil of an imaging lens placed in a sufficiently distant position compared with a size of a pixel, passes through an infrared light cut filter to become light beams like object light 110. The object light 110 coming from above in the figure is incident on a microlens 2 and subjected to a condensing action. Next, the light is incident on a second refractive index area 5 and a first refractive index area 6 in order and reach the dichroic film 4g. Here, light other than green light is subjected to a reflecting action due to characteristics of the dichroic film 4g. Consequently, the light travels to a direction of the second refractive index area 5. However, since the dichroic film 4g is formed on a surface having a square pyramid shape as shown in FIG. 9, the reflected light changes a direction from a center to an outside thereof and travel. As described above, since the first refractive index area 6 has a higher refractive index than the second refractive index area 5, light having an angle equal to or larger than a critical angle is subjected to a total reflection action on the interface between the first refractive index area 6 and the second refractive index area 5. The light totally reflected on the interface is directed to a direction of a dichroic film 4r and travels toward pixels 100r and 100r for receiving red light which are adjacent pixels. The dichroic film 4r of the pixels 100r and 100r has a characteristic for transmitting red light and reflecting green light and blue light. Therefore, only red light among the light reflected from the pixel 100g is transmitted and blue light is subjected to a reflecting action by the dichroic film 4r. Here, the blue light subjected to the reflecting action is not illustrated because the blue light travels to the outside of the image pickup element. In the dichroic film 4r that transmits reflected light, an area in which light can be transmitted is reduced by an amount equivalent to a film thickness. However, an area of light incident on the dichroic film 4g according to a condensing action of the microlens 2 (area of reflected light) is small compared with an opening area of the microlens 2. Therefore, eclipse of the reflected light on the dichroic film 4r can be reduced. The light transmitted through the dichroic film 4r travels through a fifth refractive index area 7 and a third refractive index area 8 in order. Since an interface between the third refractive index area 8 and the fourth refractive index area 9 take a taper shape with a widened incident portion, incident light is less likely to be eclipsed. Subsequently, the light is about to travel from the third refractive index area 8 to the fourth refractive index area 9. However, again, since the third refractive index area 8 has a higher refractive index than the fourth refractive index area 9, light incident at an angle equal to or larger than a critical angle is totally reflected on the interface. In addition, since this interface is formed of two surfaces which are substantially parallel in the vertical direction, the light, which has not been incident on the photoelectric conversion section 3 by the first total reflection, is totally reflected again on an interface on the opposite side, and all the light are finally incident on the photoelectric conversion section 3.

In FIG. 6, adjacent to the pixel 100g, a pixel for receiving blue light exists in a vertical direction with respect to the paper surface. As in the case of a red light, the pixel exhibits a behavior of taking in only the blue light among light reflected by the pixel 100g.

Figure 12:
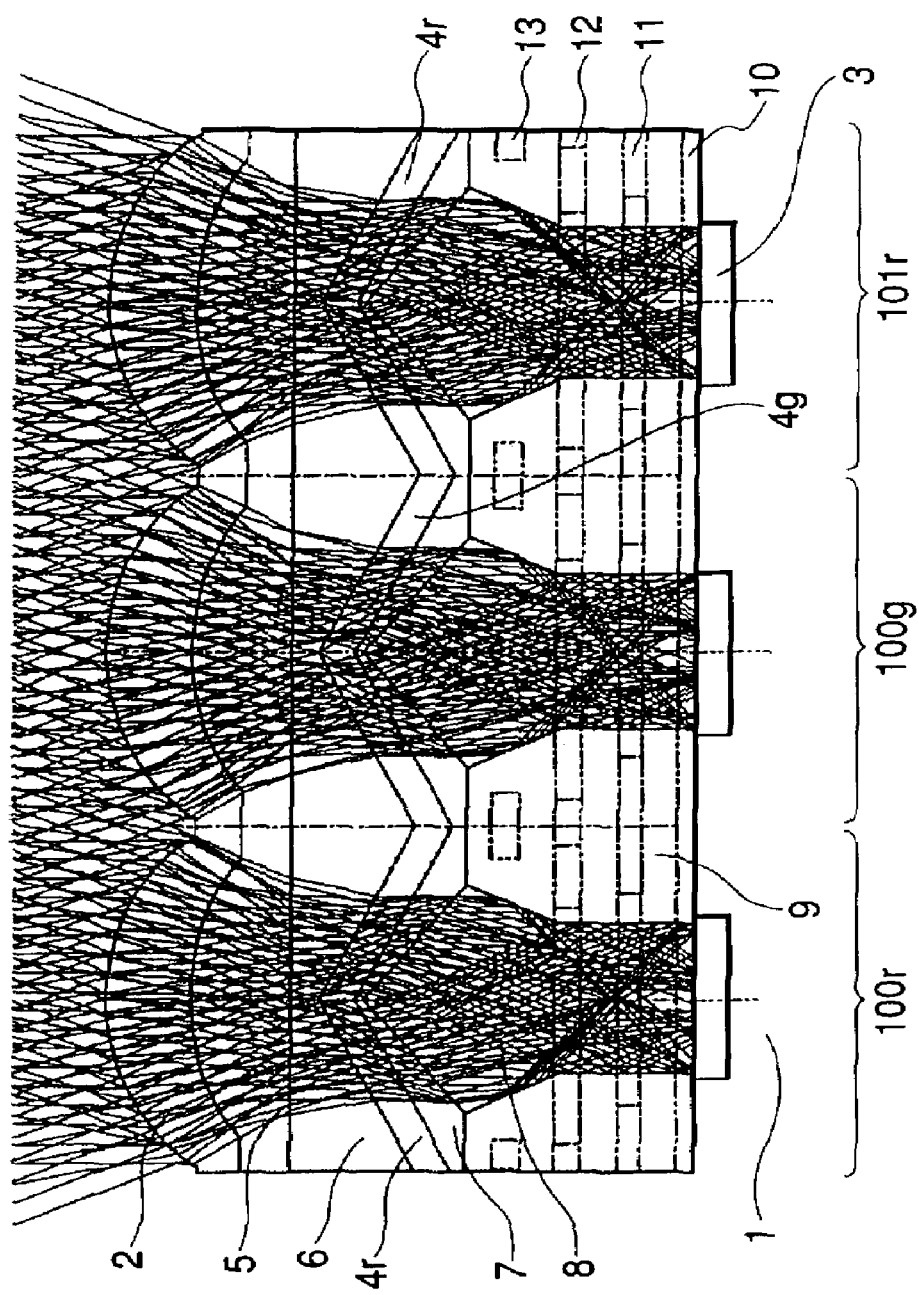
FIG. 12 is a traced view of light (transmitted light) of the first embodiment of the present invention.

FIG. 12 shows behaviors of light subjected to a transmitting action in the dichroic film 4. Light coming from above in this figure is incident on the microlens 2 and is subjected to a condensing action. Next, the light is incident on the second refractive index area 5 and the first refractive index area 6 in order and reaches the dichroic film 4g. Only light with a predetermined wavelength is selectively transmitted through the dichroic film 4g and is incident on the fifth refractive index area 7. Then, when the light travels to the third refractive index area 8, since the third refractive index area 8 is formed in a prism shape with a refractive index higher that that of the fifth refractive index area 7, the light is curved toward a center of the third refractive index area 8. Through this action, the third refractive index area 8 makes it possible to take in light of a wide area. In addition, since the interface between the third refractive index area 8 and the fourth refractive index area 9 is formed in a taper shape with a widened incident portion, the interface can take in light of a wide area. Moreover, the light is subjected to an action for repeating total reflection on the interface between the third refractive index area 8 and the fourth refractive index area 9, thereby being guided to the photoelectric conversion section 3. It is seen from this that, even if light is transmitted, the light of a sufficiently wide area can be taken in.

Figure 13:
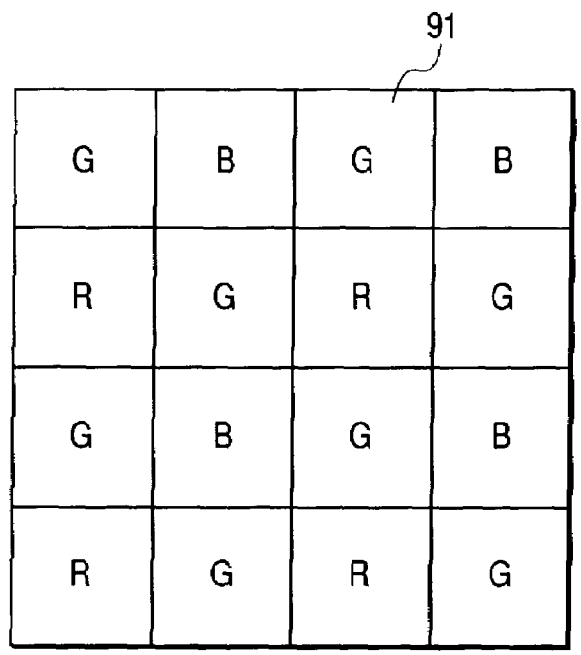
FIG. 13 illustrates a pixel structure.
Figure 25:
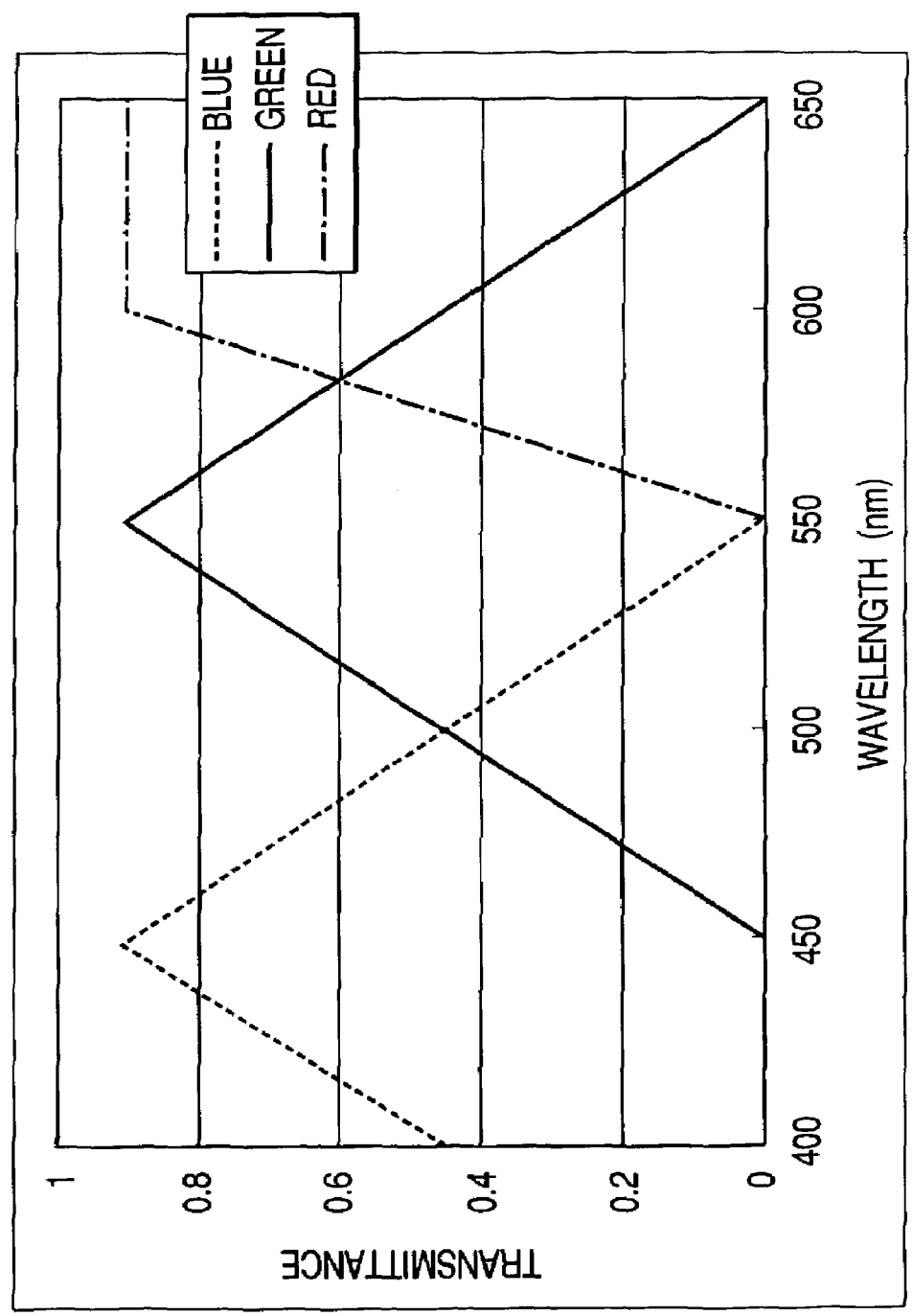
FIG. 25 is a schematic graph showing characteristics of the dichroic film.

Next, efficiency in taking in light using transmission and reflection of a dichroic film will be considered. FIG. 25 shows a simplified transmission characteristic of each color in the dichroic film. The reverse of a transmission curve of each color indicates a reflection characteristic. In addition, it is assumed, for simplification of a calculation, that all light which are not transmitted are reflected and that all the reflected light reach adjacent pixels equally. Moreover, it is assumed that a pixel array is in a form of the Bayer array as shown in FIG. 13.

Figure 26:
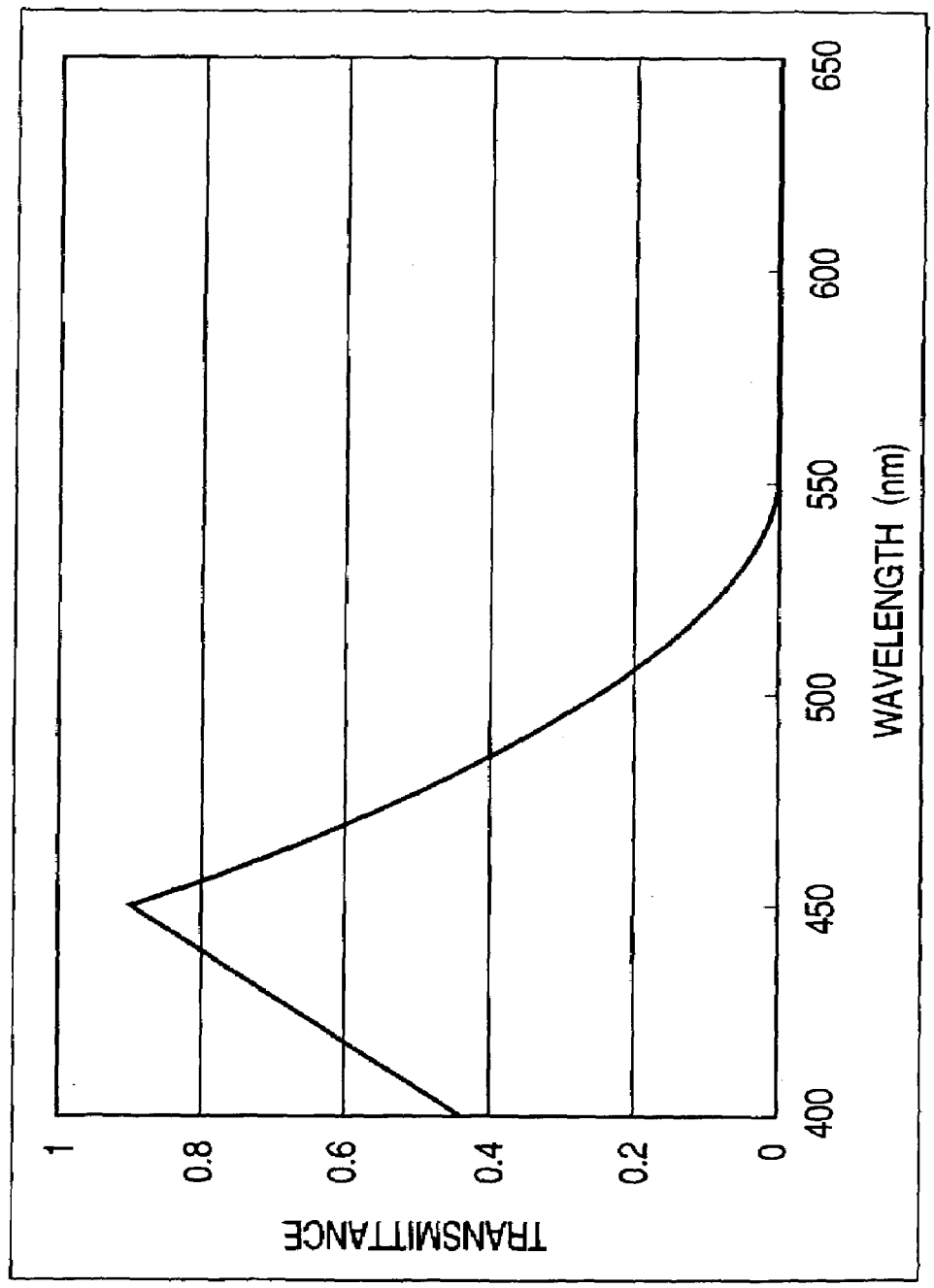
FIG. 26 is a schematic graph showing characteristics in case that light are reflected on a dichroic film for G transmission and transmitted through a dichroic film for B transmission.
Figure 27:
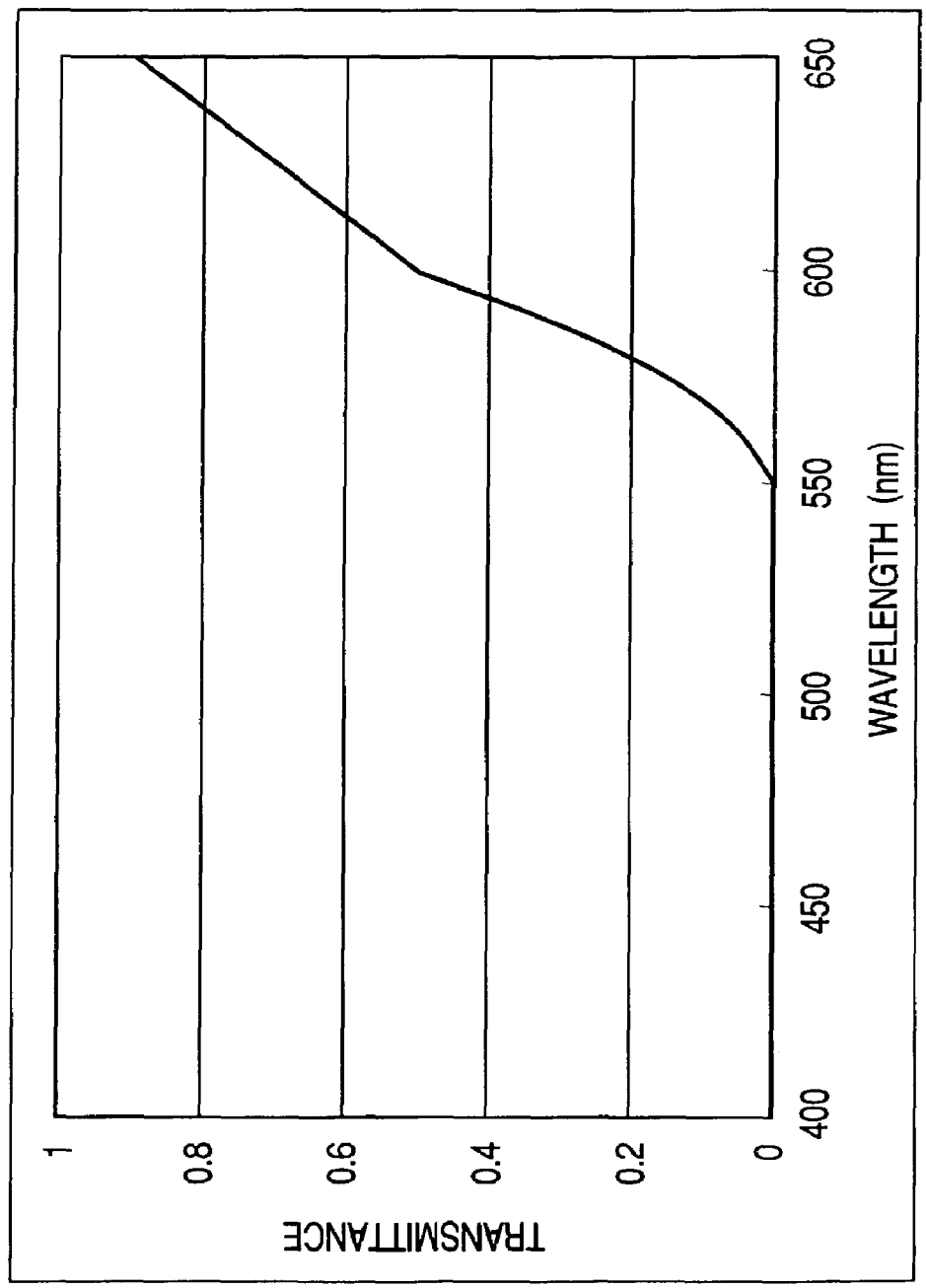
FIG. 27 is a schematic graph showing characteristics in case that light are reflected on the dichroic film for G transmission and transmitted through a dichroic film for R transmission.
Figure 28:
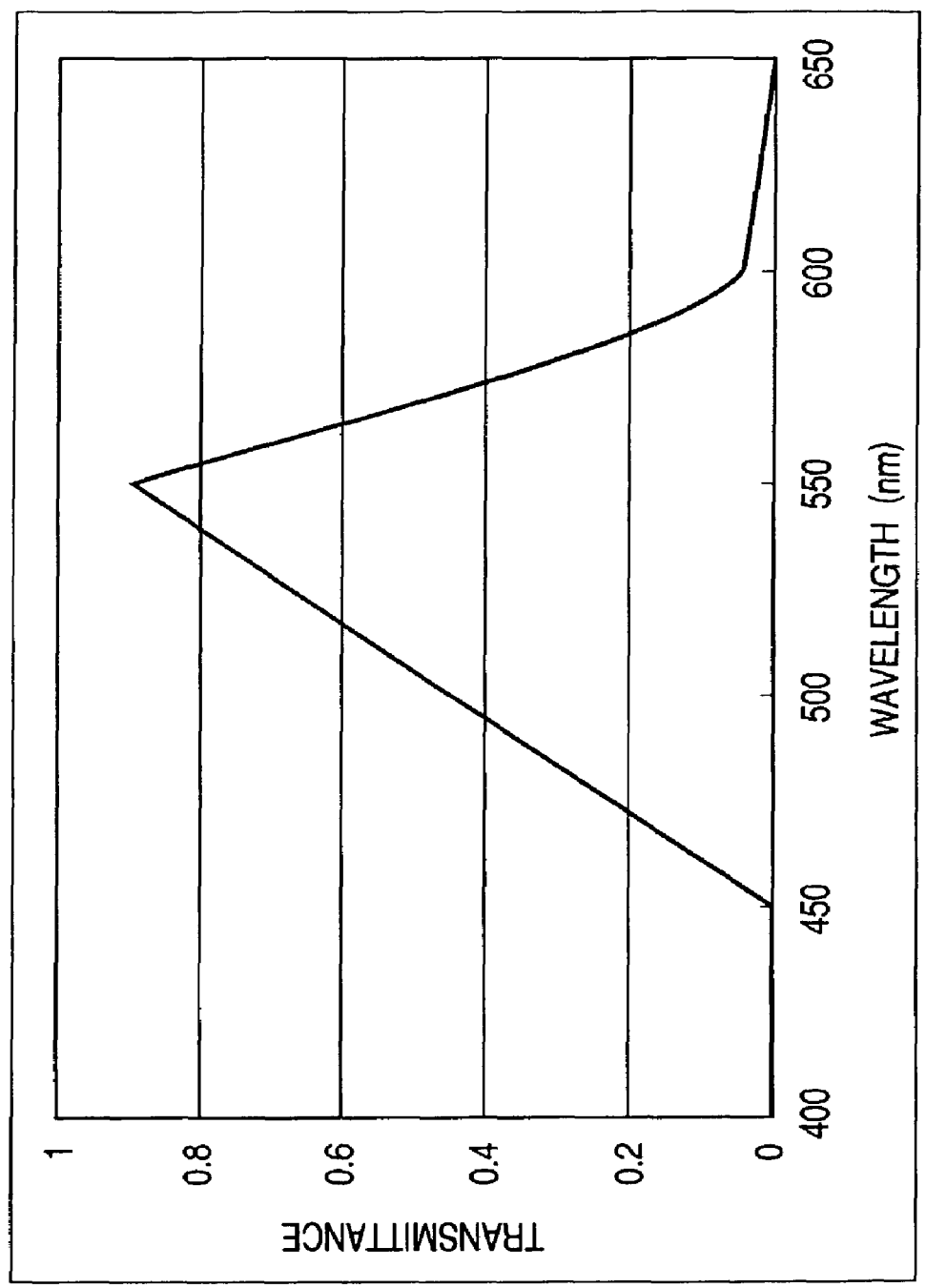
FIG. 28 is a schematic graph showing characteristics in case that light are reflected on the dichroic film for R transmission and transmitted through the dichroic film for G transmission.
Figure 29:
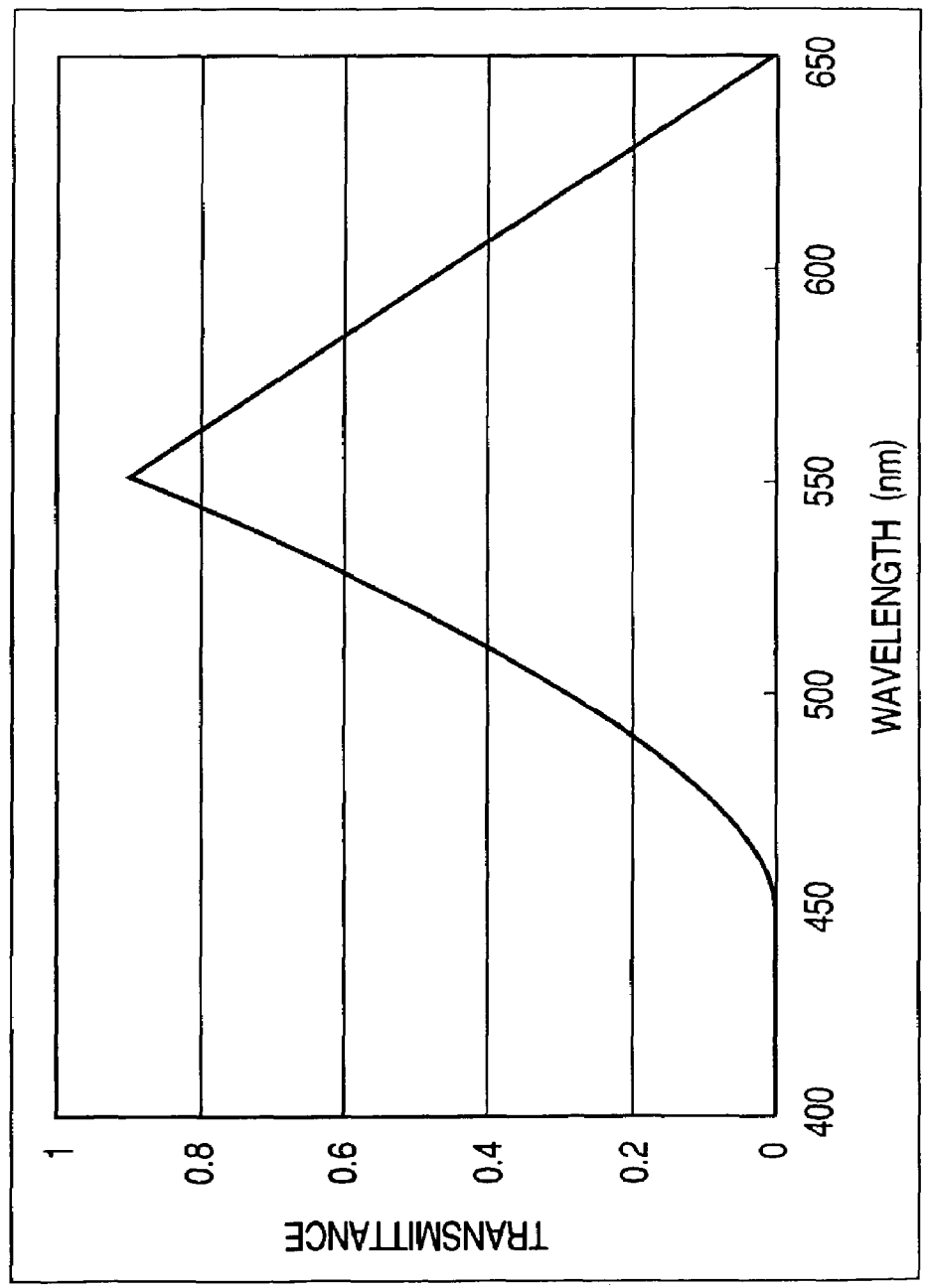
FIG. 29 is a schematic graph showing characteristics in case that light are reflected on the dichroic film for B transmission and transmitted through the dichroic film for G transmission.

As to the case in which light reflected on the dichroic film in a green pixel is transmitted through the dichroic film in a blue pixel and taken into a photoelectric conversion section for blue, since the reverse of a transmission characteristic of green is a reflection characteristic, a product of a curve of the transmission characteristic and a transmission characteristic of blue is an efficiency which should be calculated. FIG. 26 shows characteristics in this case. Similarly, as to the other colors, characteristics of light reaching a red pixel from the green pixel are shown in FIG. 27, characteristic of light reaching the green pixel from the red pixel are shown in FIG. 28, and characteristics of light reaching the green pixel from the blue pixel are shown in FIG. 29.

As to light reflected from adjacent pixels into the green pixel, there are two red and blue pixels, respectively, as adjacent pixels, because the pixel array is the Bayer array. Consequently, an amount of light which the green pixel receives from the adjacent pixels is {(light reflected by the blue pixels)×¼×2+(light reflected by the red pixels)×¼×2}. Since an amount of light which the green pixel receives originally is an integrated amount of a transmittance curve, when this is assumed to be one, an integrated amount in FIG. 28 (light reflected by the red pixel) is 0.74, and an integrated amount in FIG. 29 (light reflected by the blue pixel) is 0.85. Therefore, since a total amount of reflected light is 0.80, it is seen that an amount of light which the blue pixel receives is 1.80 times as large as that in the case in which only transmitted light is taken in.

As to the blue pixel, there are four blue pixels as adjacent pixels. When it is assumed that an integrated amount of a transmittance curve of the blue pixel is one, an integrated amount in FIG. 26 is 0.84. Since an amount of light which the blue pixel receives from the adjacent pixels is {(light reflected by the green pixels)×¼×4}, it is seen that a total amount of reflected light is 0.84, which is 1.84 times as large as the original transmitted amount.

Lastly, as to the red pixel, there are four green pixels as adjacent pixels as in the case of the blue pixel. When it is assumed that an integrated amount of a transmittance curve of the red pixel is one, an integrated amount in FIG. 27 is 0.67. Since an amount of light which the red pixel receives from the adjacent pixels is {(light reflected by the green pixels)×¼×4}, it is seen that a total amount of reflected light is 0.67, which is 1.67 times as large as the original transmitted amount.

As described above, in the case in which adjacent pixels are not pixels of the same color as in the Bayer array, for any pixel, an unnecessary wavelength component is divided and reflected to the adjacent pixels, whereby the unnecessary wavelength component can be photoelectrically converted into an effective wavelength component in the adjacent pixels, and it is possible to significantly increase the efficiency of utilization of light.

Figure 10:
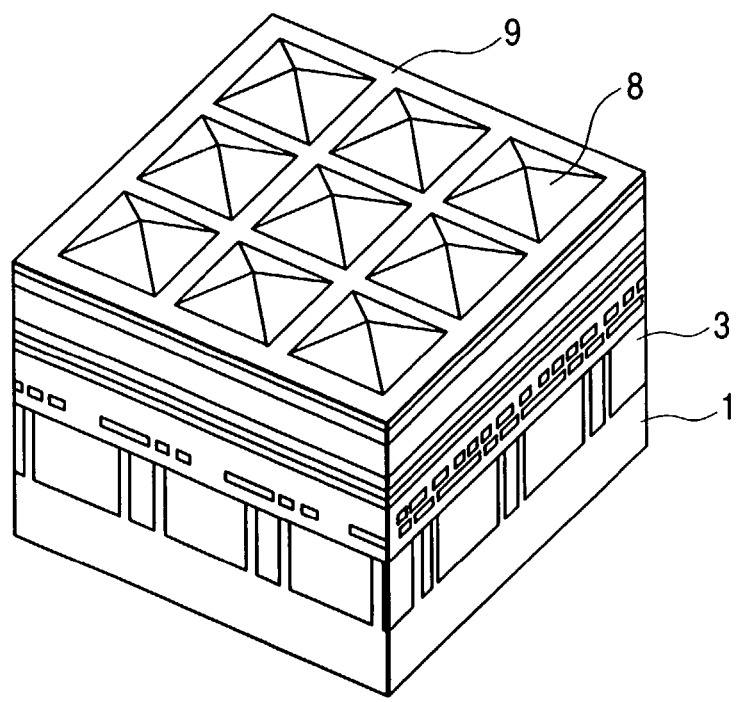
FIG. 10 is a perspective view showing a structure of a second refractive index section.
Figure 14:
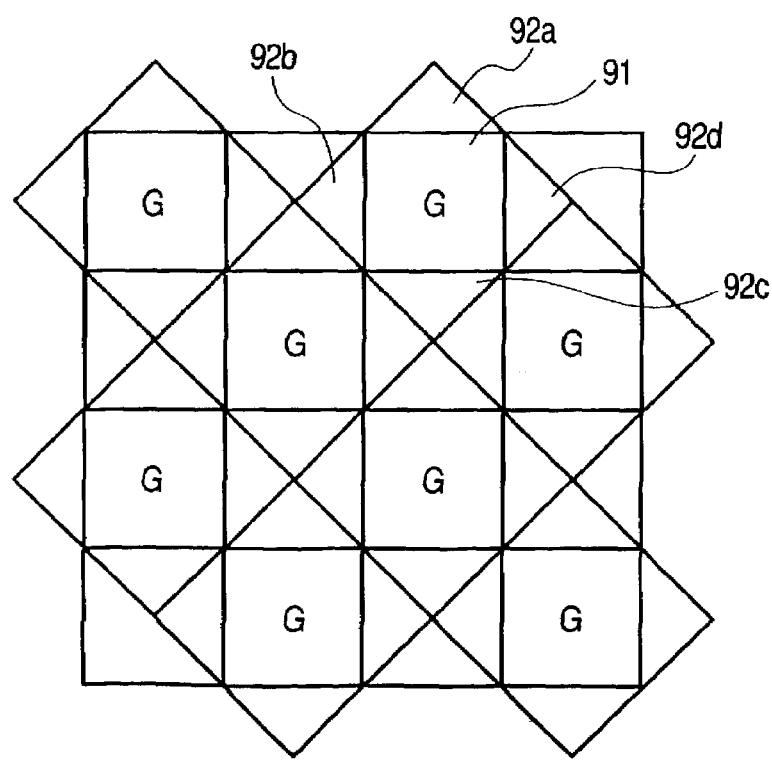
FIG. 14 illustrates a state of taking in light of green pixels.

Next, a lowpass filter effect as a second technological advantage of this structure will be described. In the image pickup element according to the embodiment of the present invention, a substantial light receiving opening is larger than each pixel. When the image pickup element is compared with the conventional image pickup element of the Bayer array shown in FIG. 13 for each color of R, G, and B, first, the conventional opening of a G pixel is a size of a microlens, while, in the image pickup element according to the embodiment of the present invention, a pixel opening is larger than the original pixel opening 91 because it receives portions of 92a, 92b, 92c, and 92d from adjacent pixels as shown in FIG. 14. Consequently, a substantial light receiving opening including the sparing of green light component by the adjacent pixels is as shown in FIG. 10. Since the B pixel and the R pixel also have each color light component spared by the adjacent pixels, effective light receiving openings for these pixels have the similar shape to the G pixel. Therefore, as to all the pixels, it is seen that the pixels have light receiving openings that overlap with each other effectively.

In this way, when the substantial light receiving opening is larger than each pixel, an MTF which is not possible in a normal single plate image pickup apparatus can be obtained. As a result, a quality of an image is not degraded even if an optical lowpass filter is not provided. That is, it is possible to eliminate the second process for adjusting a high frequency component of a spatial frequency characteristic of an object image to suppress the component and to obtain a high quality image with less conspicuous aliasing distortion only through the third process for photoelectrically converting an object image.

FIGS. 16 to 22 are graphs explaining the above.

Figure 16:
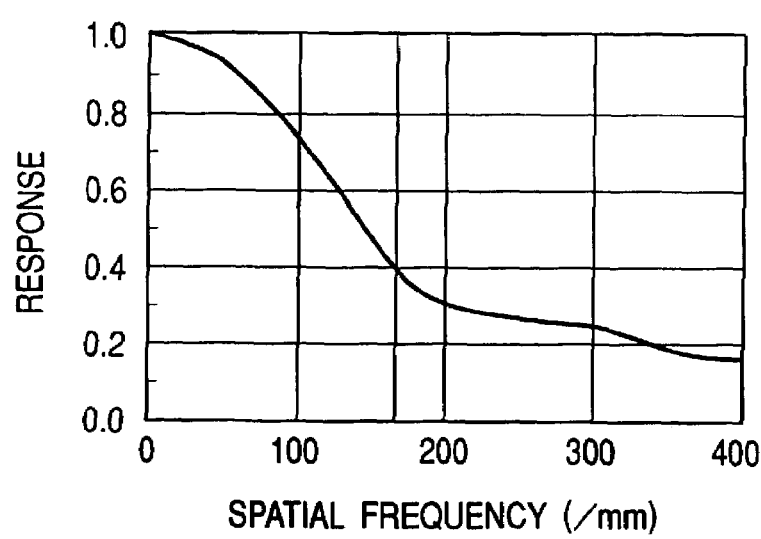
FIG. 16 is a graph showing an MTF with respect to a spatial frequency component in a horizontal direction of a pixel $100g$.
Figure 17:
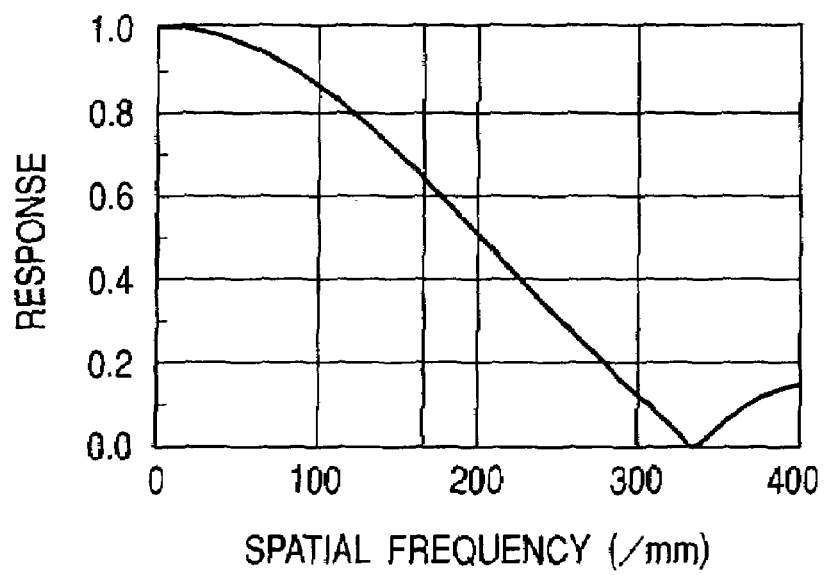
FIG. 17 is a graph showing an MTF of a rectangular opening pixel.
Figure 18:
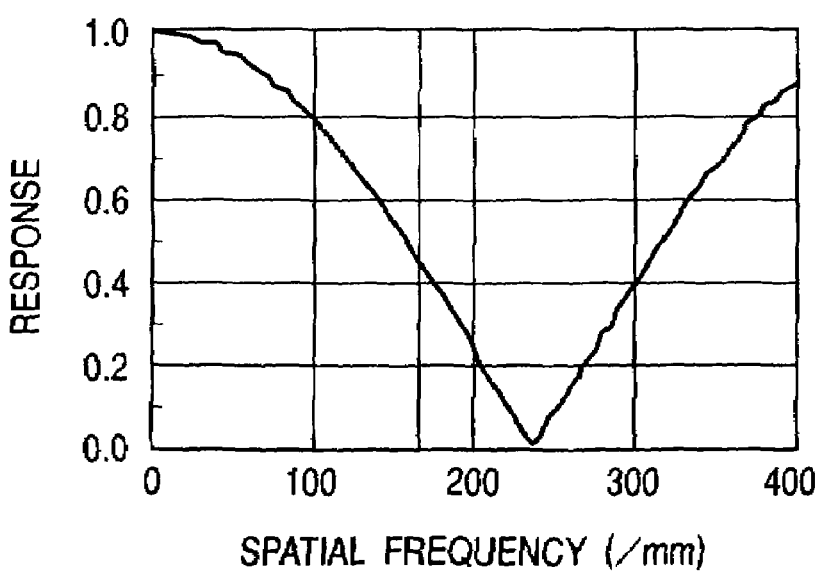
FIG. 18 is a graph showing an MTF of an optical lowpass filter.

First, FIG. 16 shows an MTF with respect to a spatial frequency component in a horizontal direction for a pixel 1110g of the image pickup element according to this embodiment. In addition, FIG. 17 shows an MTF of a pixel having a normal rectangular opening. It is assumed that a size of one pixel is □3 µm and a microlens has a size equivalent to one pixel in both the cases. Moreover, it is assumed that the pixel of this embodiment has an opening extending to a central part of an adjacent pixel.

A response of a conventional pixel having a rectangular opening can be briefly expressed by a SINC function such as expression (2) below.

$$R_3(u) = \left| \frac{\sin(\pi \cdot d \cdot u)}{(\pi \cdot d \cdot u)} \right| \qquad (2)$$

Here, R3(u) is a response and d is a width of a light receiving opening of an image pickup element.

A first zero point (cut-off frequency) of expression (2) is a position of u=1/d. That is, the response becomes zero in a wavelength which coincides with the width of the light receiving opening. In an image pickup element in which light receiving openings are laid without a gap, since a width of a light receiving opening coincides with a pixel pitch, a response value of expression (2) in a Nyquist frequency u=d/2 is 0.636, which is rather high. Therefore, it is necessary to use an optical lowpass filter with the MTF shown in FIG. 18 as well in the conventional pixel having a rectangular opening. Here, it is taken into account the fact that, in the case in which image pickup is performed on the premise that a still image is viewed as in a digital still camera, an image tends to appear as an image with a higher resolution if a response in a frequency slightly below the Nyquist frequency is higher even if high frequencies exceeding the Nyquist frequency remain more or less.

Figure 15:
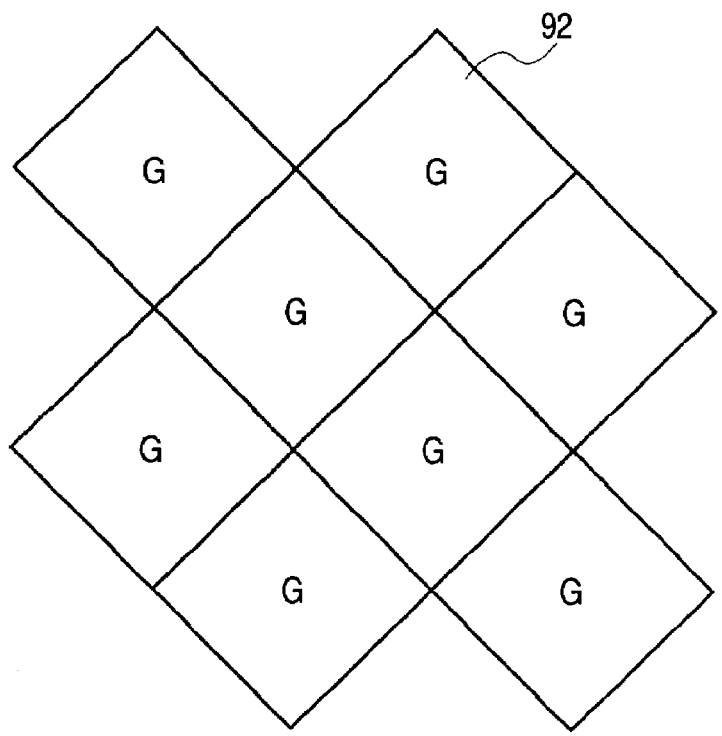
FIG. 15 illustrates an effective area for taking in light of the green pixels.

On the other hand, in the pixel 100g in this embodiment, a response increases to a high frequency side due to a diamond-shaped opening as shown in FIG. 15. It is sufficient to consider that this is a collection of limitlessly thin strip-like rectangular openings whose MTF can be expressed by expression (2). A result of integrating the entire thin strip-like rectangular opening is as shown in FIG. 16. It is seen that, at a Nyquist frequency of 167/mm in case that a pixel pitch is assumed to be 3 µm, the pixel 100g has a rather lower response.

Figure 19:
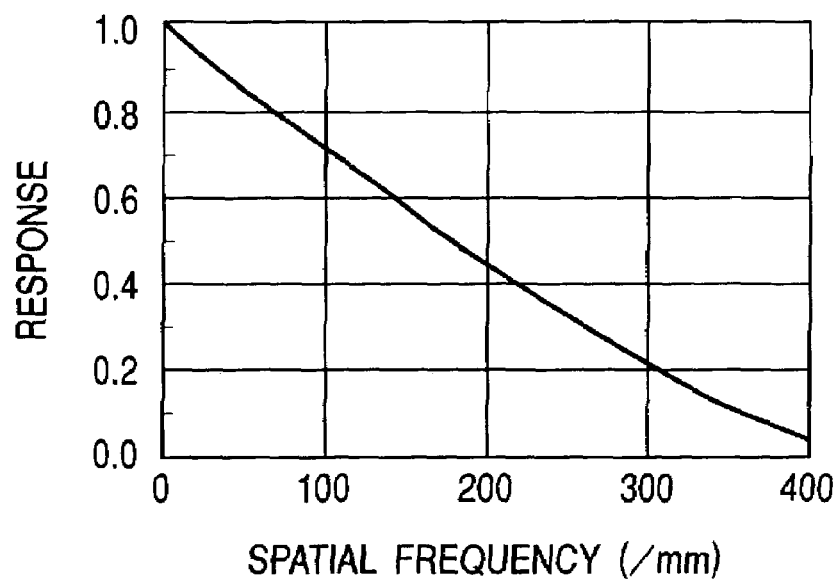
FIG. 19 is a graph showing an MTF of an aplanatic lens in case that an F number is assumed to be 4.0 and a wavelength of an object image is assumed to be 550 nm.

Next, FIG. 19 shows an MTF of an aplanatic lens in case that an F number is assumed to be 4.0 and a wavelength of an object image is assumed to be 550 nm. In an ideal lens that does not have aberration in terms of geometrical optics, an MTF thereof depends upon diffraction of light. A diffraction limit MTF depends upon the F number and is expressed by expression (3) below.

$$R_o = \frac{2 \times (\beta - \cos\beta \times \sin\beta)}{\pi} \qquad (3)$$

$\beta = \cos^{-1}(u \cdot F \cdot \lambda)$

Here, u is a spatial frequency of an optical image, F is an F number of an optical system, and λ is a wavelength of the optical image.

A cut-off frequency of this imaging lens is 455/mm.

Thus, all data are now given for finding a total MTF of the first process for forming an object image with an optical apparatus, (the second process for adjusting a high frequency component of a spatial frequency characteristic of the object image such that it is suppressed), and the third process for photoelectrically converting the object image whose spatial frequency has been adjusted.

Figure 20:
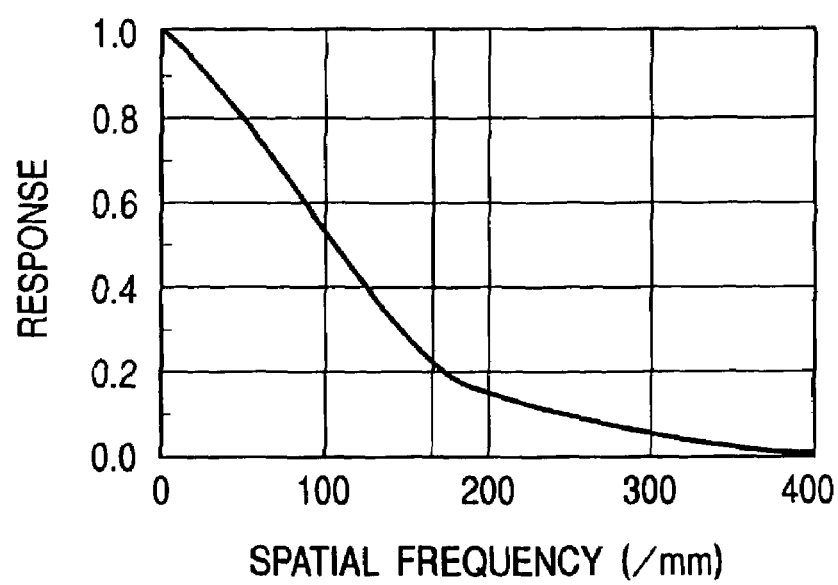
FIG. 20 is a graph showing a total MTF of an imaging lens and pixels of an image pickup element in case that the pixel $100g$ is used.
Figure 21:
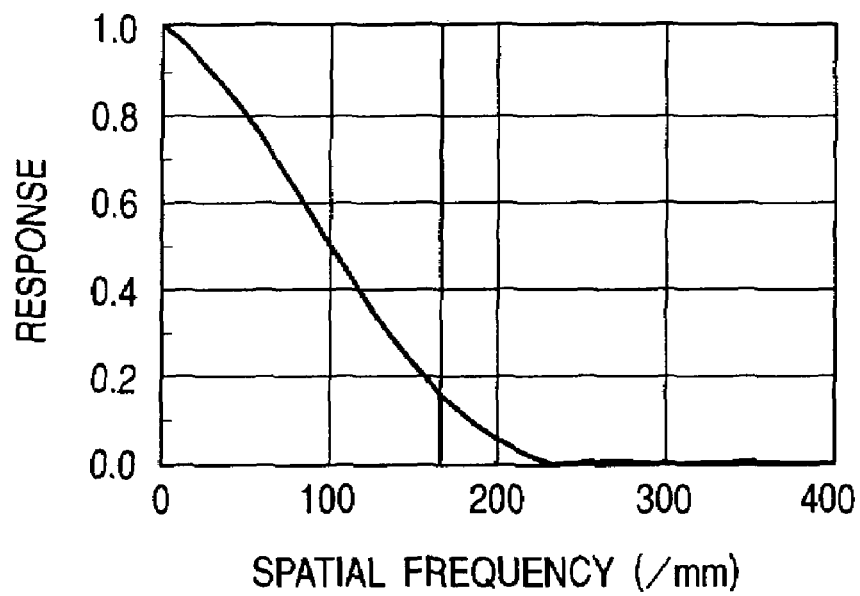
FIG. 21 is a graph showing a total MTF of an imaging lens, an optical lowpass filter, and pixels of an image pickup element in case that the conventional pixel is used.
Figure 22:
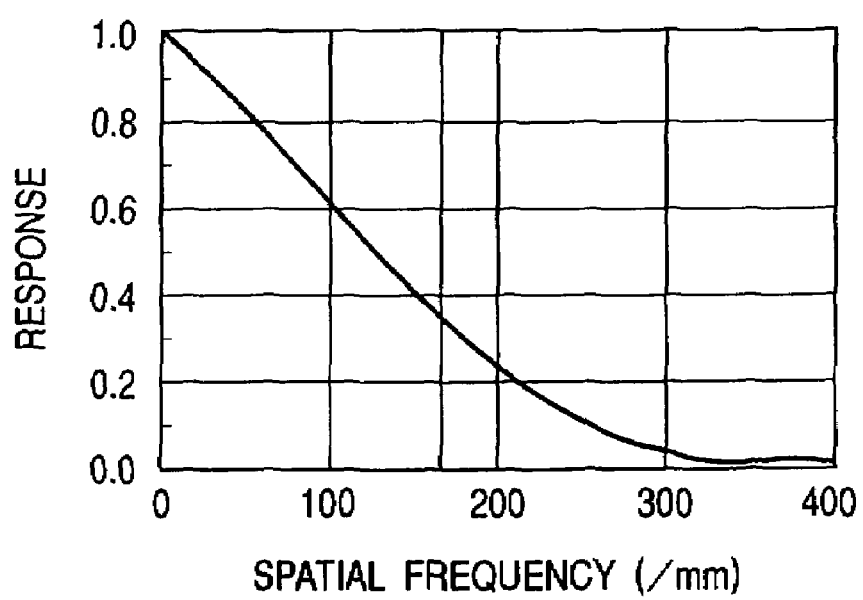
FIG. 22 is a graph showing a total MTF in case that the optical lowpass filter is not used in the conventional pixel.

FIG. 20 shows a total MTF of an imaging lens and pixels of an image pickup element in case that the pixel 100g is used. On the other hand, FIG. 21 shows a total MTF of an imaging lens, an optical lowpass filter, and pixels of an image pickup element in case that the conventional pixel is used. Both the pixels have substantially equal responses at the Nyquist frequency of 167/mm and exhibits very similar characteristics as a whole. On the other hand, if the optical lowpass filter is not used in the conventional pixel, a response becomes too high at a Nyquist frequency as shown in FIG. 22. In this way, it is seen that the optical lowpass filter can be eliminated if the pixel 100g is used.

Second Embodiment

Figure 30:
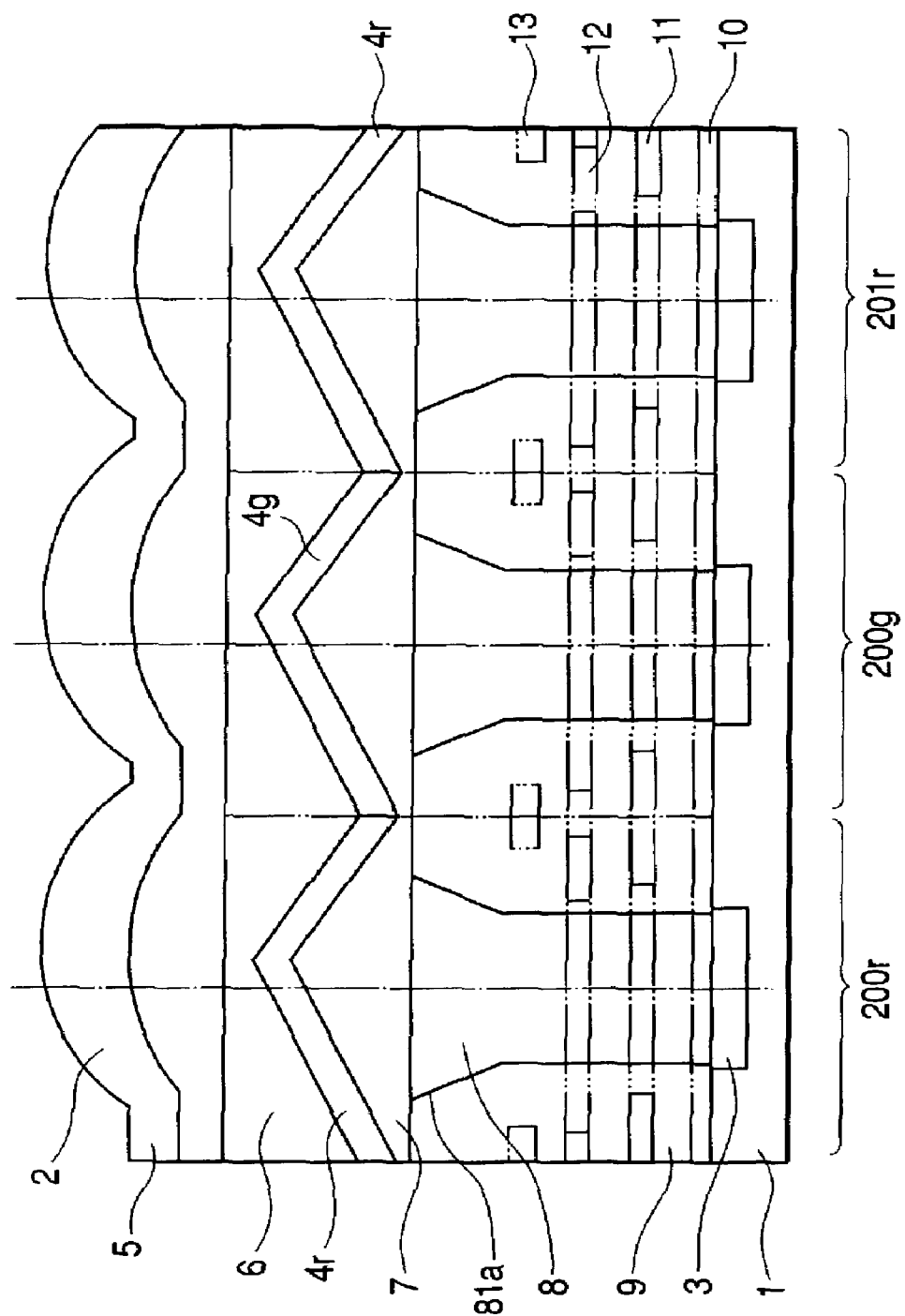
FIG. 30 is a view showing a second embodiment of the present invention.
Figure 31:
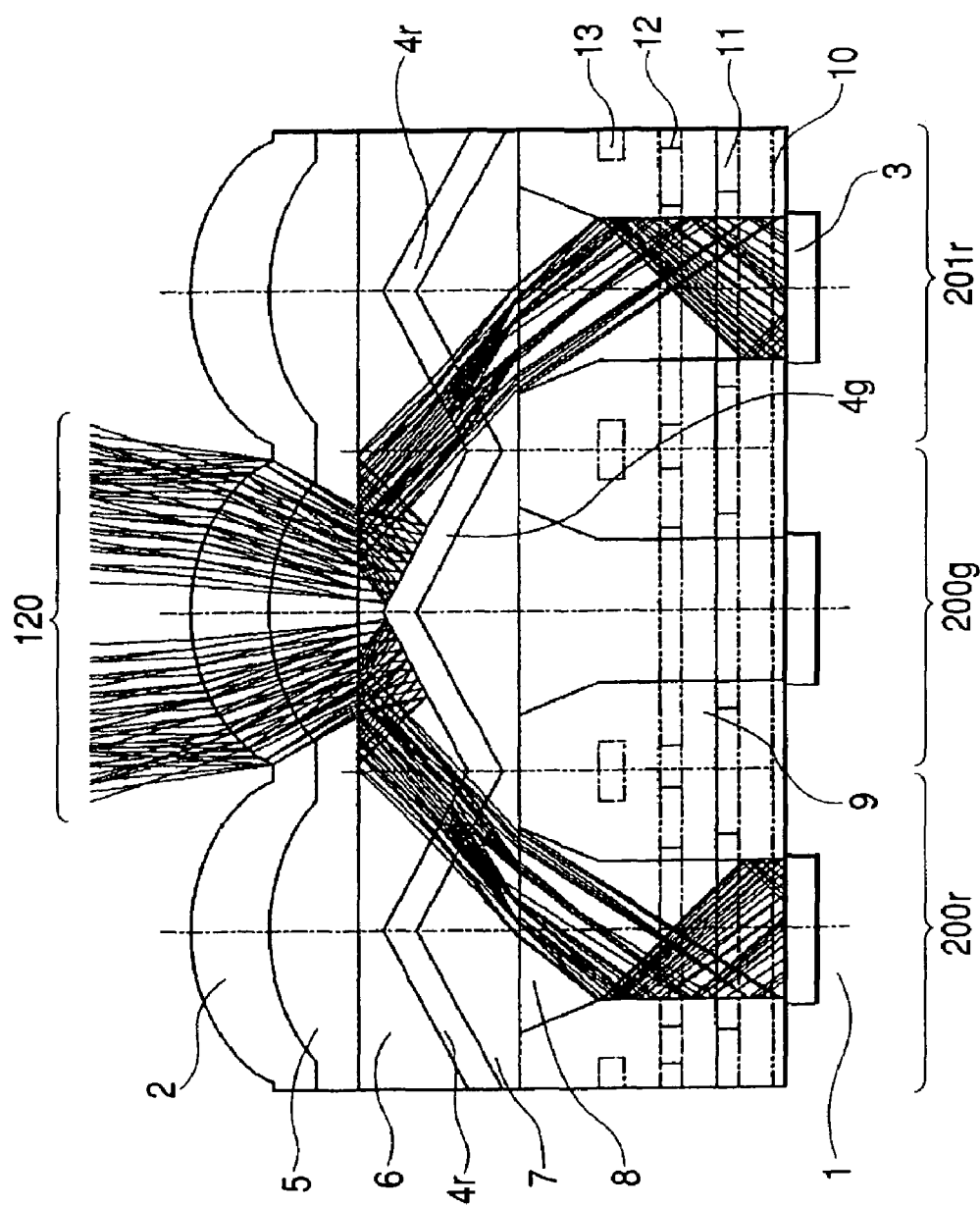
FIG. 31 is a traced view of light (reflected light) of the second embodiment of the present invention.
Figure 32:
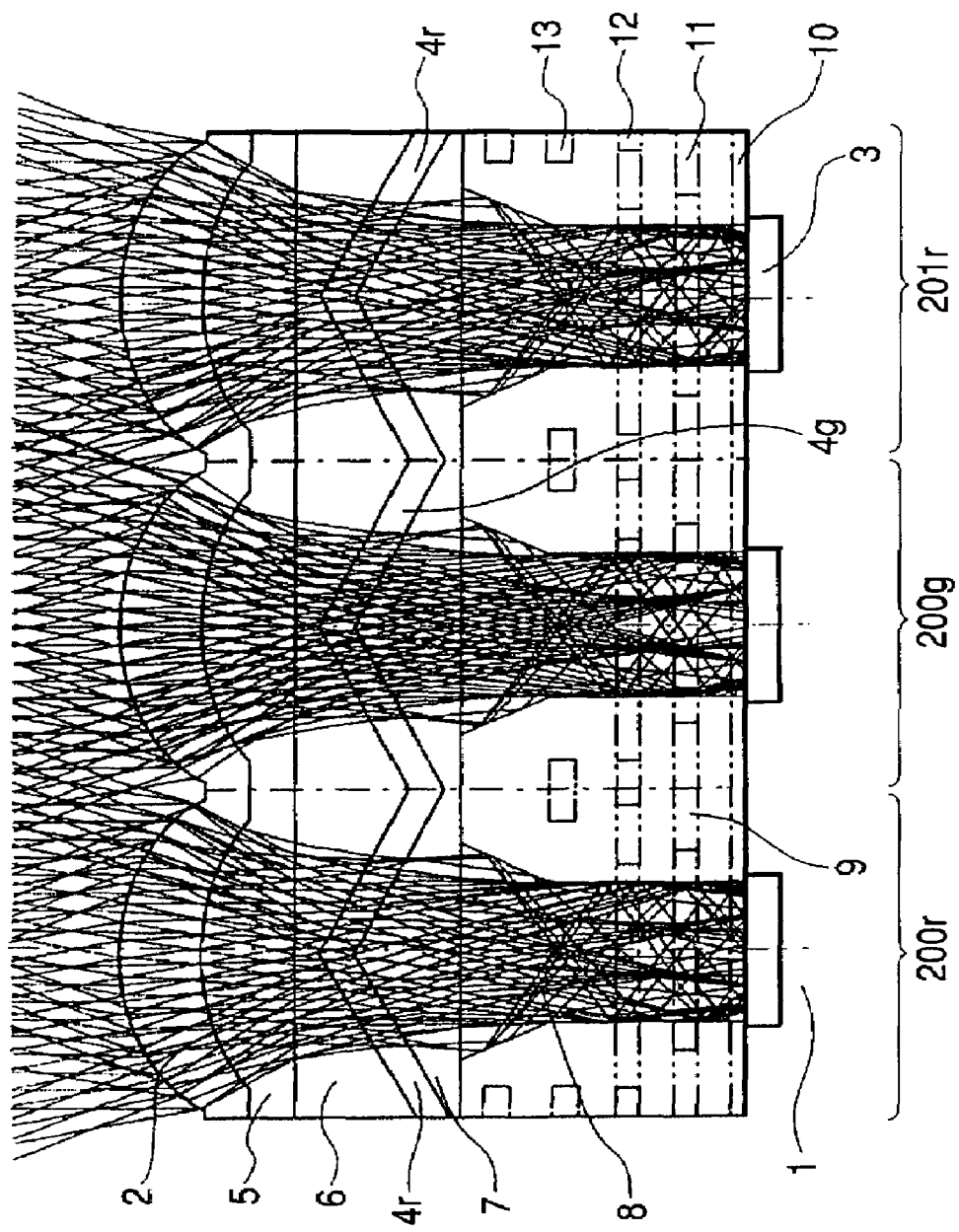
FIG. 32 is a traced view of light (transmitted light) of the second embodiment of the present invention.

FIG. 30 shows a second embodiment of the present invention. It is assumed that components denoted by the identical reference symbols perform the identical functions. Behaviors of light in an image pickup element in this embodiment are as shown in FIGS. 31 and 32. As in the first embodiment, FIG. 31 shows behaviors of only light which is incident on a pixel 200g for receiving green light and reflected by the dichroic film 4g, that is, light including blue light and red light. Light which has exited a pupil of an imaging lens placed in a sufficiently distant position compared with a size of a pixel, passes through an infrared light cut filter to become light beams like object light 120. The object light 120 coming from above in the figure is incident on the microlens 2 and subjected to a condensing action. Next, the light is incident on the second refractive index area 5 and the first refractive index area 6 in order and reach the dichroic film 4g. Here, light other than green light is subjected to a reflecting action due to characteristics of the dichroic film 4g. Since the dichroic film 4g is formed on a surface having a square pyramid shape as shown in FIG. 9, the reflected light changes a direction to an outer side than a center thereof and travels. Then, light having an angle equal to or larger than a critical angle is subjected to a total reflection action on the interface between the first refractive index area 6 and the second refractive index area 5. The light directed downward again travels toward pixels 200r and 201r for receiving red light which is adjacent pixels. The light transmitted through the dichroic film 4r travel through the fifth refractive index area 7 and the third refractive index area 8 in order. When the light travels to the third refractive index area 8, since its shape is a square pyramid in the first embodiment, the light is incident on a surface thereof at an angle close to a right angle with respect to the surface. In this embodiment, since the third refractive index area 8 is formed as a flat surface, an incident angle is reduced and an action for largely curving the light to the central direction is applied to the light. Thus, more light can be totally reflected on the interface between the third refractive index area 8 and the fourth refractive index area 9 compared with the first embodiment. The light repeats the total reflection on the interface between these areas, thereby reaching the photoelectric conversion section 3.

FIG. 32 shows behaviors of light subjected to a transmitting action in the dichroic film 4. Light coming from above in this figure is incident on the microlens 2 and is subjected to a condensing action. Next, the light is incident on the second refractive index area 5 and the first refractive index area 6 in order and reach the dichroic film 4g. Only light with a predetermined wavelength is selectively transmitted through the dichroic film 4 and is incident on the fifth refractive index area 7. Moreover, the light is subjected to an action for repeating total reflection on the interface between the third refractive index area 8 and the fourth refractive index area 9, thereby being guided to the photoelectric conversion section 3. It is seen from this that, even if light is transmitted, the light of a sufficiently wide area can be taken in.

Third Embodiment

Figure 33:
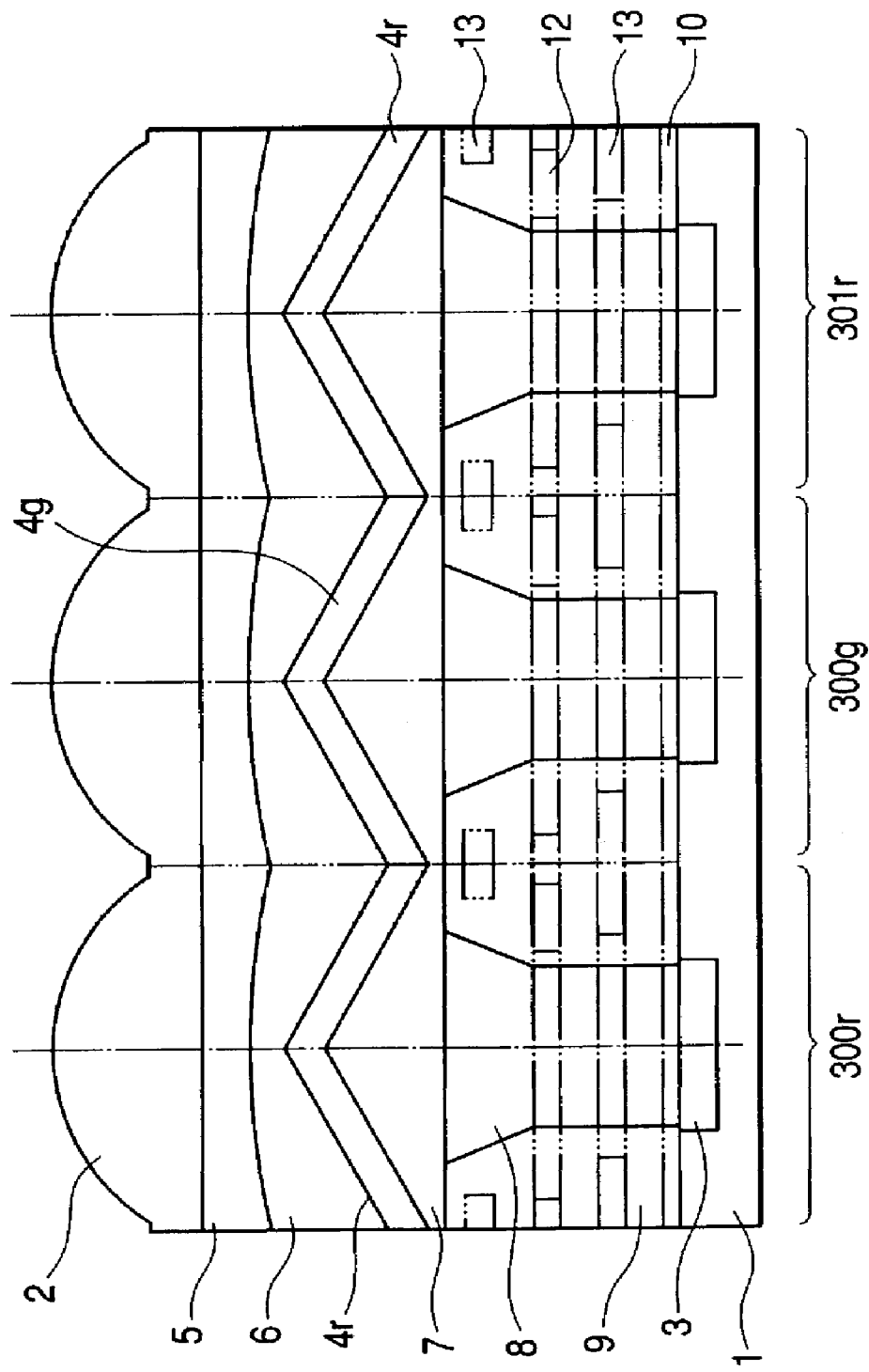
FIG. 33 is a view showing a third embodiment of the present invention.
Figure 34:
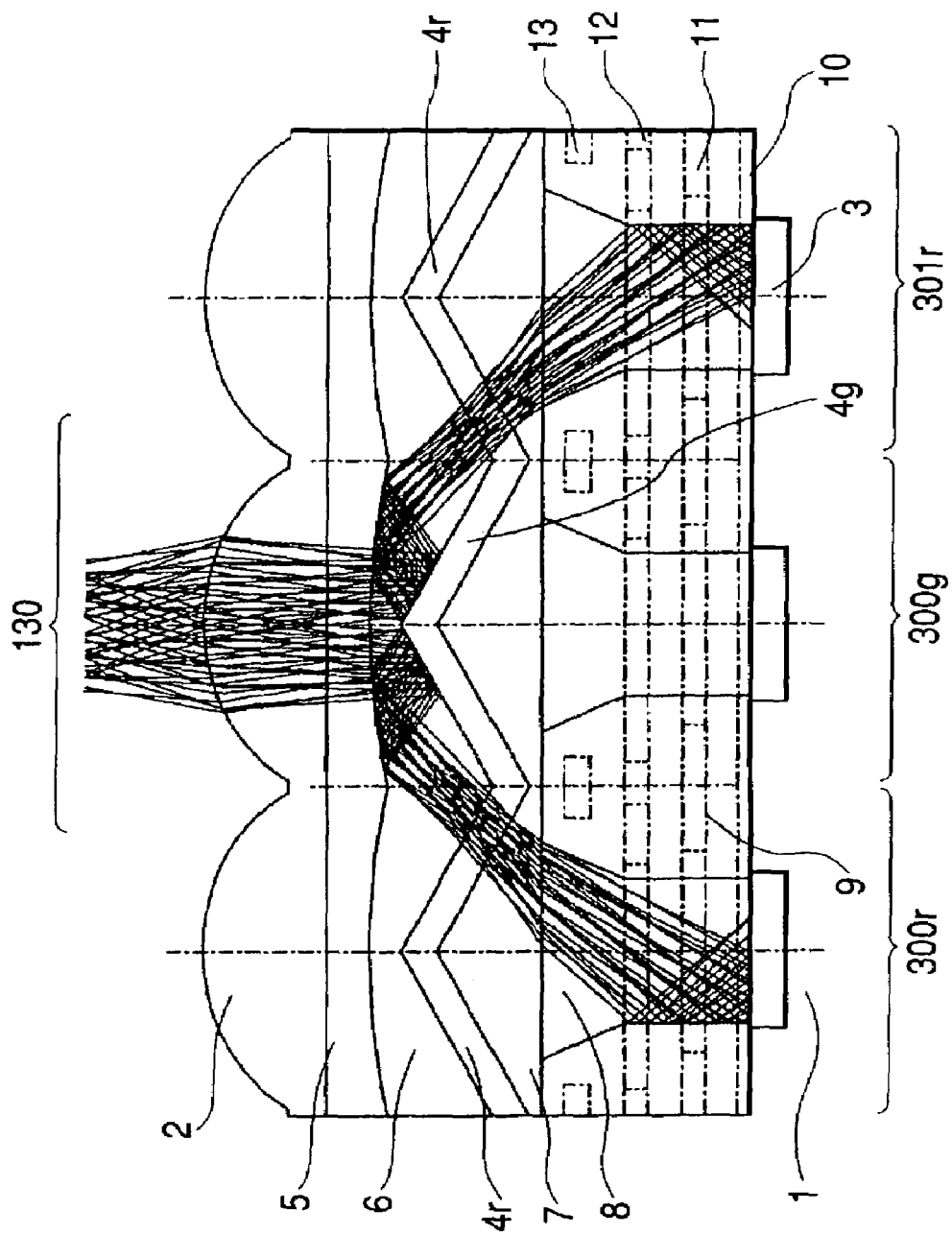
FIG. 34 is a traced view of light (reflected light) of the third embodiment of the present invention.
Figure 35:
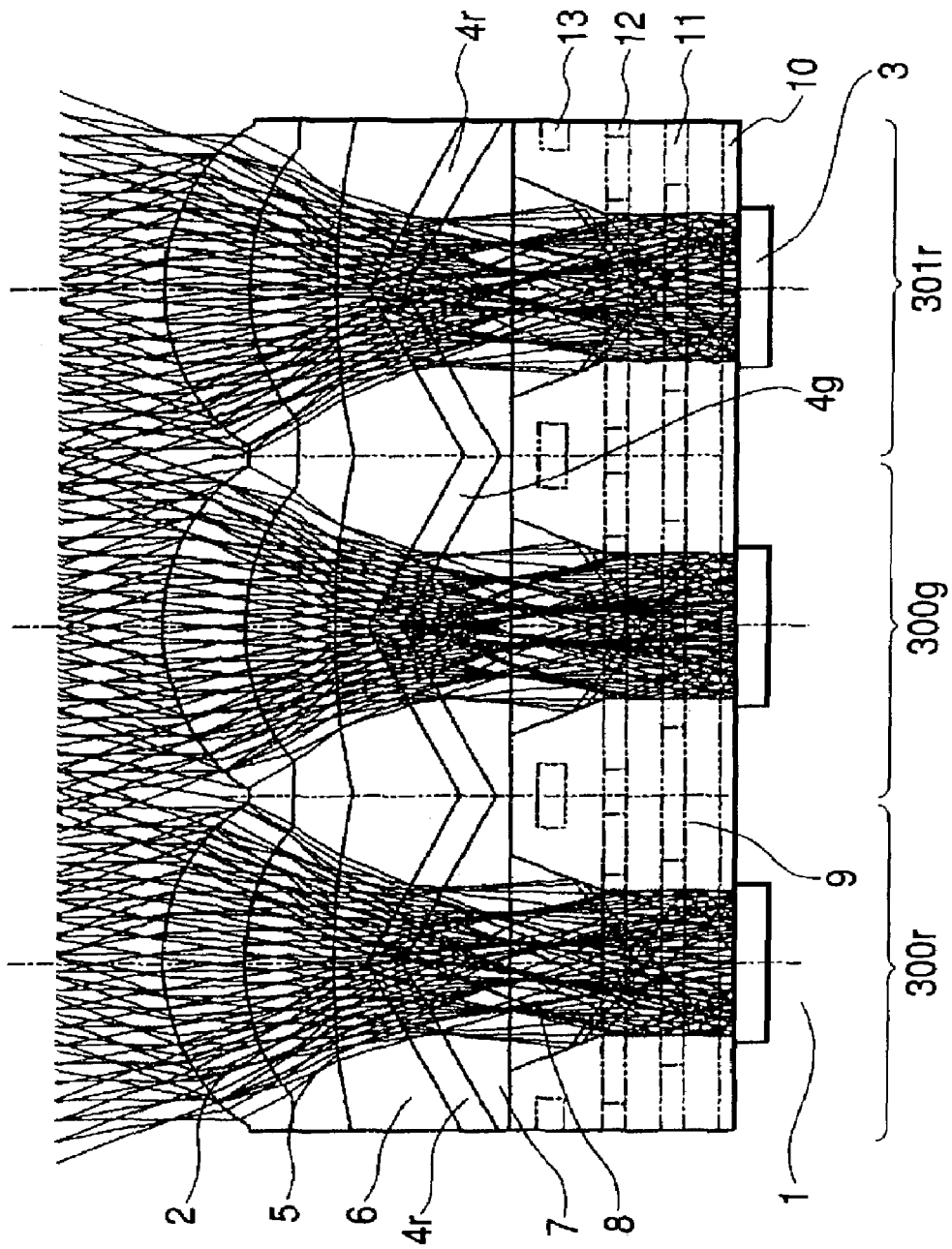
FIG. 35 is a traced view of light (transmitted light) of the third embodiment of the present invention.

FIG. 33 shows a third embodiment of the present invention. It is assumed that components denoted by the identical reference symbols perform the identical functions. Behaviors of light in an image pickup element in this embodiment are as shown in FIGS. 34 and 35. As in the first embodiment, FIG. 34 shows behaviors of only light which is incident on the pixel 100g for receiving green light and reflected by the dichroic film 4g, that is, light including blue light and red light. Light which has exited a pupil of an imaging lens placed in a sufficiently distant position compared with a size of a pixel, passes through an infrared light cut filter to become light beams like object light 130. The object light 130 coming from above in the figure is incident on the microlens 2 and subjected to a condensing action. Next, the light is incident on the second refractive index area 5 and the first refractive index area 6 in order and reach the dichroic film 4g. Here, light other than green light is subjected to a reflecting action due to characteristics of the dichroic film 4g. Since the dichroic film 4g is formed on a surface of a square pyramid shape as shown in FIG. 9, the reflected light changes a direction from a center to an outside thereof and travels. Then, light having an angle equal to or larger than a critical angle is subjected to a total reflection action on the interface between the first refractive index area 6 and the second refractive index area 5. In this case, since the interface between the second refractive index area 5 and the first refractive index area 6 has an upwardly convex spherical shape, the interface serves as a concave mirror and performs a function for condensing light. Consequently, since light beams can be collected, it becomes possible to take in light of a wide area. Subsequent behaviors of the light until it reach the photoelectric conversion section 3 are the same as those in the second embodiment.

FIG. 35 shows behaviors of light subjected to a transmitting action in the dichroic film 4g. Behaviors of the light coming from above in the figure until it reaches the photoelectric conversion section 3 are the same as those in the second embodiment. As it is evident from this figure, transmitted light in a substantially wide area can also be taken in.

Fourth Embodiment

Figure 36:
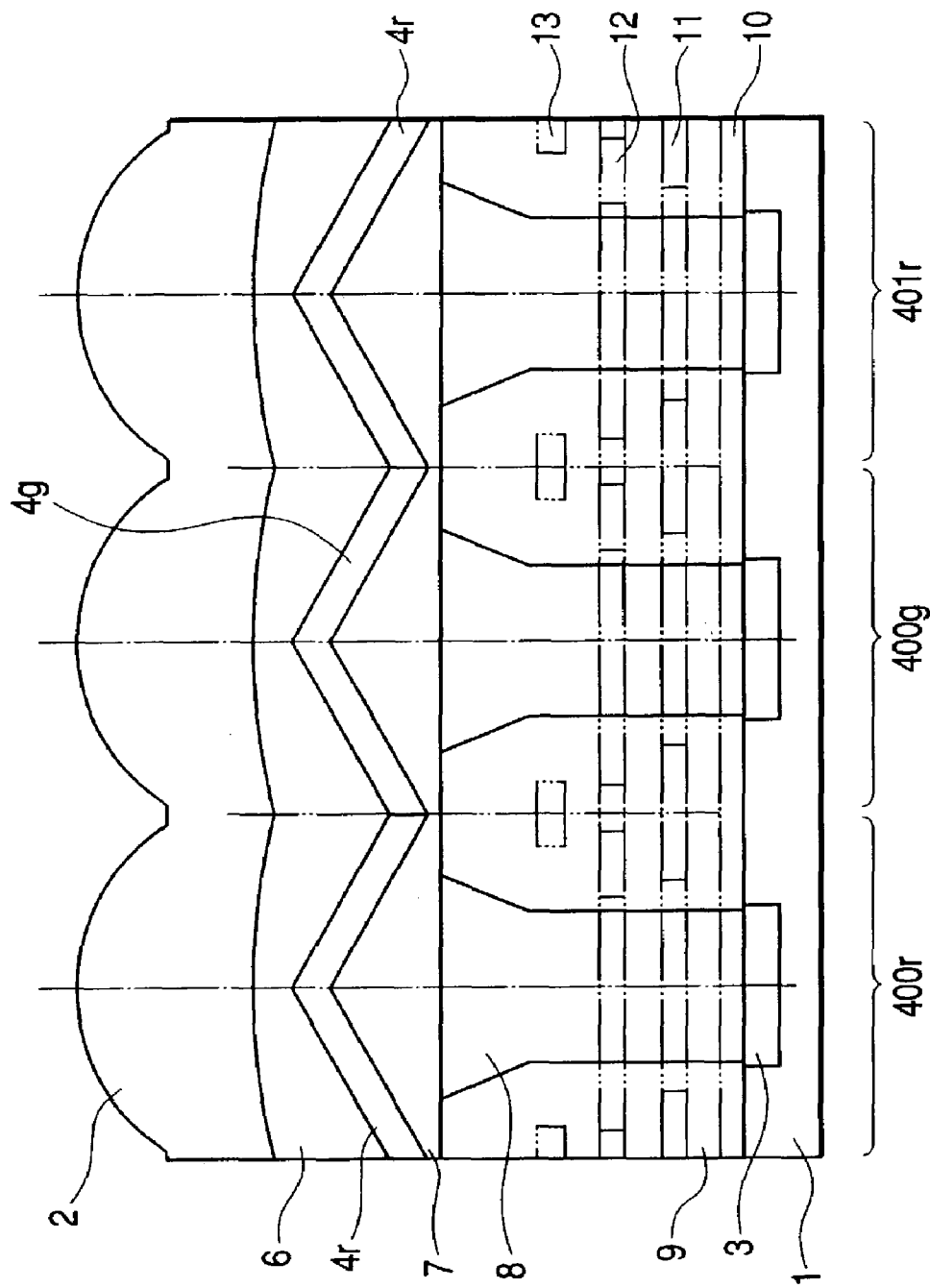
FIG. 36 is a view showing a fourth embodiment of the present invention.
Figure 37:
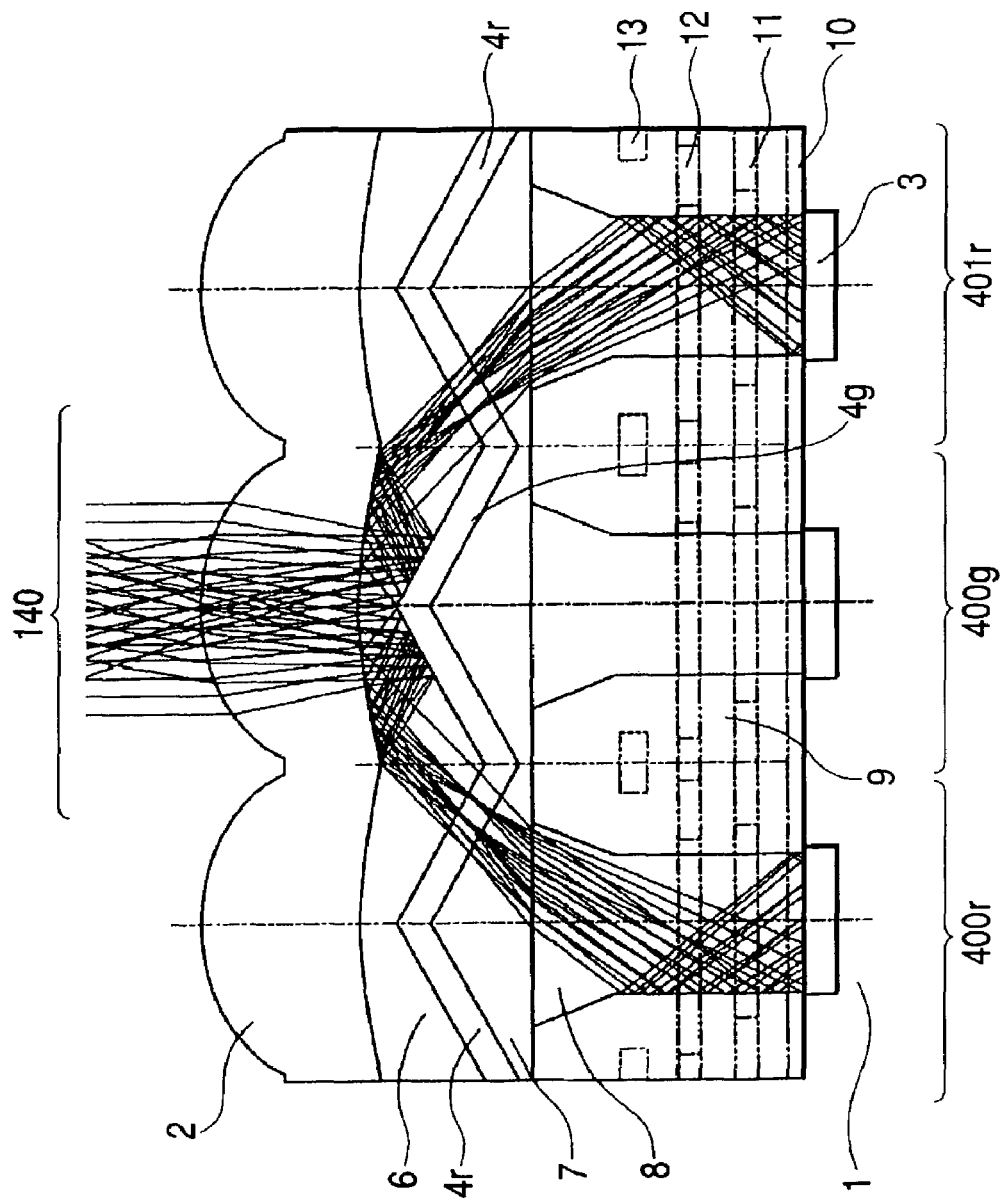
FIG. 37 is a traced view of light (reflected light) of the fourth embodiment of the present invention.
Figure 38:
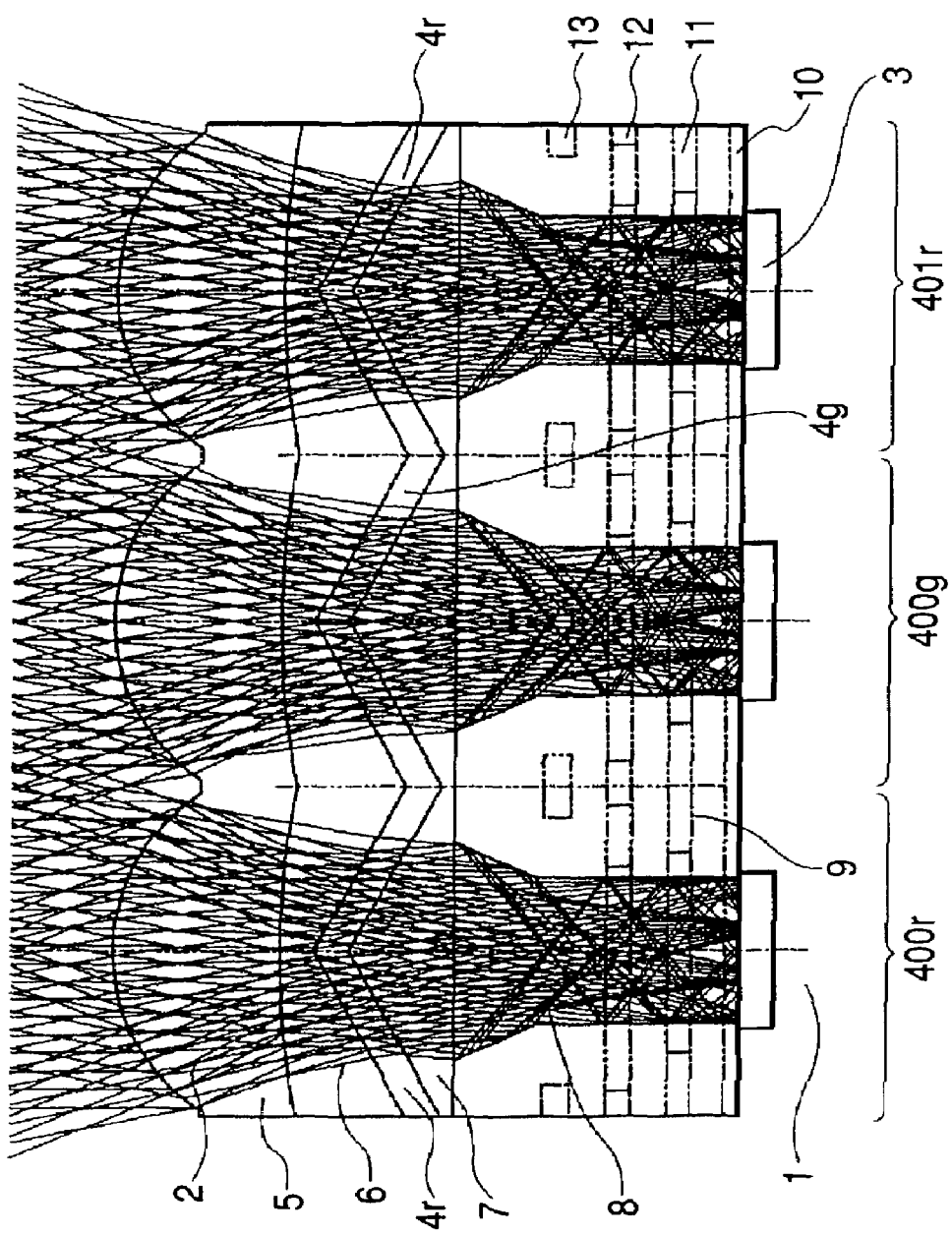
FIG. 38 is a traced view of light (transmitted light) of the fourth embodiment of the present invention.

FIG. 36 shows a fourth embodiment of the present invention. It is assumed that components denoted by the identical reference symbols perform the identical functions. In this embodiment, it is more desirable to use a material with a low refractive index such as magnesium fluoride or silicon dioxide in the microlens 2 because it is necessary that light tends to be totally reflected on the interface between the microlens 2 and the first refractive index area 6. Behaviors of light in an image pickup element in this embodiment are as shown in FIGS. 37 and 38. As in the first embodiment, FIG. 37 shows behaviors of only light which is incident on the pixel 100g for receiving green light and reflected by the dichroic film 4g, that is, light including blue light and red light. Light which has exited a pupil of an imaging lens placed in a sufficiently distant position compared with a size of a pixel, passes through an infrared light cut filter to become light beams like object light 140. The object light 140 coming from above in the figure is incident on the microlens 2 and subjected to a condensing action. Next, the light reaches the dichroic film 4g through the first refractive index area 6. Subsequent behaviors of the light until it reaches the photoelectric conversion section 3 are the same as those in the second embodiment.

FIG. 38 shows behaviors of light subjected to a transmitting action in the dichroic film 4. The light coming from above in the figure is incident on the microlens 2 and subject to a condensing action. Next, the light reaches the dichroic film 4g through the first refractive index area 6. Thereafter, behaviors of the light until it reaches the photoelectric conversion section 3 are the same as those in the second embodiment. As it is evident from this figure, transmitted light in a sufficiently wide area can also be taken in. By adopting the structure as in this embodiment, one layer can be eliminated from a layer structure for forming a total reflection surface.

Fifth Embodiment

Figure 39:
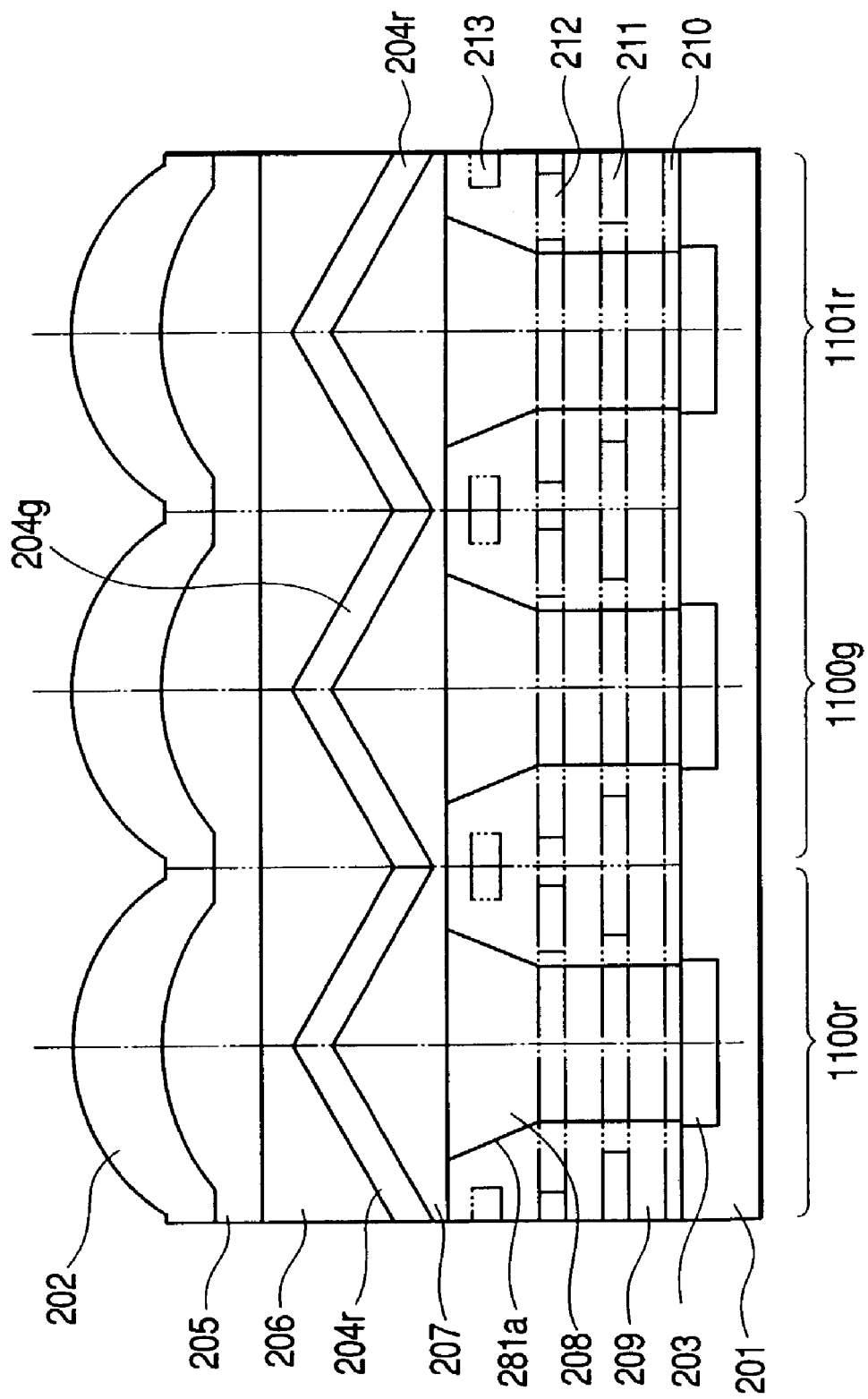
FIG. 39 is a view showing a fifth embodiment of the present invention.
Figure 40:
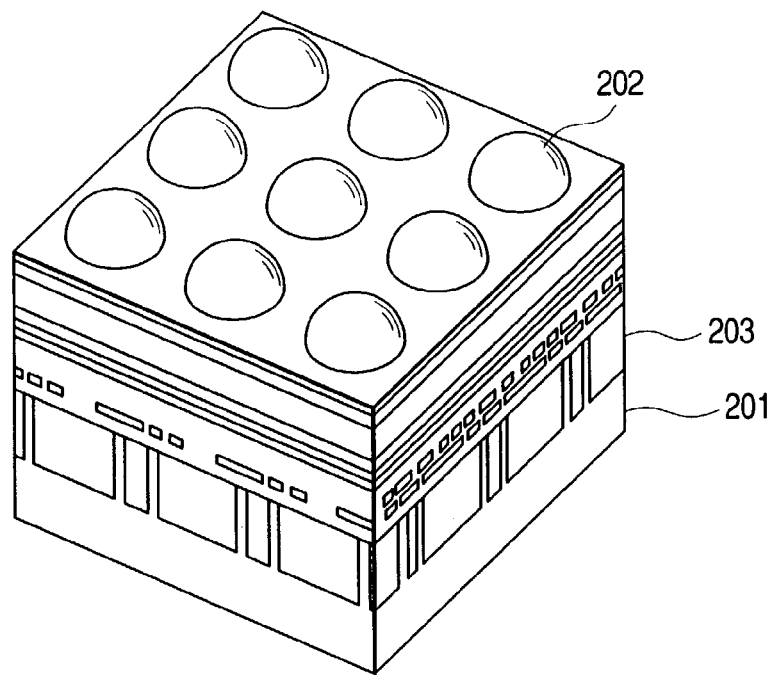
FIG. 40 is a perspective view of the fifth embodiment of the present invention.
Figure 41:
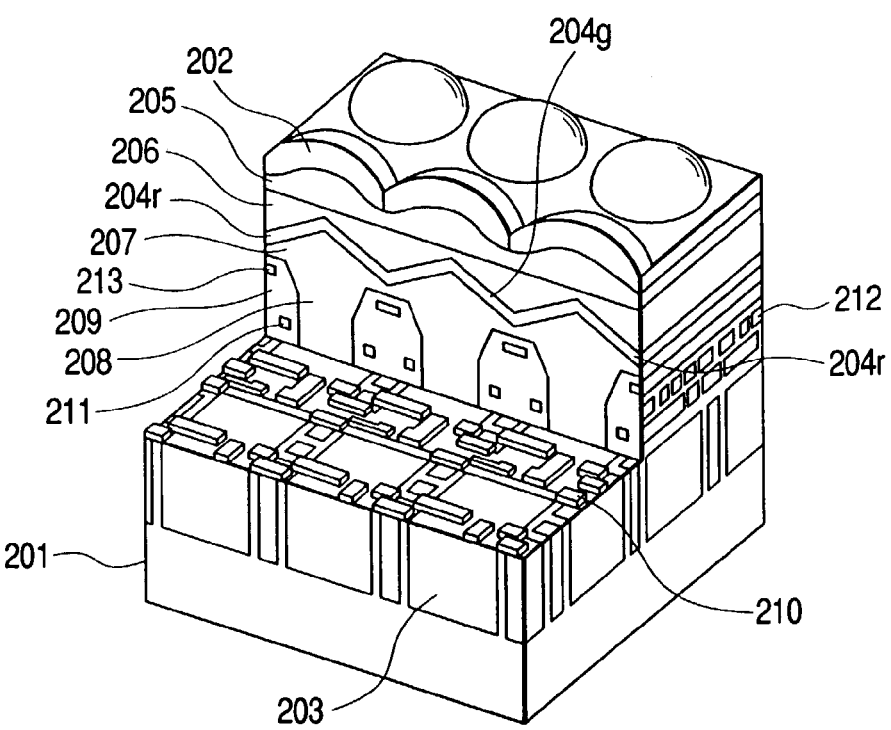
FIG. 41 is a sectional perspective view of the fifth embodiment of the present invention.

FIGS. 39 to 60 show a fifth embodiment of the present invention. FIG. 39 is a sectional view of an image pickup element. In the figure, reference numeral 201 denotes a silicon wafer; 202, a microlens; 203, a photoelectric conversion section having a function for converting a received photon into an electric charge; 204 (204r and 204g), dichroic films serving as a wavelength selection section for separating wavelengths of a light; 205, a third refractive index area having a third refractive index; 206, a fourth refractive index area having a fourth refractive index; 207, a fifth refractive index area having a fifth refractive index; 208, a first refractive index area having a first refractive index; 209, a second refractive index area having a second refractive index; and 210, a Poly wiring layer serving as a gate for controlling an electric charge of the photoelectric conversion section. Reference numerals 211 to 213 denote wiring layers made of a metal such as aluminum. Among the wiring layers, reference numeral 211 denotes an AL1 wiring layer serving as a connection and an output line between adjacent two sections; 212, an AL2 wiring layer serving as a well power supply line and a control line; and 213, an AL3 wiring layer serving as light shield and a power supply line. In addition, FIG. 40 schematically shows only nine pixels extracted out of a large number of pixels in the form of a perspective view of the image pickup element viewed obliquely from above. Moreover, FIG. 41 shows a sectional view cut along the structures from the microlens 202 to the AL3 wiring layer through the dichroic film 4 in the central part of FIG. 40.

In FIG. 39, the microlens 202 is formed in an upwardly convex spherical shape and has a positive lens power. Therefore, the microlens 202 functions to condense light which have reached on the microlens 202 to the photoelectric conversion section 203. Consequently, since more light beams can be taken into the photoelectric conversion section 203, it becomes possible to increase a sensitivity of the image pickup element. The third refractive index area 205 is formed of a material with a low refractive index. For example, magnesium fluoride ($MgF_2$) with a refractive index of 1.38 or the like can be used as the material. In addition, the fourth refractive index area 6 sandwiched by the third refractive index area 205 and the dichroic film 204 is formed of a material with a high refractive index. For example, titanium dioxide ($TiO_2$) with a refractive index of 2.5 or the like can be used as the material. By employing such a structure, light travelling from the fourth refractive index area 6 to the third refractive index area 205 is given a characteristic that the light tends to be totally reflected on an interface between these areas.

The first refractive index area 208 is formed of a material with a high refractive index such as titanium dioxide and the second refractive index area 209 is formed of a material with a low refractive index such as silicon dioxide ($SiO_2$) or magnesium fluoride having a refractive index of 1.46. Consequently, since light incident on the first refractive index area tends to be totally reflected on an interface between the first refractive index area and the second refractive index area, these areas play a role of a light guide path leading to the photoelectric conversion section 203. It is necessary to form the fifth refractive index area 207 using a material having a refractive index equal to or lower than that of the first refractive index area such that light is not totally reflected on an interface between the fifth refractive index area and the first refractive index area. However, since a difference of refractive indexes between the second refractive index area 206 and the fifth refractive index area 207 is desirably not too large, for example, silicon nitride ($Si_3N_4$) with a refractive index of 2.0 or the like can be used.

Figure 56:
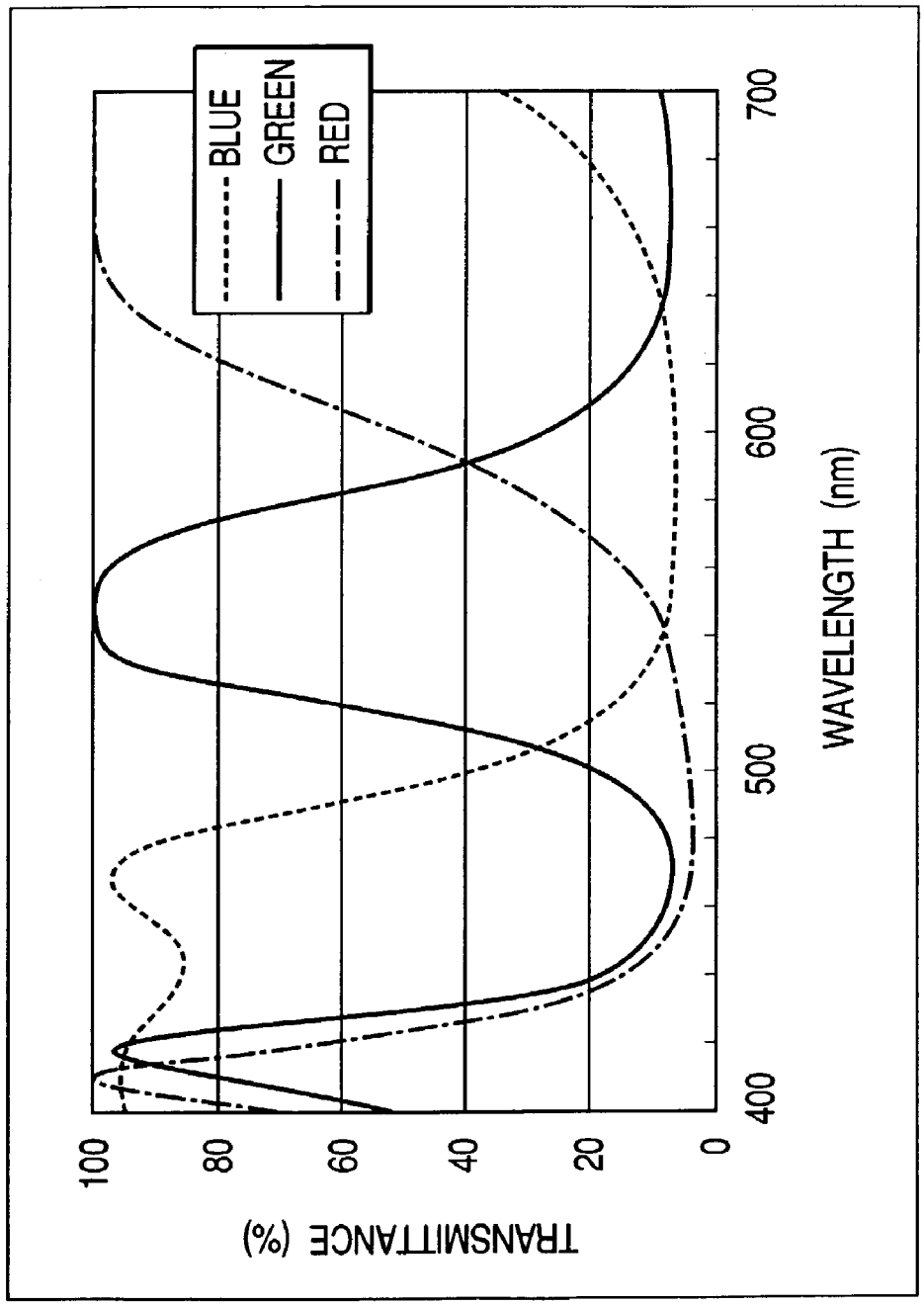
FIG. 56 is a graph showing characteristics of the dichroic film.

In general, a dichroic film is formed by alternately stacking a material with a high refractive index and a material with a low refractive index with a film thickness which is an integer times of ¼ of a wavelength λ of interest. By adopting such a structure, a wavelength of a transmitted beam can be selected. FIG. 55 shows an example of the dichroic film 204 used in this embodiment. Titanium dioxide and silicon dioxide is used as a material with a high refractive index and a material with a low refractive index, respectively, and the film thickness and the number of layers are set as shown in the table. Transmission characteristics of the dichroic film 4 are shown in FIG. 56. As it is seen from a characteristic graph of FIG. 56, the dichroic film 204 has characteristics which are close to characteristics shown in the characteristic graph of color filters using the conventional pixels shown in FIG. 3. Therefore, even an image pickup element using the dichroic film 204 with this structure can have characteristics close to characteristics of the conventional image pickup element. These stacked films can be produced easily by using Physical Vapor Deposition (PVD).

Figure 42:
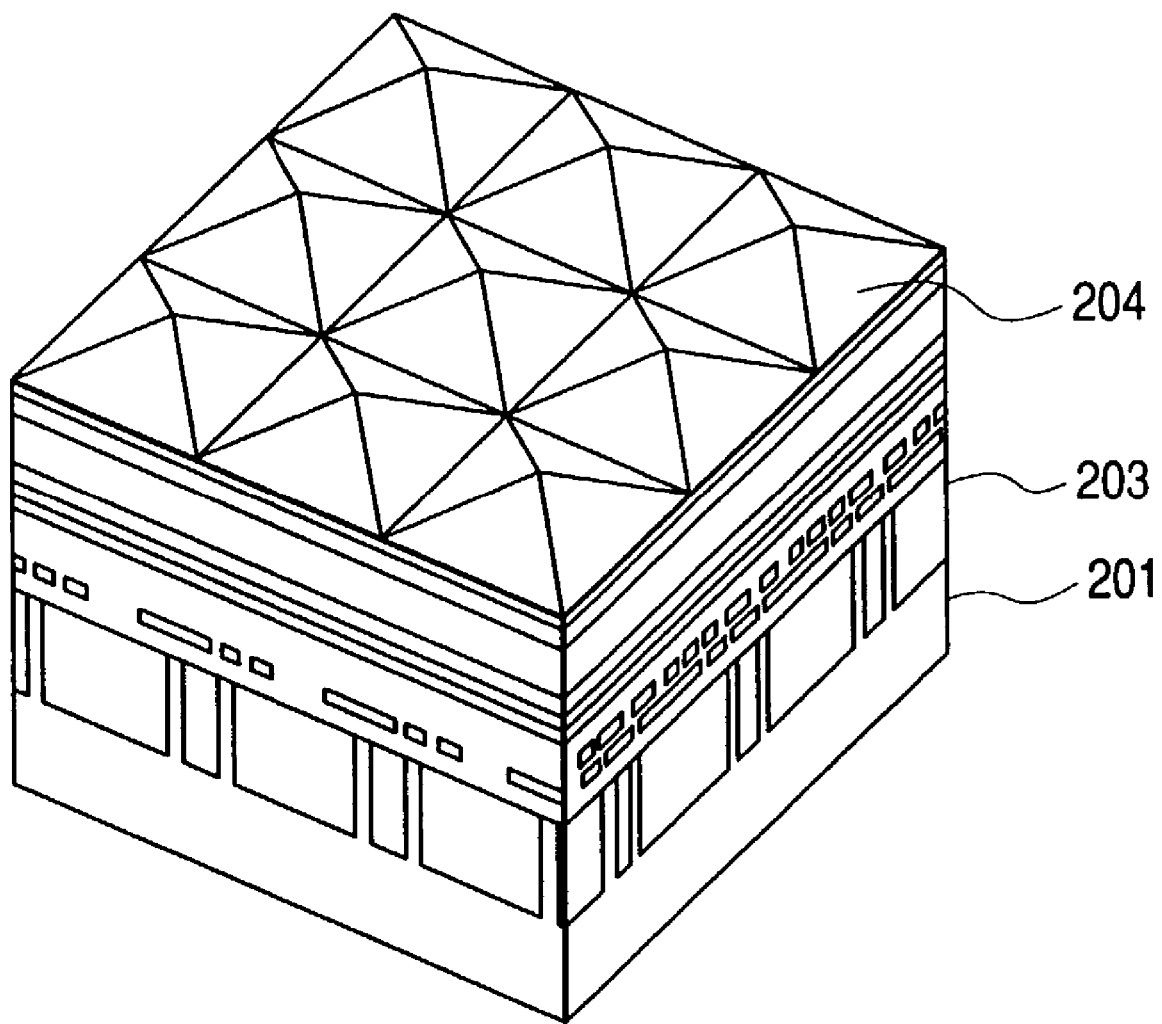
FIG. 42 is a perspective view showing a dichroic film section.
Figure 43:
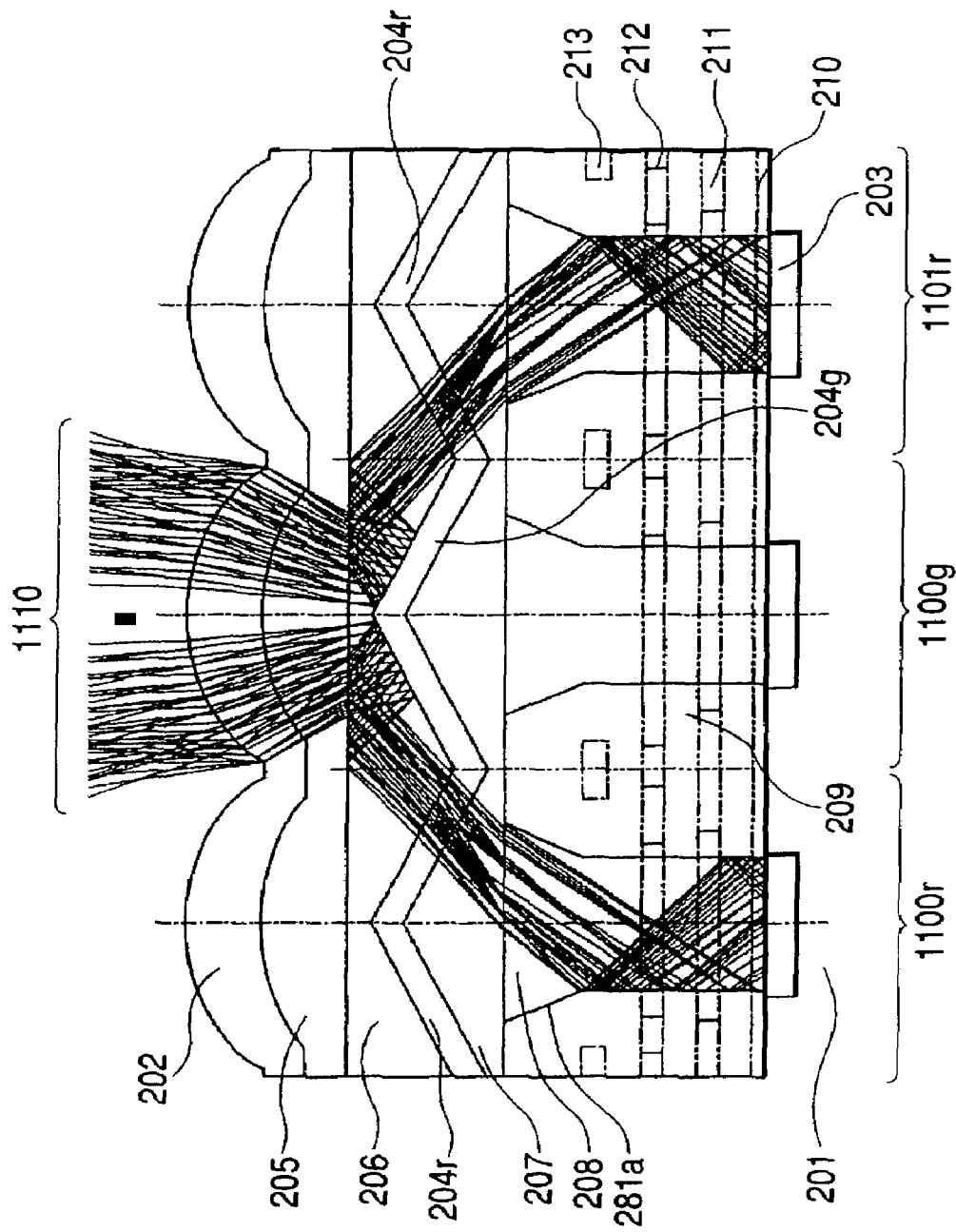
FIG. 43 is a traced view of light (reflected light) of the fifth embodiment of the present invention.

Next, behaviors of light in the image pickup element in this embodiment will be described with reference to FIGS. 43 and 44. FIG. 43 shows behaviors of only light which is incident on a pixel 100g for receiving green light and reflected by a dichroic film 204g, that is, light including blue light and red light. Light which has exited a pupil of an imaging lens placed in a sufficiently distant position compared with a size of a pixel, passes through an infrared light cut filter to become light beams like object light 1100. The object light 1100 coming from above in the figure is incident on a microlens 202 and subjected to a condensing action. Next, the light is incident on a third refractive index area 205 and a fourth refractive index area 206 in order and reach the dichroic film 204g. Here, light other than green light is subjected to a reflecting action due to characteristics of the dichroic film 204g. Consequently, the light travels to a direction of the third refractive index area 205. However, since the dichroic film 204g is formed on a surface having a square pyramid shape as shown in FIG. 42, the reflected light changes a direction from a center to an outside thereof and travels. As described above, since the fourth refractive index area 206 has a higher refractive index than the third refractive index area 205, light having an angle equal to or larger than a critical angle are subjected to a total reflection action on the interface between the fourth refractive index area 206 and the third refractive index area 205. The light totally reflected on the interface is directed to a direction of a dichroic film 204r and travels toward pixels 1100r and 1101r for receiving red light which are adjacent pixels. The dichroic film 204r of the pixels 1100r and 1101r has a characteristic for transmitting red light and reflecting green light and blue light. Therefore, only red light among the light reflected from the pixel 1100g is transmitted and blue light is subjected to a reflecting action by the dichroic film 204r. Here, the blue light subjected to the reflecting action is not illustrated because the blue light travels to the outside of the image pickup element. In the dichroic film 204r that transmits reflected light, an area in which light can be transmitted is reduced by an amount equivalent to a film thickness. However, an area of light incident on the dichroic film 204g according to a condensing action of the microlens 202 (area of reflected light) is small compared with an opening area of the microlens 2. Therefore, eclipse of the reflected light on the dichroic film 204r can be reduced. The light transmitted through the dichroic film 204r travels through a fifth refractive index area 207 and a first refractive index area 208 in order. Subsequently, the light is about to travel from the first refractive index area 208 to the second refractive index area 209. Again, as described above, since the first refractive index area 208 has a higher refractive index than the second refractive index area 209, light having an angle equal to or lager than a critical angle is totally reflected on a surface between the first refractive index area 208 and the second refractive index area 209. Since the interface between the first refractive index area 208 and the second refractive index area 209 is formed in a taper shape with a widened incident portion, a frontage for taking in incident light is widened and a large amount of light can be taken in the first refractive index area 208. If the incident portion of the first refractive index area 208 is not formed in a taper shape, light located on a lower side in the figure among the reflected light travels from the fifth refractive index area 207 to the second refractive index area 209. Then, since the fifth refractive index area 207 has a higher refractive index than the second refractive index area 209, the light is curved upward. Next, the light travel to the first refractive index area 208. However, since the first refractive index area 208 has a higher refractive index than the second refractive index area 209, the light is curved upward further. Therefore, since the light following such a route is not guided to the photoelectric conversion section 203 but lost, reflected light from the adjacent pixels can be sufficiently taken in by forming the first the first refractive index area 208 in a taper shape to eliminate light traveling from the fifth refractive index area 207 to the second refractive index area 209.

Further, since the interface between the first refractive index area 208 and the second refractive index area 209 is formed of two surfaces which are substantially parallel with an optical axis of an imaging lens, the light, which has not been incident on the photoelectric conversion section 203 by the first total reflection, is totally reflected again on an interface on the opposite side and is finally incident on the photoelectric conversion section 203.

In the pixel 1100g, a pixel for receiving blue light exists in a vertical direction with respect to the paper surface. As in the case of a red light, the pixel exhibits a behavior of taking in only the blue light among light reflected by the pixel 1100g.

Figure 44:
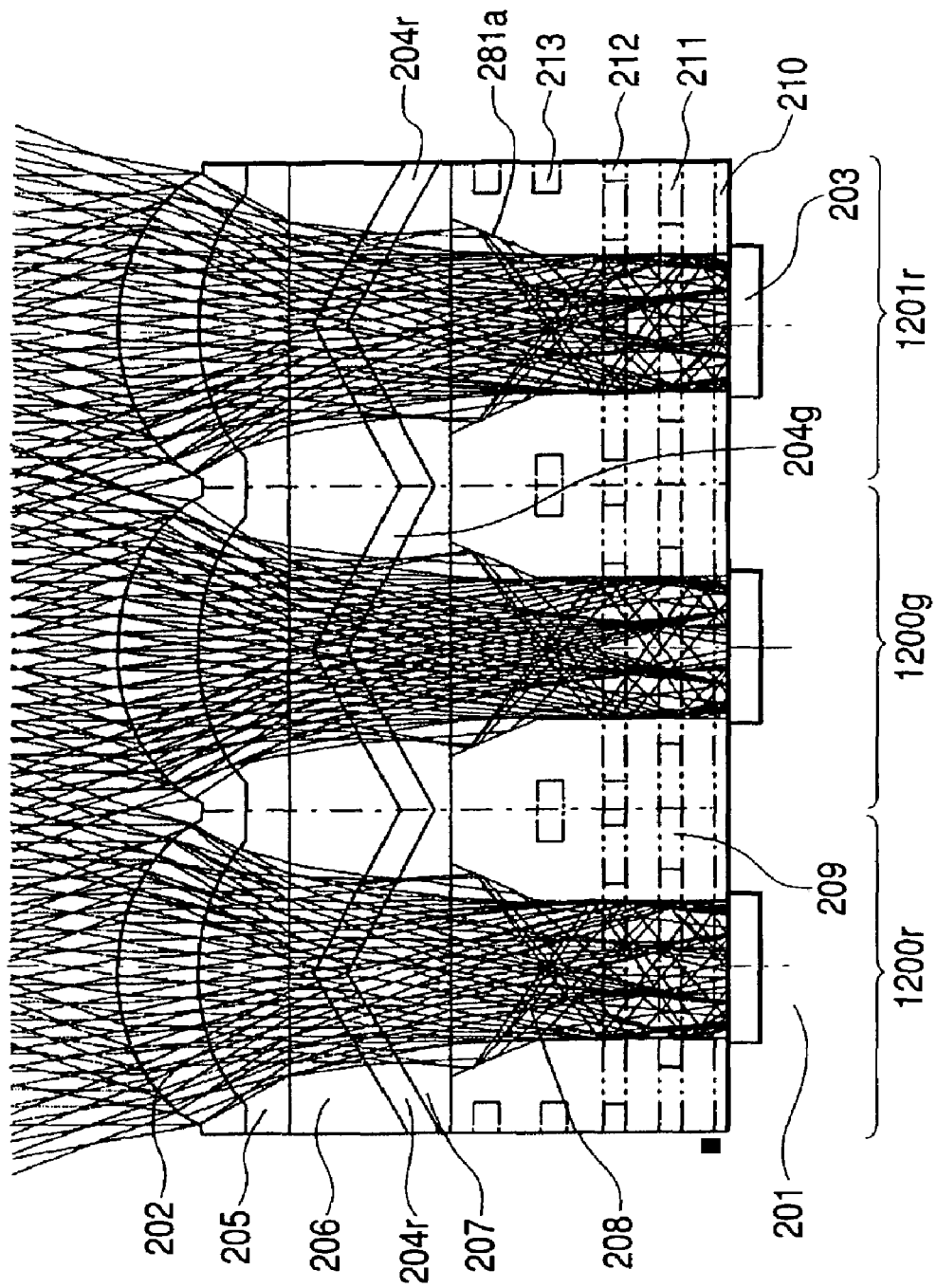
FIG. 44 is a traced view of light (transmitted light) of the fifth embodiment of the present invention.

FIG. 44 shows behaviors of light subjected to a transmitting action in a dichroic film 204. The light coming from above in the figure is incident on the microlens 202 and subject to a condensing action. Next, the light is incident on the third refractive index area 205 and the fourth refractive index area 206 in order and reach the dichroic film 204g. Only light with a predetermined wavelength is selectively transmitted through the dichroic film 204g and is incident on the fifth refractive index area 207. Then, the light travels to the first refractive index area 208 and is subjected to an action for repeating total reflection on the interface between the first refractive index area 208 and the second refractive index area 209, thereby being guided to the photoelectric conversion section 203. In addition, the interface between the first refractive index area 208 and the second refractive index area 209 is formed in a taper shape with a widened incident portion. If a taper surface 281a on which the taper shape is formed has a too sharp angle, light may not be totally reflected on the taper surface 281a, or even if the light is totally reflected, the light is not then totally reflected on a surface on the opposite side but transmitted. In the case of this embodiment, with an angle up to approximately 25° from a central axis of a pixel, the light is totally reflected on the taper surface 281a and can be guided to the photoelectric conversion section 3. By setting the taper surface 281a to an appropriate angle and using it, it becomes possible to take in light of a wide area.

Next, efficiency in taking in light using transmission and reflection of a dichroic film will be considered. For example, in a CCD image pickup element in which pixels with a primary color filter, which is considered to have a high color reproducibility, are arranged in a mosaic shape, one each of optical filters of R (red), G (green), and B (blue) are arranged between the microlens 202 and the photoelectric conversion area 203.

In this case, in a pixel with the red optical filter, only red light is photoelectrically converted and blue light and green light is absorbed by the optical filter to be heat. In a pixel with the green optical filter, the blue light and the red light are not photoelectrically converted and become heat in the same manner. In a pixel with the blue optical filter, the green light and the red light are not photoelectrically converted and become heat in the same manner. That is, only light which has transmitted through a predetermined optical filter in an incident light beam is photoelectrically converted and outputted as an electric signal in each pixel of the conventional color image pickup element. Thus, light which could not be transmitted through the optical filter is disposed as heat or the like.

Figure 1:
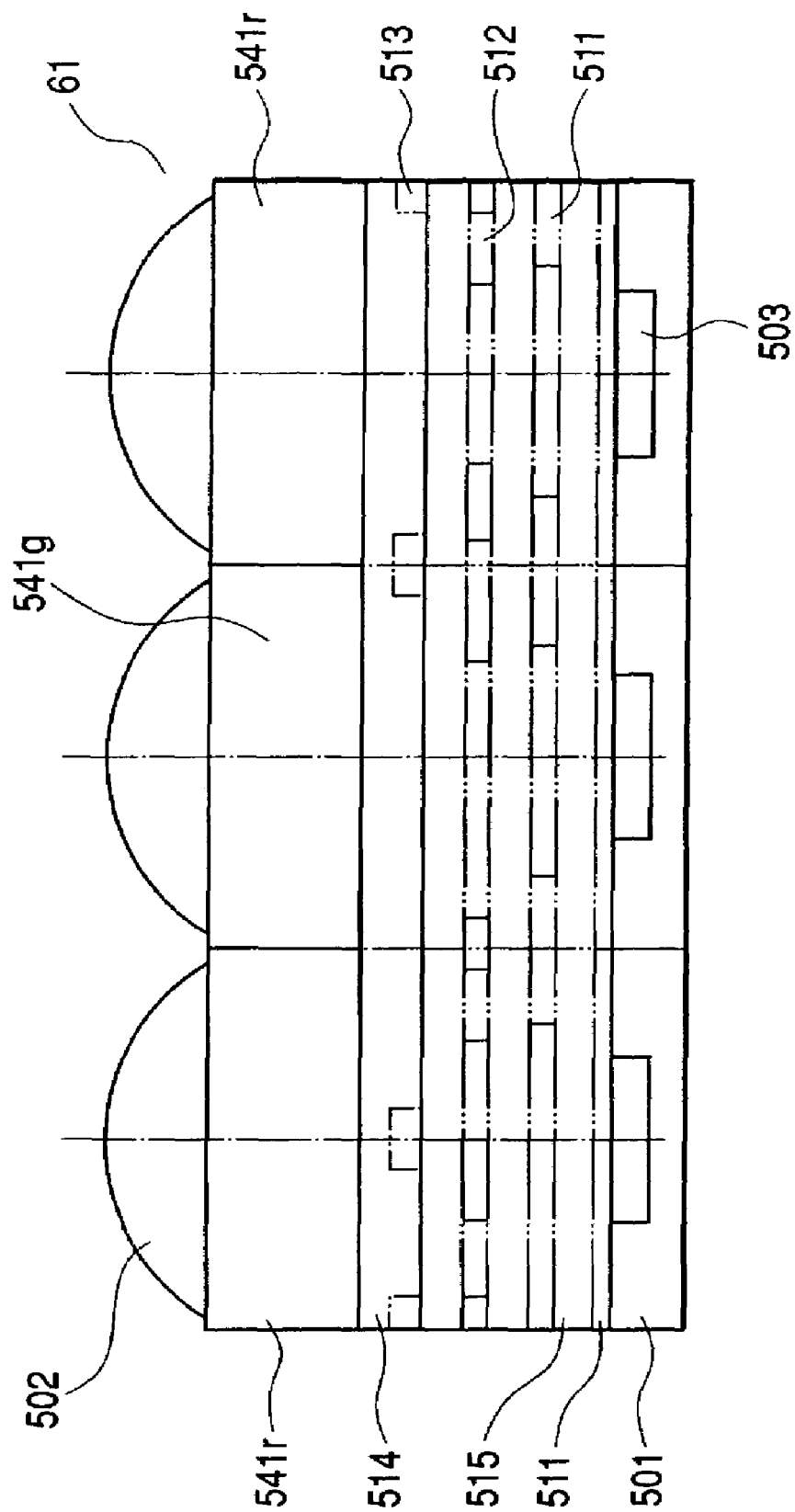
FIG. 1 is a sectional view showing a conventional pixel structure.
Figure 2:
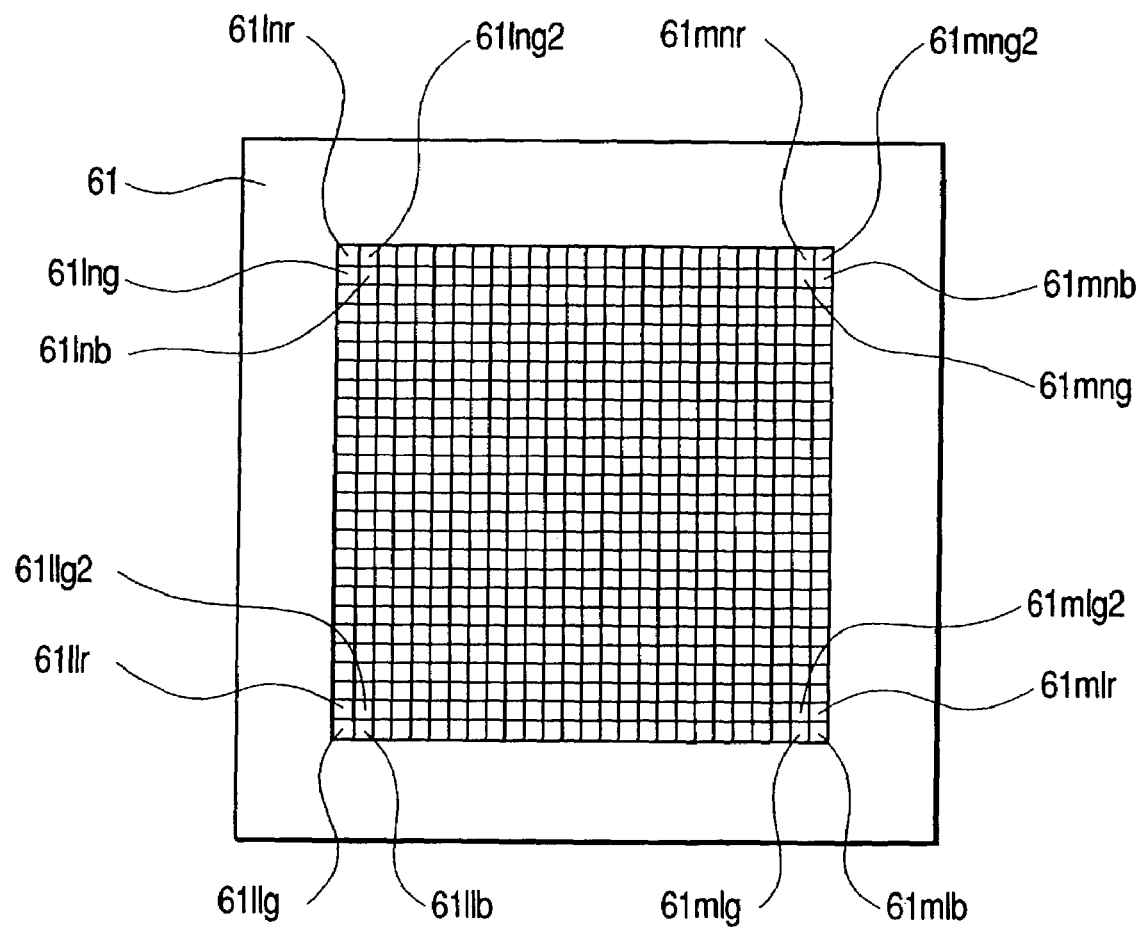
FIG. 2 is a plan view showing a conventional image pickup element.
Figure 3:
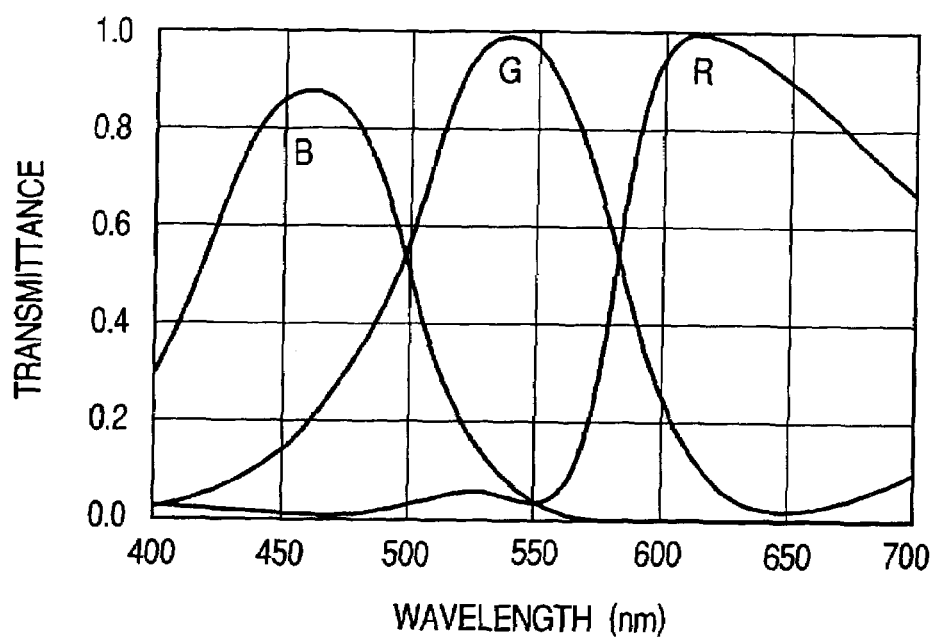
FIG. 3 is a graph showing characteristics of conventional color filters.
Figure 4:
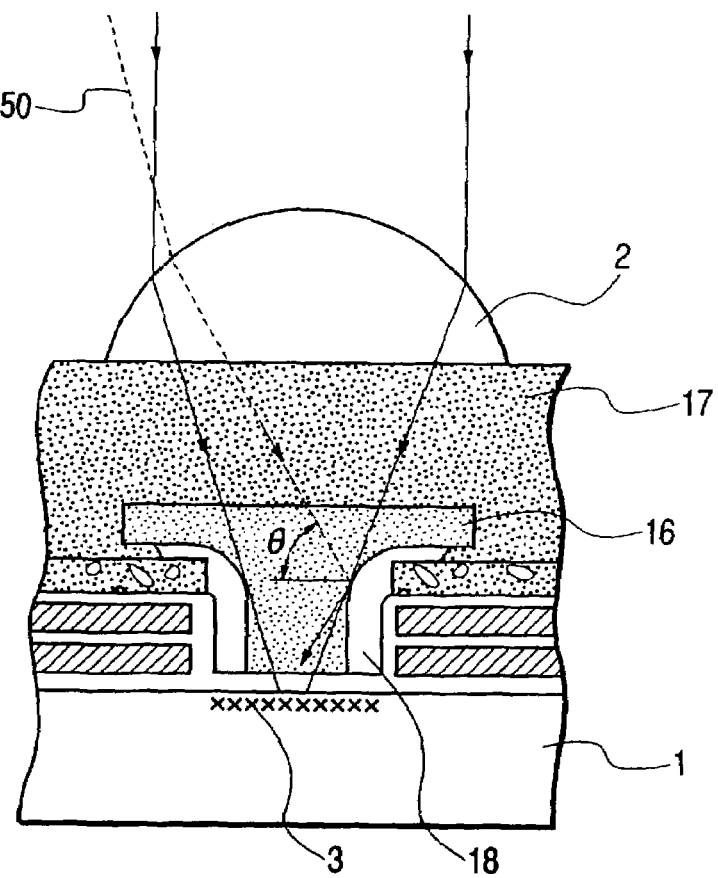
FIG. 4 is a view showing the conventional image pickup element.
Figure 5:
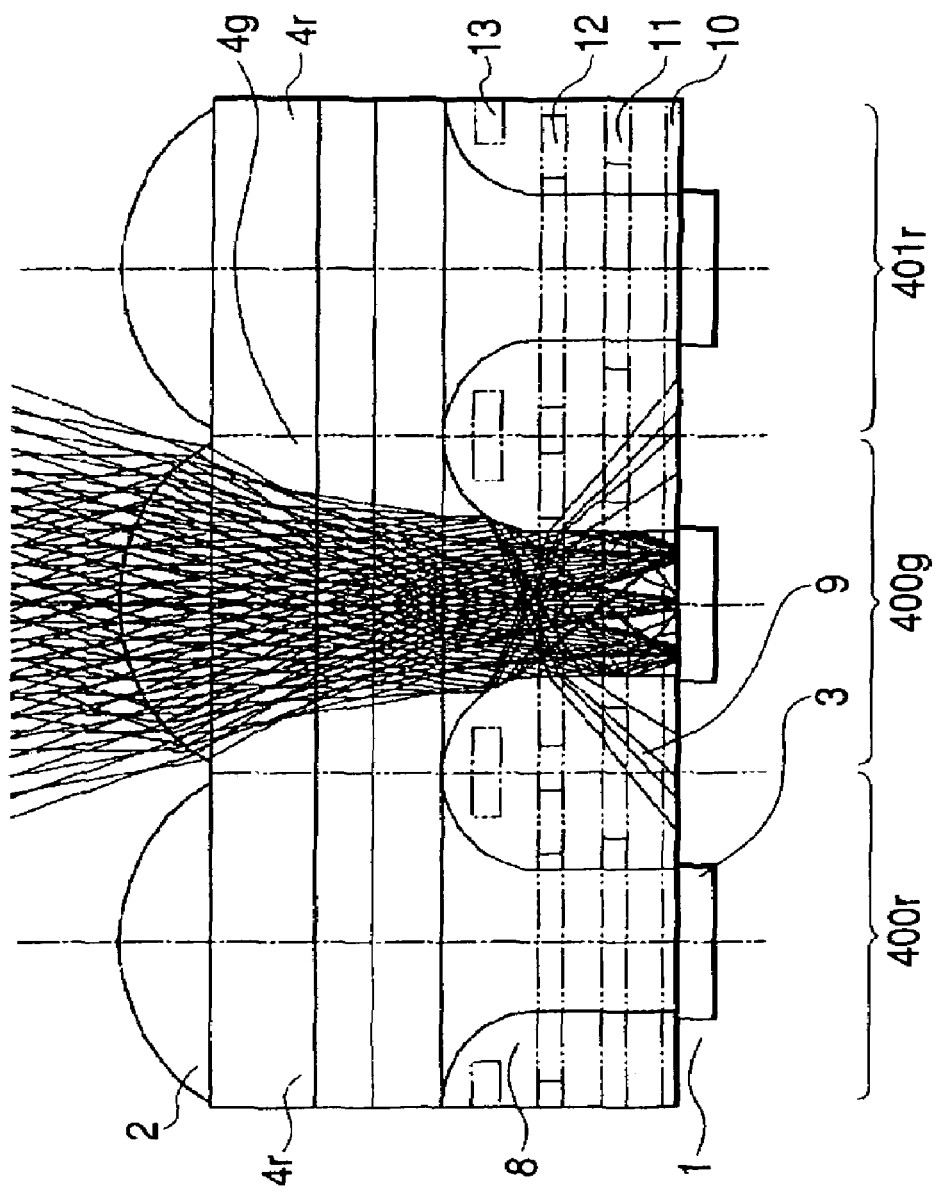
FIG. 5 is a traced view of light of the conventional image pickup element.

FIG. 3 shows a spectral transmittance characteristic of R, G, and B color filters in an image pickup element. Since a transmittance of infrared light is high, an infrared light cut filter for blocking a wavelength of 650 nm or more is actually further laid over these color filters between the image pickup element and an image pickup lens. As it is seen from this, only approximately one third of visible light is used effectively in one pixel.

Figure 45:
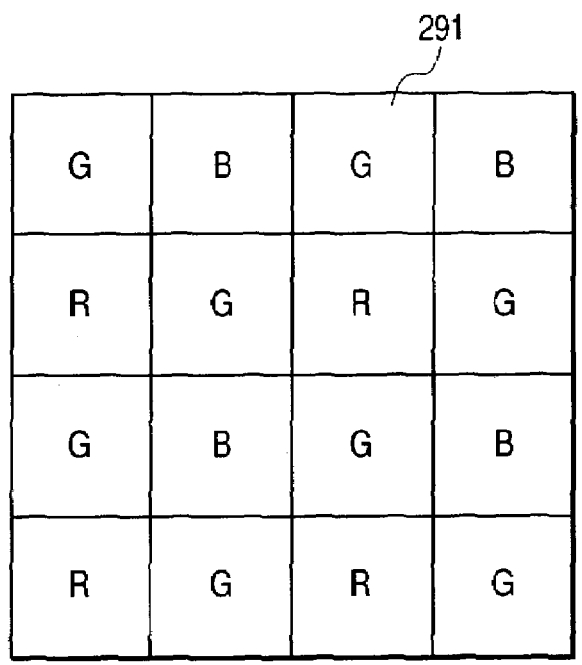
FIG. 45 illustrates a pixel structure.

If an efficiency of utilization is considered for each color of R, G, and B more in detail, for example, an area ratio of R, G, and B pixels of a color image pickup element of the Bayer array shown in FIG. 45 is $1/4:2/4:1/4$ in case that an area of one unit constituting a regular array is assumed to be one. Thus, a utilization ratio of green light in case that a total amount of light is assumed to be one is $1/3 \times 2/4 = 1/6$ as a product of a term of wavelength selectivity and a term of an area ratio, and that of red light and blue light is $1/3 \times 1/4 = 1/12$. In total, a utilization ratio of the light is $1/6 + 1/12 + 1/12 = 1/3$. Therefore, the efficiency of utilization is still $1/3$. On the contrary, in case that a total amount of light is assumed to be one, $2/3 \times 2/4 = 1/3$ of the green light and $2/3 \times 1/4 = 1/6$ of the red light and the blue light are not effectively utilized.

The above description is made referring to the image pickup element using color filters of primary colors. In an image pickup element using complimentary color filters, approximately $1/3$ of visible light is not photoelectrically converted and effectively utilized. In this way, no matter whether the color filters of primary colors or the color filters of complimentary colors are used, an efficiency of utilization of light is low in a conventional single plate image pickup element because an image pickup surface is divided by the color filters.

Figure 57:
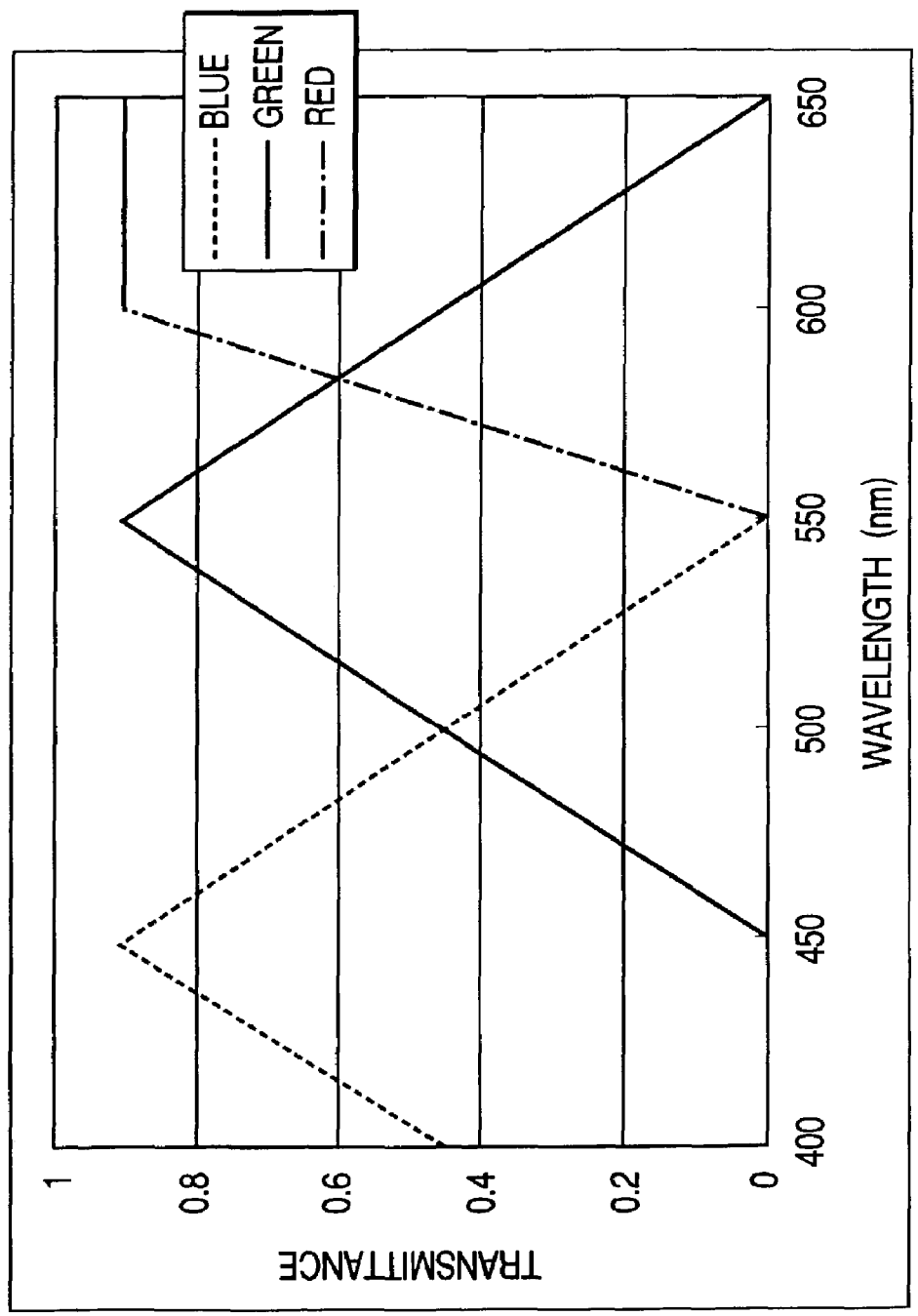
FIG. 57 is a schematic graph showing characteristics of the dichroic film.

FIG. 57 shows a simplified transmission characteristic of each color in the dichroic film. In the figure, the reverse of a transmission curve of each color indicates a reflection characteristic. In addition, it is assumed, for simplification of a calculation, that all of light which are not transmitted is reflected and that all of the reflected light reaches adjacent pixels equally. Moreover, it is assumed that a pixel array is in a form of the Bayer array as shown in FIG. 45.

Figure 58:
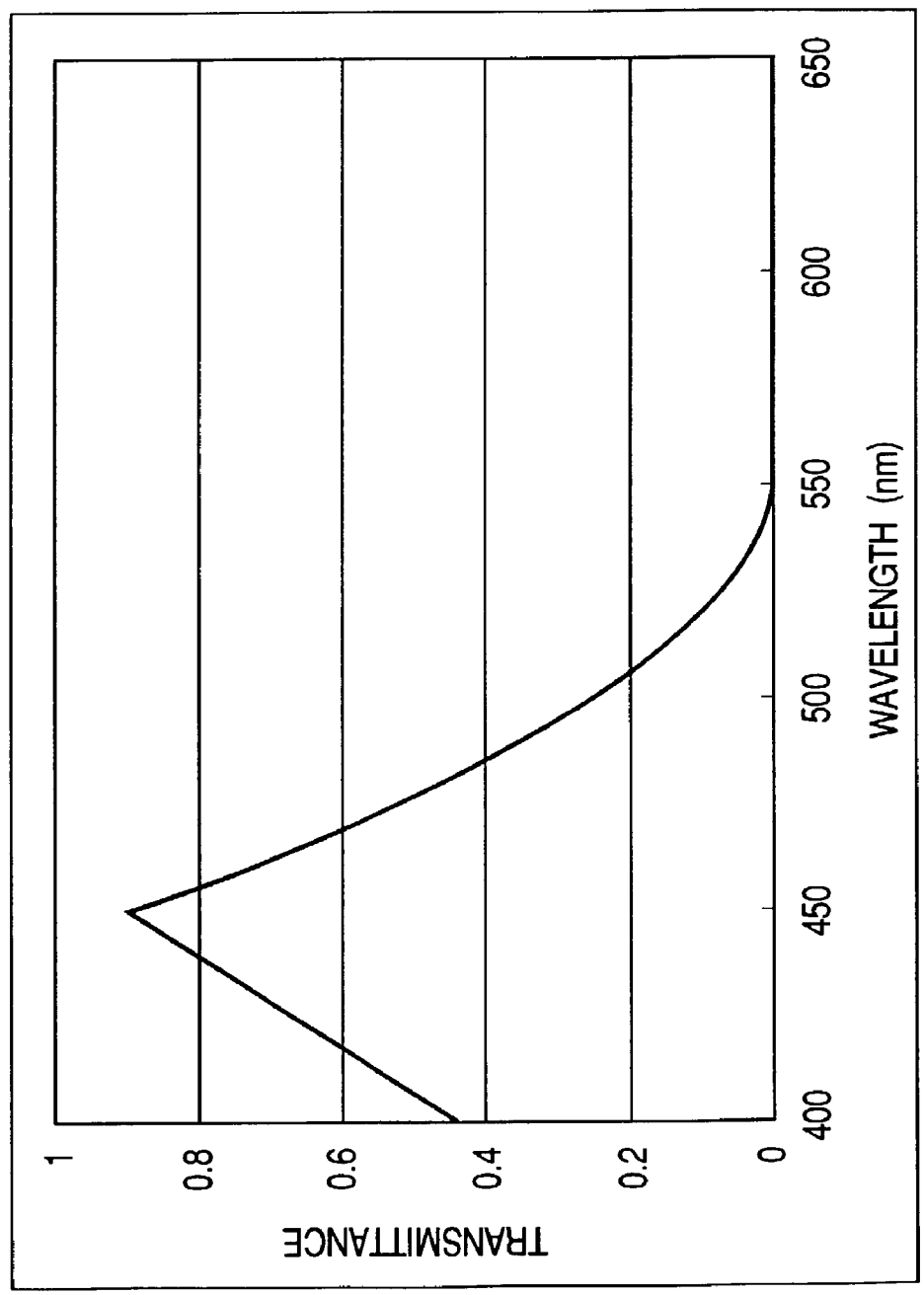
FIG. 58 is a schematic graph showing characteristics in case that light are reflected on a dichroic film for G transmission and transmitted through a dichroic film for B transmission.
Figure 59:
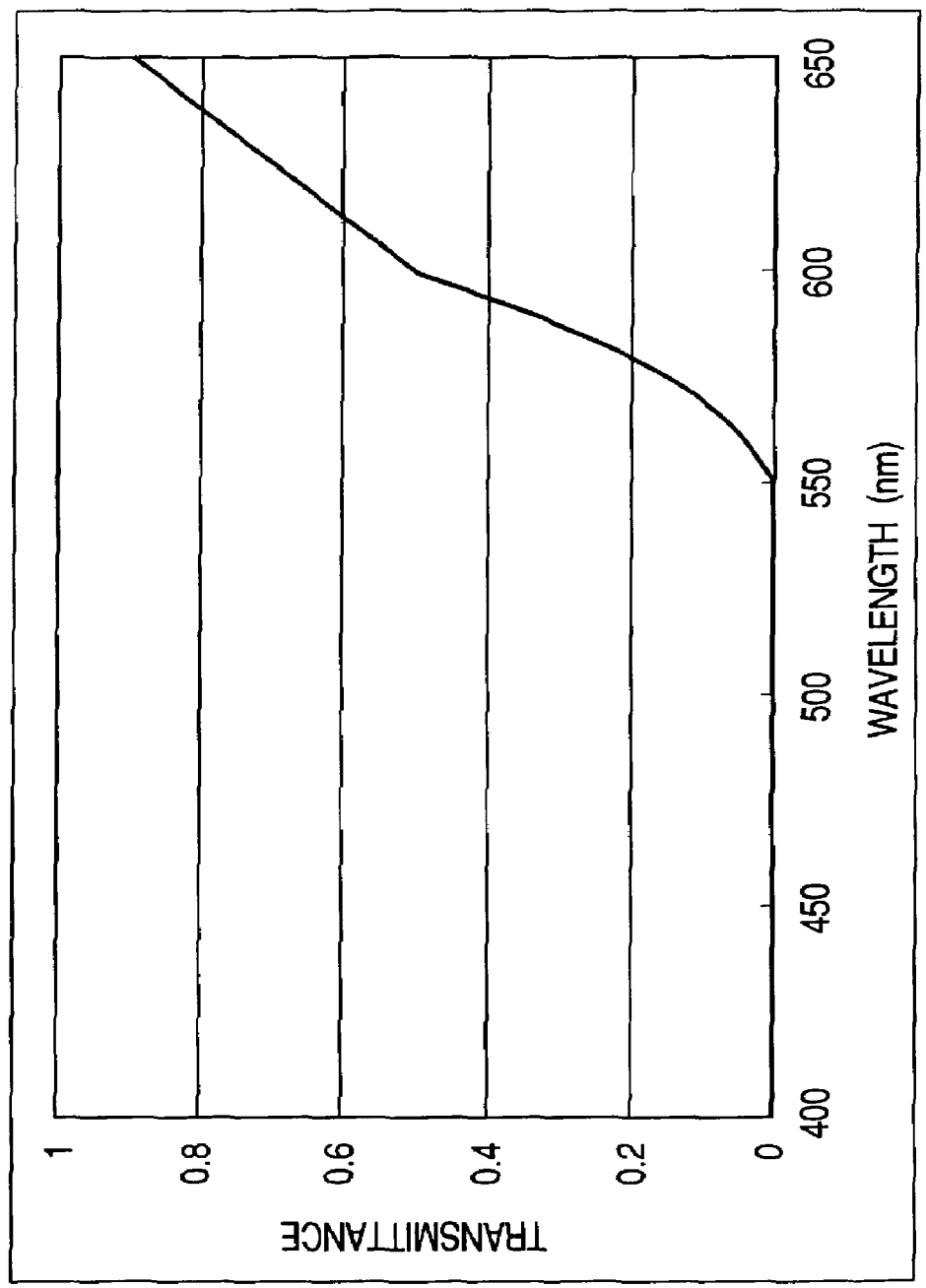
FIG. 59 is a schematic graph showing characteristics in case that light are reflected on the dichroic film for G transmission and transmitted through a dichroic film for R transmission.
Figure 60:
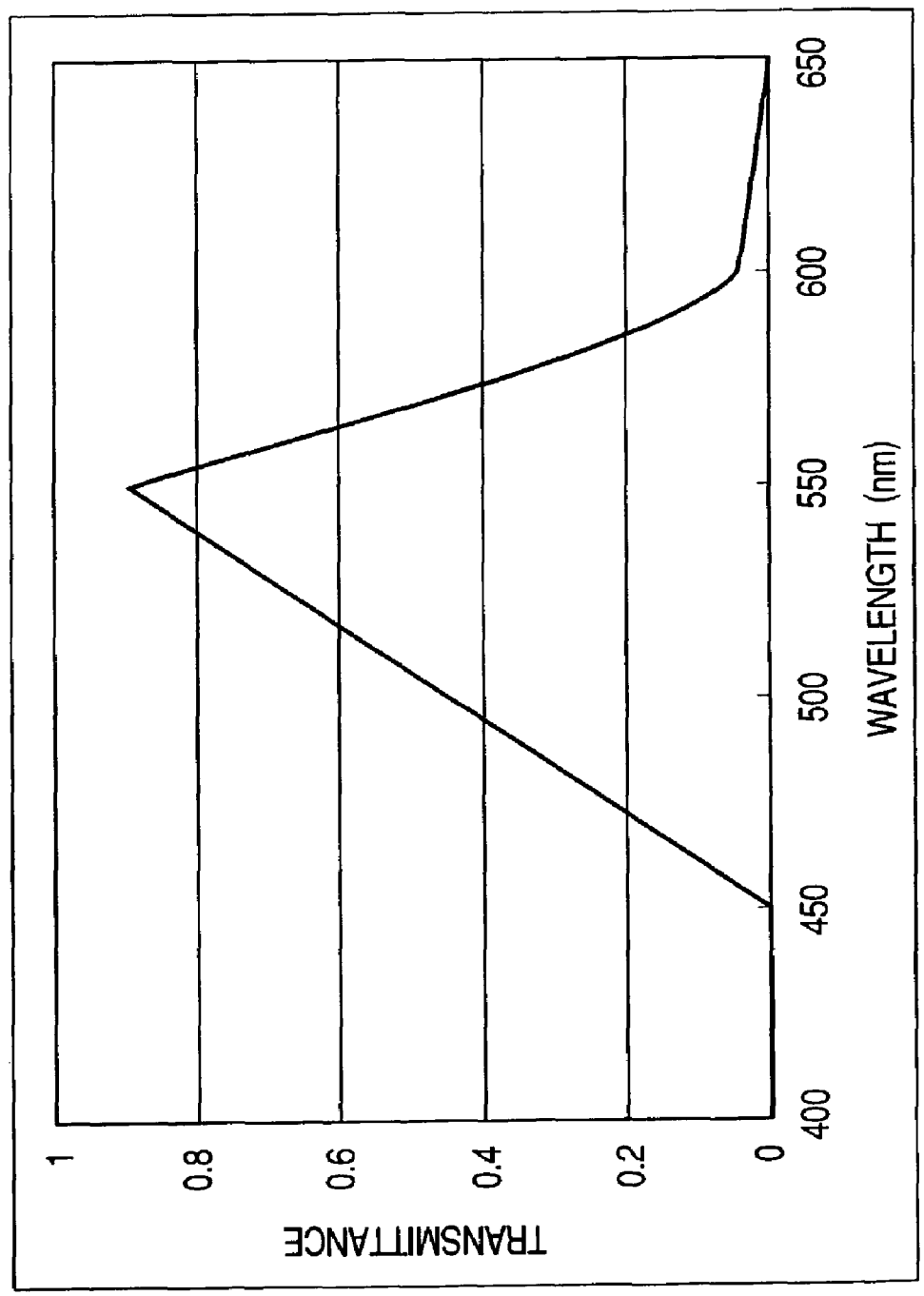
FIG. 60 is a schematic graph showing characteristics in case that light are reflected on the dichroic film for R transmission and transmitted through the dichroic film for G transmission.
Figure 61:
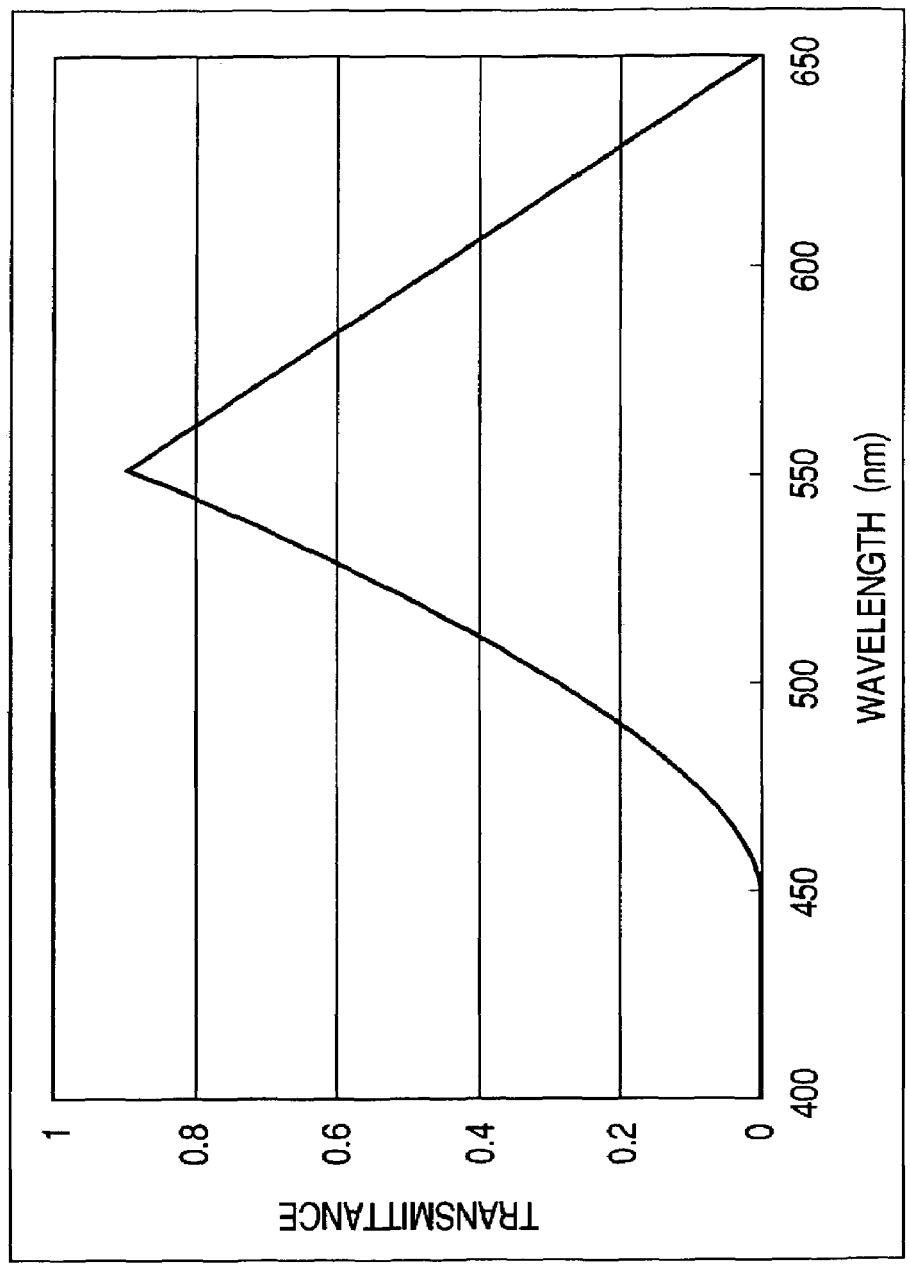
FIG. 61 is a schematic graph showing characteristics in case that light are reflected on the dichroic film for B transmission and transmitted through the dichroic film for G transmission.

As to the case in which light reflected on the dichroic film in a green pixel is transmitted through the dichroic film in a blue pixel and taken in a photoelectric conversion section for blue, since the reverse of a transmission characteristic of green is a reflection characteristic, a product of a curve of the transmission characteristic and a transmission characteristic of blue is an efficiency which should be calculated. FIG. 58 shows characteristics in this case. Similarly, as to the other colors, characteristics of light reaching a red pixel from the green pixel are shown in FIG. 59, characteristic of light reaching the green pixel from the red pixel are shown in FIG. 60, and characteristics of light reaching the green pixel from the blue pixel are shown in FIG. 61.

As to light reflected from adjacent pixels into the green pixel, there are two red and blue pixels, respectively, as adjacent pixels, because the pixel array is the Bayer array. Consequently, an amount of light which the green pixel receives from the adjacent pixels is {(light reflected by the blue pixels)$\times 1/4 \times 2$+(light reflected by the red pixels)$\times 1/4 \times 2$}. Since an amount of light which the green pixel receives originally is an integrated amount of a transmittance curve, in case that this is assumed to be one, an integrated amount in FIG. 60 (light reflected by the red pixel) is 0.74, and an integrated amount in FIG. 61 (light reflected by the blue pixel) is 0.85. Therefore, since a total amount of reflected light is 0.80, it is seen that an amount of light which the blue pixel receives is 1.80 times as large as that in the case in which only transmitted light is taken in.

As to the blue pixel, there are four green pixels as adjacent pixels. When it is assumed that an integrated amount of a transmittance curve of the blue pixel is one, an integrated amount in FIG. 58 is 0.84. Since an amount of light which the blue pixel receives from the adjacent pixels is {(light reflected by the green pixels)$\times 1/4 \times 4$}, it is seen that a total amount of reflected light is 0.84, which is 1.84 times as large as the original transmitted amount.

Lastly, as to the red pixel, there are four green pixels as adjacent pixels as in the case of the blue pixel. When it is assumed that an integrated amount of a transmittance curve of the red pixel is one, an integrated amount in FIG. 59 is 0.67. Since light which the red pixel receives from the adjacent pixels is {(light reflected by the green pixels)$\times 1/4 \times 4$}, it is seen that a total amount of reflected light is 0.67, which is 1.67 times as large as an original transmitted amount.

As described above, in the case in which adjacent pixels are not pixels of the same color as in the Bayer array, for any pixel, an unnecessary wavelength component is divided and reflected to the adjacent pixels by using the present structure, whereby the unnecessary wavelength component can be photoelectrically converted into an effective wavelength component in the adjacent pixels, and it is possible to significantly increase the efficiency of utilization of light.

Next, the lowpass filter effect as one of technological advantages according to this embodiment will be described. In general, image pickup for obtaining satisfactory image characteristics consists of a first process for forming an object image with an optical apparatus, a second process for adjusting a high frequency component of a spatial frequency characteristic of the object image such that the high frequency component is suppressed, a third process for photoelectrically converting the object image whose spatial frequency characteristic has been adjusted, and a fourth process for correcting a response according to a spatial frequency with respect to an obtained electric signal. In this case, since sampling of an optical image is performed with the image pickup element having a limited number of pixels, in order to obtain a high quality image output, it is necessary to reduce components of a Nyquist frequency or more peculiar to the image pickup element in the spatial frequency characteristic of the optical image in accordance with the sampling theorem. Here, the Nyquist frequency is a frequency which is a half of a sampling frequency depending upon a pixel pitch. Therefore, the optimized series of processes can obtain a high quality image, in which aliasing distortion is less conspicuous, that is, moiré is less conspicuous, by adjusting an optical image to be sampled so as to be an optical image of a characteristic according to the Nyquist frequency peculiar to the image pickup element.

A Modulation Transfer Function (MTF), which is a spatial frequency transmission characteristic of an image, is an evaluation amount with which a characteristic concerning a sharpness of a digital still camera, a video camera, or the like can be represented well. Specific factors affecting this MTF are an imaging optical system serving as an optical apparatus, an optical lowpass filter for band limitation of an object image, an opening shape of a photoelectric conversion area of an image pickup element, digital aperture correction, and the like. An overall MTF representing a final image characteristic is given as a product of MFTs of the respective elements. That is, it is sufficient to find MTFs of the above-mentioned first to fourth processes and calculate a product of the MTFs.

However, since digital filter processing as the fourth process is applied to an image output which has already been sampled by the image pickup element, it is unnecessary to take into account high frequencies exceeding the Nyquist frequency.

Therefore, the structure for reducing a component having a frequency more than the Nyquist frequency peculiar to the image pickup element in the spatial frequency characteristic of the optical image means that a component having a frequency more than the Nyquist frequency is small in the product of MTFs of the first, second, and third processes excluding the fourth process. Here, in the case in which image pickup is performed on the premise that a still image is viewed as in a digital still camera, it is necessary to take into account the fact that an image tends to appear as an image with a higher resolution if a response in a frequency slightly below the Nyquist frequency is higher even if high frequencies exceeding the Nyquist frequency are not eliminated but remain more or less.

In the formation of an object image, which is the first process by an imaging optical system, in general, an optical aberration can be corrected easier in a center of a screen than in a peripheral part of the screen. It is necessary to obtain an extremely satisfactory characteristic close to a diffraction limit MTF, which depends upon an F number of an imaging lens, in the center of the image in order to obtain a satisfactory image in the peripheral part of the screen. In recent year, since miniaturization of pixels of an image pickup element has been advanced, this necessity is increasing. Therefore, it is better to consider the MTF for an imaging optical system assuming that the imaging optical system is an ideal aplanatic lens.

In addition, in an image pickup element in which light receiving openings with a width d are laid without a gap, since the width of the light receiving openings coincide with a pixel pitch, a response value of the third process at the Nyquist frequency u=d/2 is rather high. Therefore, it is a general practice to trap the vicinity of the Nyquist frequency in the second process in order to decrease a total MTF in the vicinity of the Nyquist frequency.

In the second process, an optical lowpass filter is usually used. A material having a birefringent characteristic such as a rock crystal is utilized for the optical lowpass filter. In addition, a phase-type diffraction grating may be utilized.

When a birefringent plate is placed in an optical path of an optical apparatus and is arranged to be slanted such that its optical axis is in parallel with a horizontal direction of an imaging surface, an object image according to ordinary light and an object image according to extraordinary light are formed deviating from each other in the horizontal direction by a predetermined amount. Trapping a specific spatial frequency with the birefringent plate means shifting a bright part and a dark part of a stripe of the spatial frequency such that both the parts overlap each other. An MTF according to the optical lowpass filter is expressed by expression (1).

$$R_2(u) = |\cos(\pi \cdot u \cdot \omega)| \quad (1)$$

Here, R2(u) is a response, u is a spatial frequency of an optical image, and ω is an object image separation width.

If a thickness of the birefringent plate is selected appropriately, it is possible to eliminate a response in the Nyquist frequency of the image pickup element. In the case in which the diffraction grating is utilized, the same effect can be obtained by separating the optical image into a plurality of images having a predetermined positional relationship and superimposing the images in accordance with diffraction.

However, it is necessary to grow a rock crystal or a crystal of lithium niobate or the like and then grind it to be thin in order to manufacture the birefringent plate, which is extremely expensive. In addition, even if the diffraction grating is utilized, since a highly precise microstructure is required of the diffraction grating, the birefringent plate is still expensive.

Figure 46:
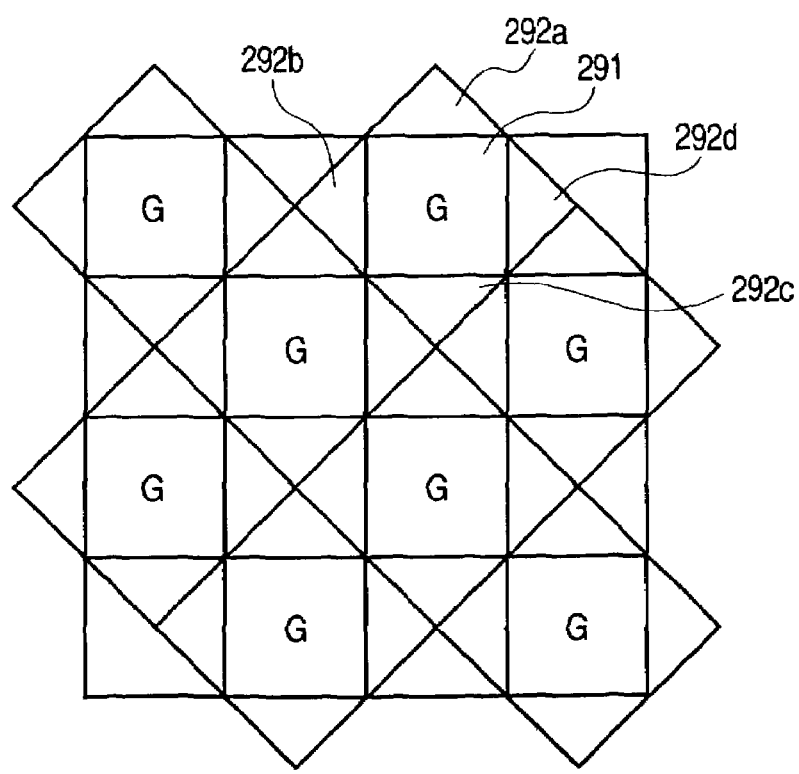
FIG. 46 shows a state of taking in light of green pixels.
Figure 47:
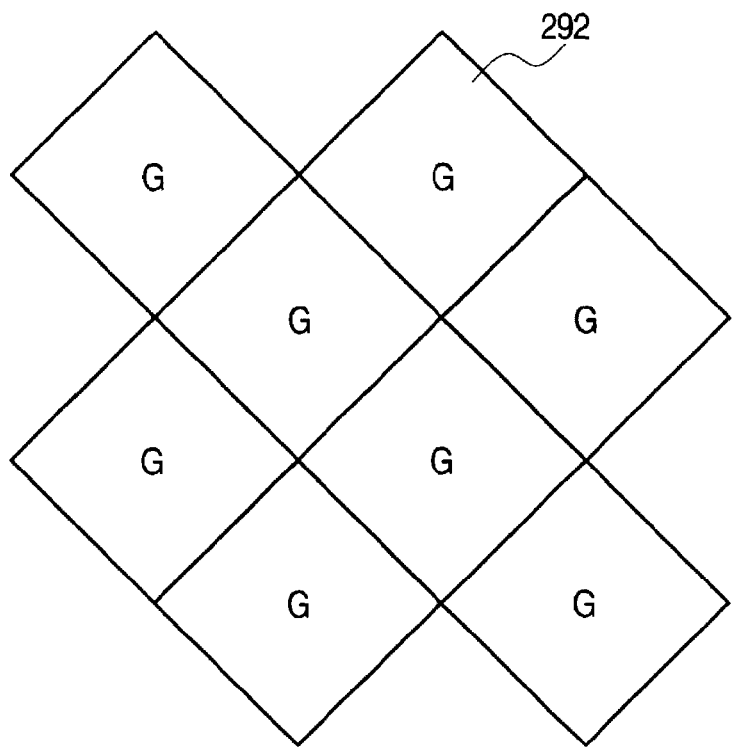
FIG. 47 illustrates an effective area for taking in light of the green pixels.

In the image pickup element according to the embodiment of the present invention, a substantial light receiving opening is larger than each pixel. When the image pickup element is compared with the conventional image pickup element of the Bayer array shown in FIG. 45 for each color of R, G, and B, first, the conventional opening of a G pixel is a size of a microlens, whereas, in the image pickup element according to the embodiment of the present invention, a pixel opening is larger than the original pixel opening 291 because it receives portions of 292*a*, 292*b*, 292*c*, and 292*d* from adjacent pixels as shown in FIG. 46. Consequently, a substantial light receiving opening including the sparing of green light component by the adjacent pixels is as shown in FIG. 47. Since the B pixel and the R pixel also have each color light component spared by the adjacent pixels, effective light receiving openings for these pixels have the similar shape to the G pixel. Therefore, as to all the pixels, it is seen that the pixels have light receiving openings which overlap with each other effectively.

In this way, when the substantial light receiving opening is larger than each pixel, an MTF which is not possible in a normal single plate image pickup apparatus can be obtained. As a result, a quality of an image is not degraded even if an optical lowpass filter is not provided. That is, it is possible to eliminate the second process for adjusting a high frequency component of a spatial frequency characteristic of an object image such that it is suppressed, and obtain a high quality image with less conspicuous aliasing distortion only through the third process for photoelectrically converting an object image. FIGS. 48 to 54 are graphs explaining the above.

Figure 48:
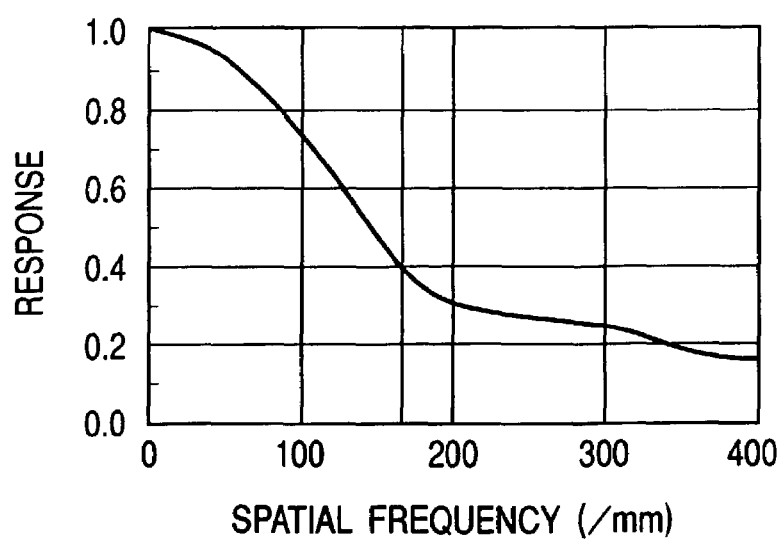
FIG. 48 is a graph showing an MTF with respect to a spatial frequency component in a horizontal direction of a pixel $100g$.
Figure 49:
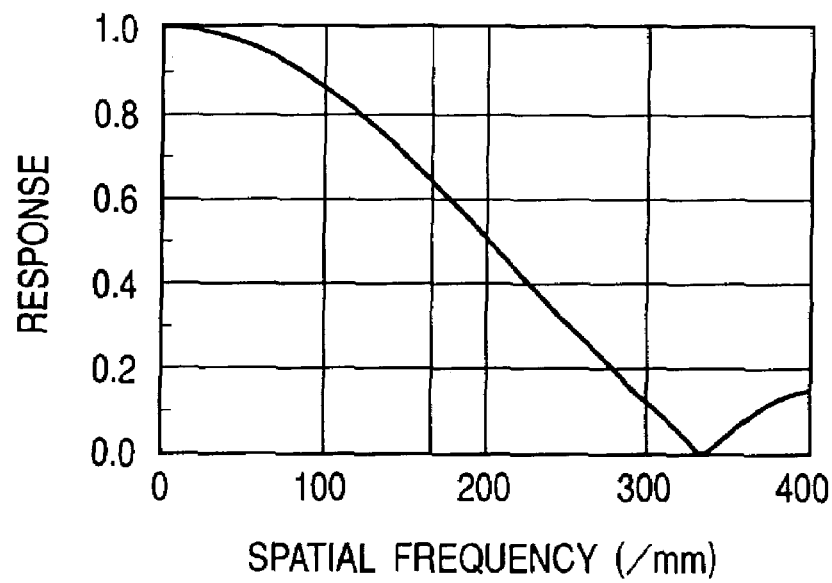
FIG. 49 is a graph showing an MTF of a rectangular opening pixel.
Figure 50:
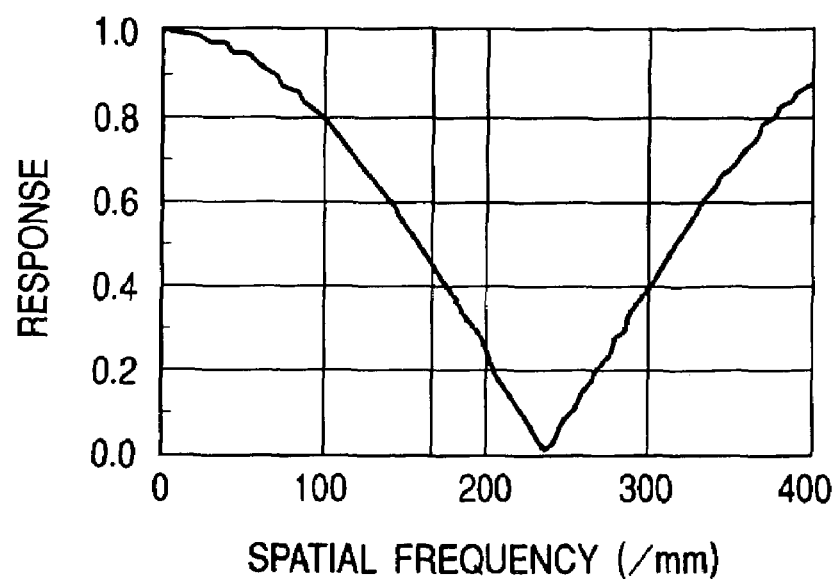
FIG. 50 is a graph showing an MTF of an optical lowpass filter.

First, FIG. 48 shows an MTF with respect to a spatial frequency component in a horizontal direction for a pixel 1110*g* of the image pickup element according to this embodiment. In addition, FIG. 49 shows an MTF of a pixel having a normal rectangular opening. It is assumed that a size of one pixel is □3 μm and a microlens has a size equivalent to one pixel in both the cases. Moreover, it is assumed that the pixel of this embodiment has an opening extending to a central part of an adjacent pixel.

A response of a conventional pixel having a rectangular opening shown in FIG. 45 can be briefly expressed by a SINC function such as expression (2) below.

$$R_3(u) = \left| \frac{\sin(\pi \cdot d \cdot u)}{(\pi \cdot d \cdot u)} \right| \quad (2)$$

Here, R3(u) is a response and d is a width of a light receiving opening of an image pickup element.

A first zero point (cut-off frequency) of expression (2) is a position of u=1/d. That is, the response becomes zero in a wavelength which coincides with the width of the light receiving opening. In an image pickup element in which light receiving openings are laid without a gap, since a width of a light receiving opening coincides with a pixel pitch, a response value of expression (2) in a Nyquist frequency u=d/2 is 0.636, which is rather high. Therefore, it is necessary to use an optical lowpass filter with the MTF shown in FIG. 12 as well in the conventional pixel having a rectangular opening. Here, it is taken into account the fact that, in the case in which image pickup is performed on the premise that a still image is viewed as in a digital still camera, an image tends to appear as an image with a higher resolution if a response in a frequency slightly below the Nyquist frequency is higher even if high frequencies exceeding the Nyquist frequency remain more or less.

On the other hand, in the pixel 1100*g* in this embodiment, a response increases to a high frequency side due to a diamond-shaped opening as shown in FIG. 47. It is sufficient to consider that this is a limitless collection of limitlessly thin strip-like rectangular openings whose MTF can be expressed by expression (2). A result of integrating the entire thin strip-like rectangular opening is as shown in FIG. 48. It is seen that, in a Nyquist frequency of 167/mm in case that a pixel pitch is assumed to be 3 μm, the pixel 100*g* has a rather lower response.

Figure 51:
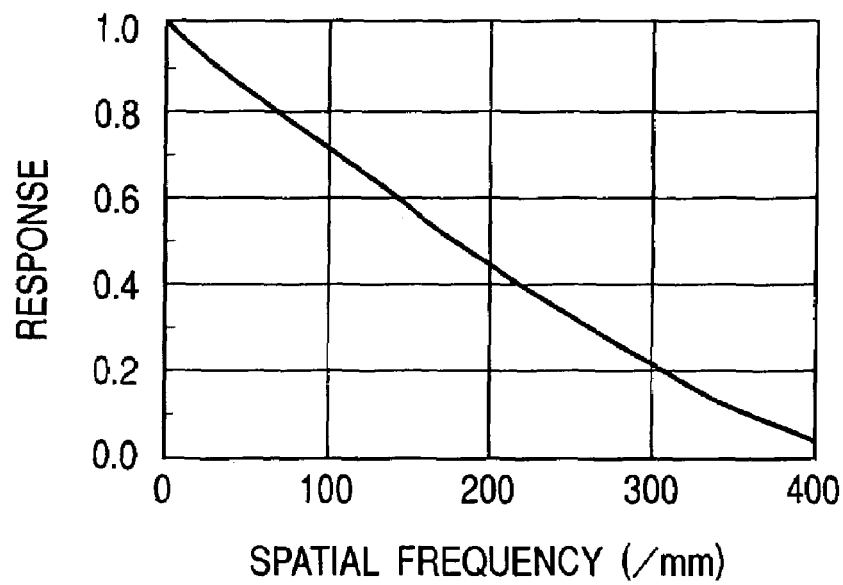
FIG. 51 is a graph showing an MTF of an aplanatic lens in case that an F number is assumed to be 4.0 and a wavelength of an object image is assumed to be 550 nm.

Next, FIG. 51 shows an MTF of an aplanatic lens in case that an F number is assumed to be 4.0 and a wavelength of an object image is assumed to be 550 nm. In an ideal lens which does not have aberration in terms of geometrical optics, an MTF thereof depends upon diffraction of light. A diffraction limit MTF depends upon the F number and is expressed by expression (3) below.

$$R_o = \frac{2 \times (\beta - \cos\beta \times \sin\beta)}{\pi} \quad (3)$$

$\beta = \cos^{-1}(u \cdot F \cdot \lambda)$

Here, u is a spatial frequency of an optical image, F is an F number of an optical system, and λ is a wavelength of the optical image.

A cut-off frequency of this imaging lens is 455/mm.

Thus, all data are now given for finding a total MTF of the first process for forming an object image with an optical apparatus, (the second process for adjusting a high frequency component of a spatial frequency characteristic of the object image such that it is suppressed), and the third process for photoelectrically converting the object image whose spatial frequency has been adjusted.

Figure 52:
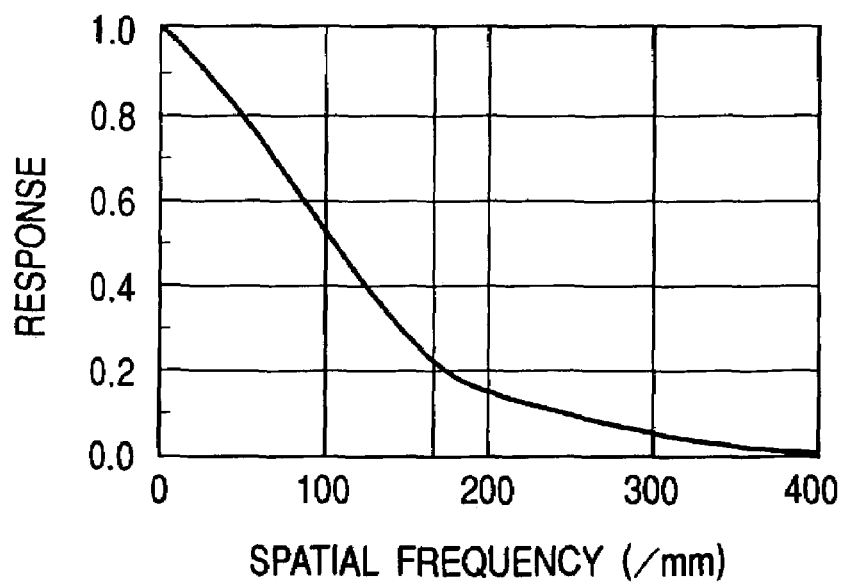
FIG. 52 is a graph showing a total MTF of an imaging lens and pixels of an image pickup element in case that the pixel $100g$ is used.
Figure 53:
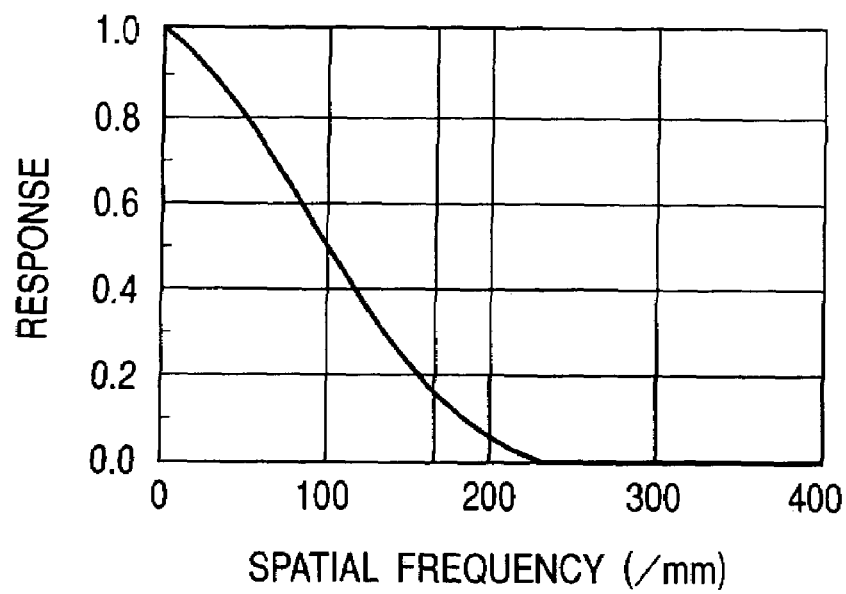
FIG. 53 is a graph showing a total MTF of an imaging lens, an optical lowpass filter, and pixels of an image pickup element in case that the conventional pixel is used.
Figure 54:
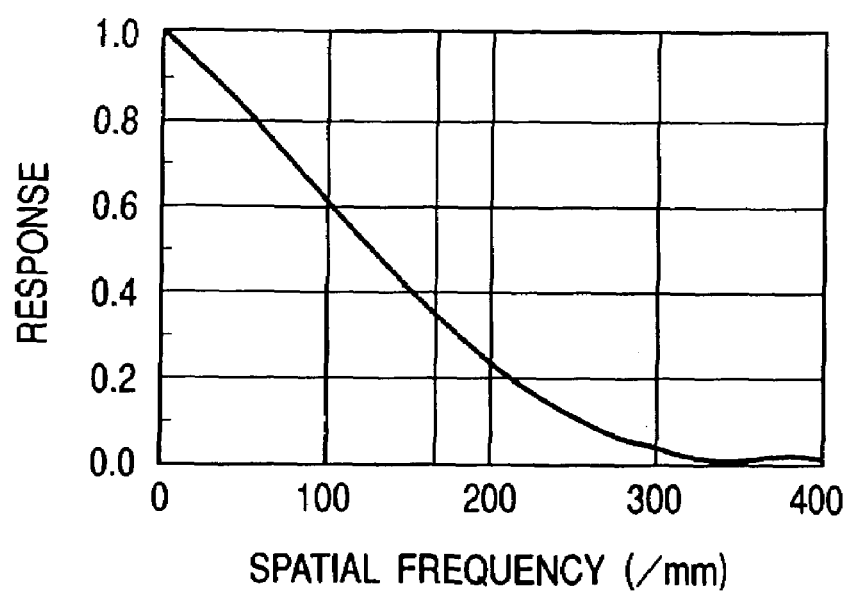
FIG. 54 is a graph showing a total MTF in case that the optical lowpass filter is not used in the conventional pixel.

FIG. 52 shows a total MTF of an imaging lens and pixels of an image pickup element in case that the pixel 1100g is used. On the other hand, FIG. 53 shows a total MTF of an imaging lens, an optical lowpass filter, and pixels of an image pickup element in case that the conventional pixel is used. Both the pixels have substantially equal responses at the Nyquist frequency of 167/mm and exhibits very similar characteristics as a whole. On the other hand, if the optical lowpass filter is not used in the conventional pixel, a response becomes too high at a Nyquist frequency as shown in FIG. 54. In this way, it is seen that the optical lowpass filter can be eliminated if the pixel 1100g is used.

Figure 66:
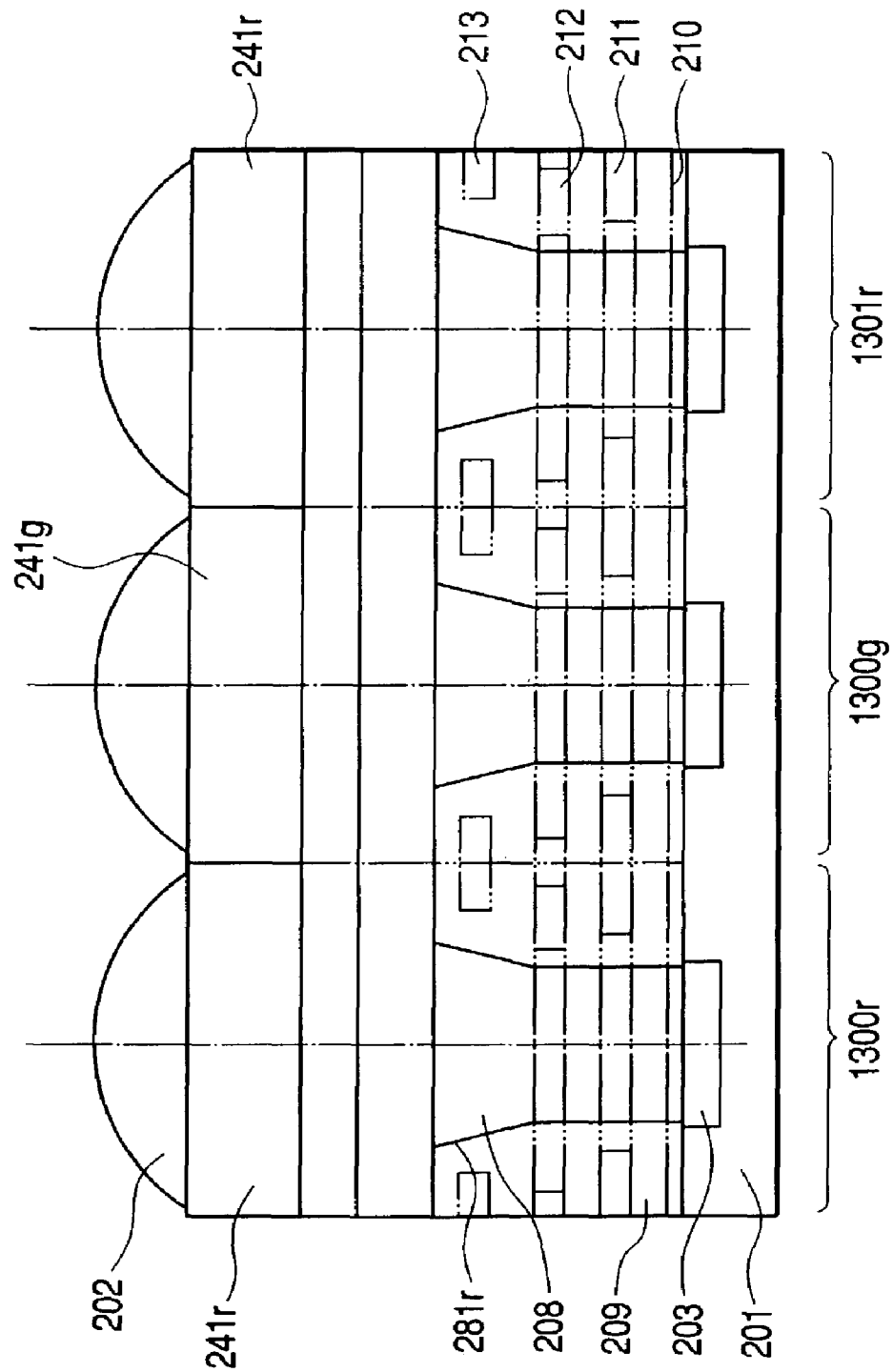
FIG. 66 is a view showing the sixth embodiment of the present invention.

In this embodiment, the image pickup element may include color filters as shown in FIG. 66, which transmit light of a specific wavelength range and absorb light of other wavelength ranges, as a wavelength transmission section instead of the dichroic films as shown in FIG. 39.

Sixth Embodiment

Figure 62:
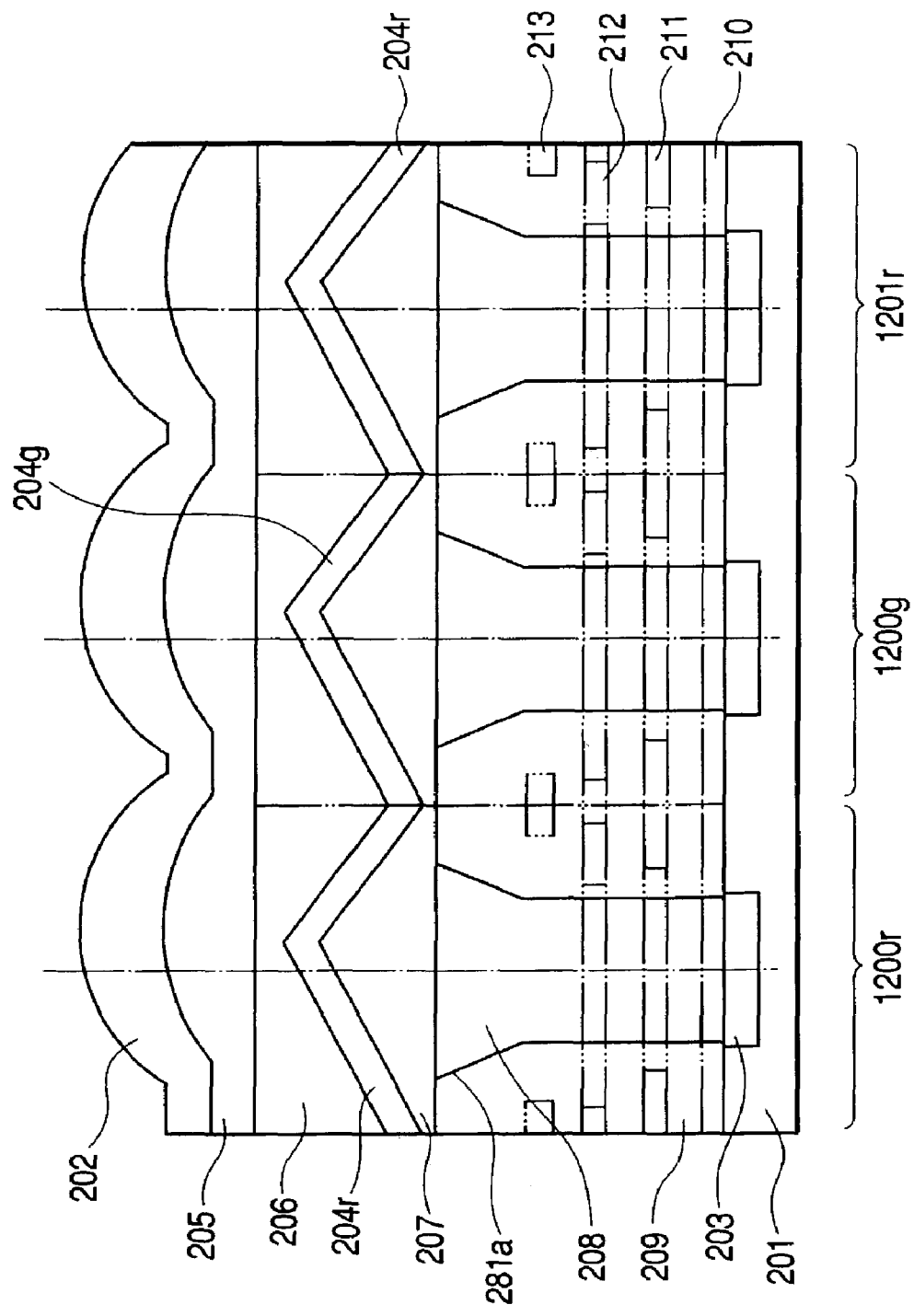
FIG. 62 is a view showing a sixth embodiment of the present invention.
Figure 63:
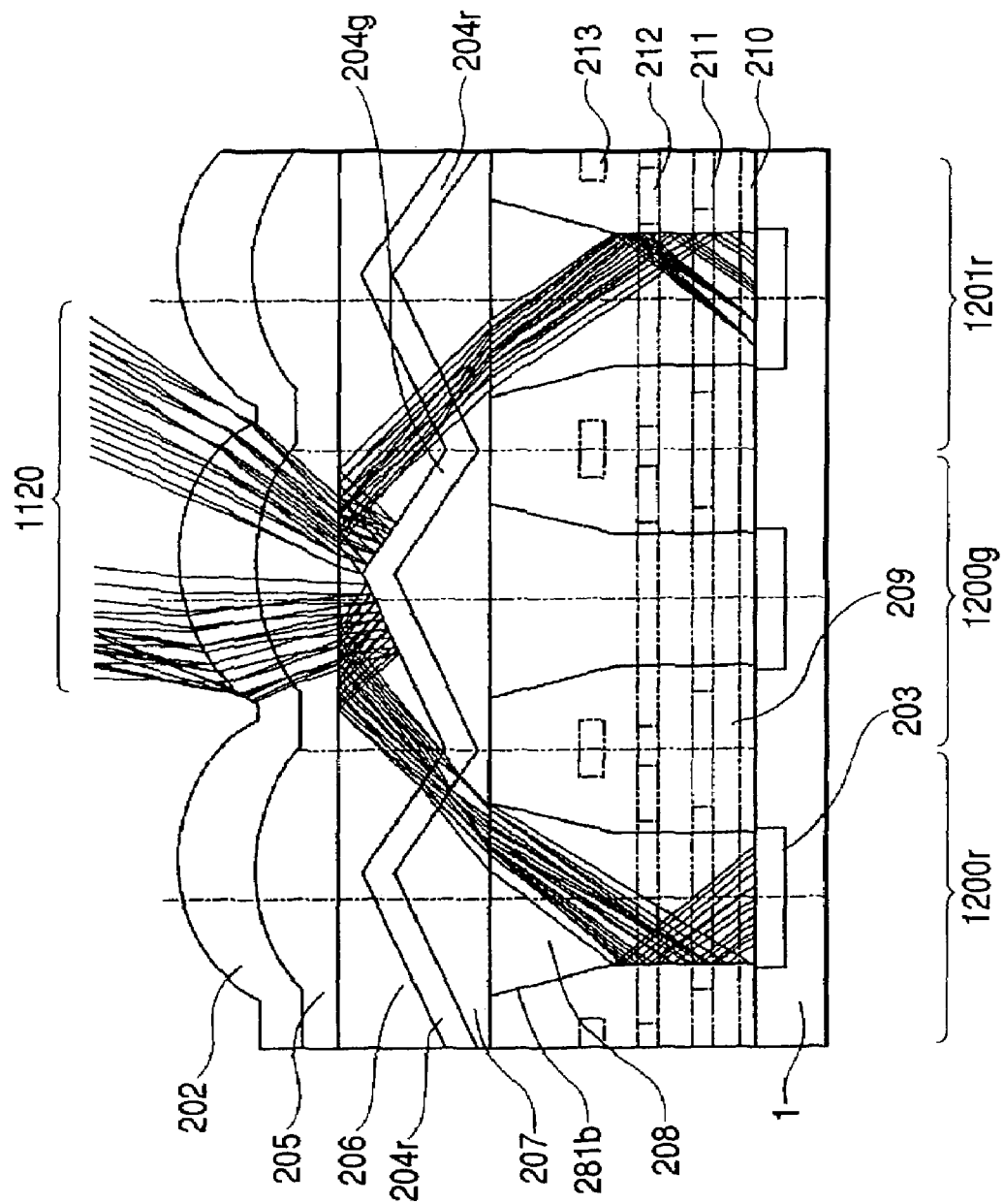
FIG. 63 is a view showing the sixth embodiment of the present invention.
Figure 64:
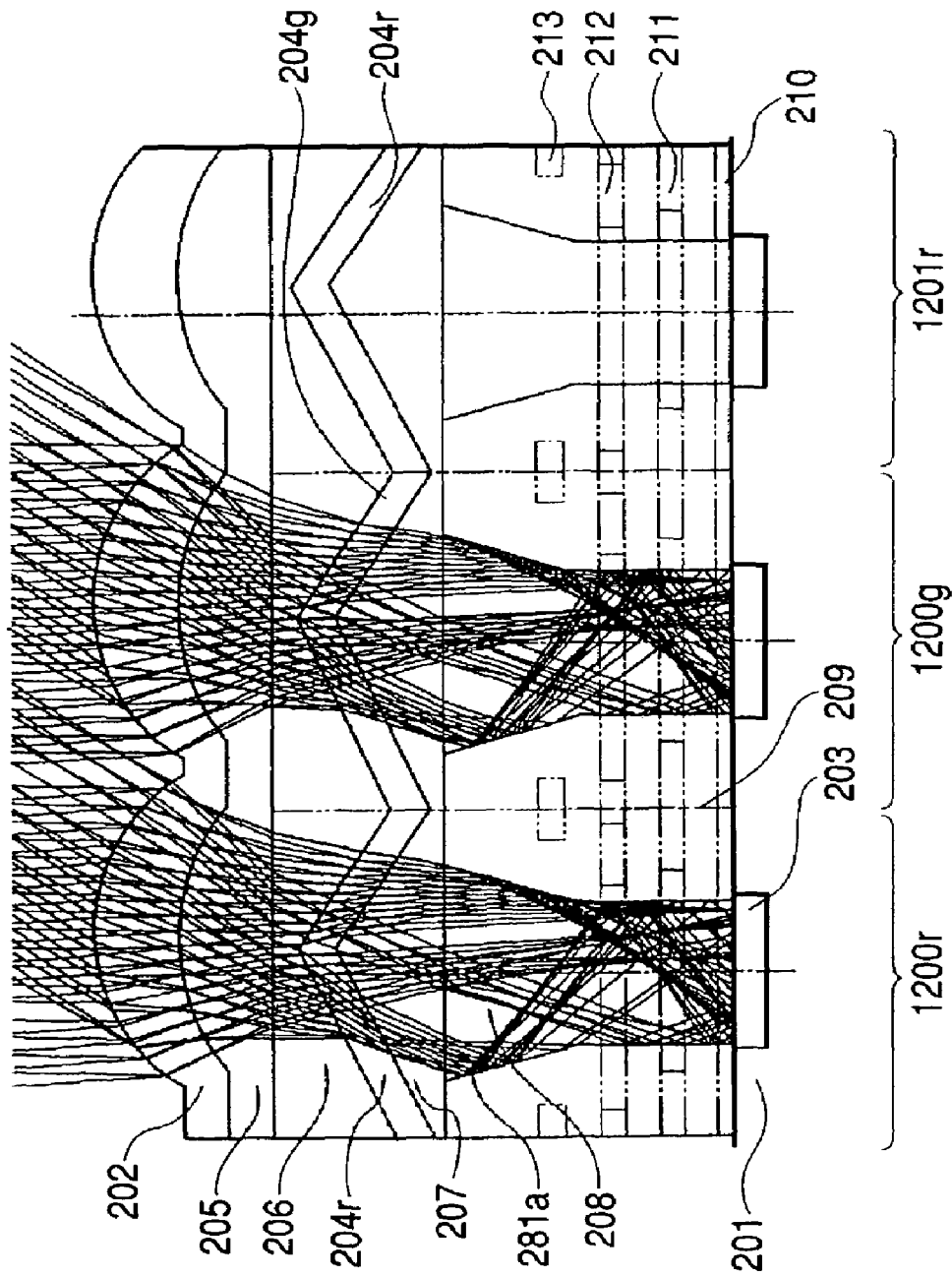
FIG. 64 is a traced view of light (reflected light) of the sixth embodiment of the present invention.

FIG. 62 shows a sixth embodiment of the present invention. It is assumed that components denoted by the identical reference symbols as those in FIG. 39 perform the identical functions. Behaviors of light in an image pickup element in this embodiment are as shown in FIGS. 63 and 64. An image pickup element shown in FIG. 63 is an image pickup element which is located in a place spaced apart from an optical axis of an imaging lens. Since the optical axis is on a right side of this figure, a pupil center of the imaging lens is located in the right side and light incident on the microlens 202 has an angle leaning to a right direction. Therefore, the microlens 202 is arranged to be inclined to a right side from a center of a pixel, whereby more obliquely incident light can be taken in. As in the first embodiment, FIG. 63 shows behaviors of only light which is incident on a pixel 1200g for receiving green light and reflected by the dichroic film 204g, that is, light including blue light and red light. Light which has exited a pupil of an imaging lens placed in a sufficiently distant position compared with a size of a pixel, passes through an infrared light cut filter to become light beams like object light 1120. The object light 1120 coming from above in the figure is incident on the microlens 202 and subjected to a condensing action. Next, the light is incident on the third refractive index area 205 and the fourth refractive index area 206 in order and reach the dichroic film 204g. Here, light other than green light is subjected to a reflecting action due to characteristics of the dichroic film 204g. Since the dichroic film 204g is formed on a surface having a square pyramid shape as shown in FIG. 42, the reflected light changes a direction from a center to an outside thereof and travels. In addition, since the light is inclined to the right side in the figure, a vertex of the square pyramid forming the dichroic film 204g is formed in a shape inclined to the right side. Moreover, in this embodiment, angles of slopes are different. Consequently, angles of light incident on a right side slope and a left side slope of the dichroic film 204g, respectively, can be matched. Then, light having an angle equal to or larger than a critical angle is subjected to a total reflection action on the interface between the fourth refractive index area 206 and the third refractive index area 205. The light directed downward again travels toward pixels 1200r and 1201r for receiving red light which are adjacent pixels. The light transmitted through the dichroic film 204r travels through the fifth refractive index area 207 and the first refractive index area 208 in order. Subsequently, the light is about to travel from the first refractive index area 208 to the second refractive index area 209. However, again, since the first refractive index area 208 has a higher refractive index than the second refractive index area 209 as described above, light incident at an angle equal to or larger than a critical angle is totally reflected on the interface. Since the interface between the first refractive index area 208 and the second refractive index area 209 is formed in a taper shape with a widened incident portion, a frontage for taking in incident light is widened and a large amount of light can be taken in the first refractive index area 208. In addition, since the interface in the vicinity of the photoelectric conversion section 203 is formed of two surfaces which are substantially parallel with an optical axis of an imaging lens, the light, which has not been incident on the photoelectric conversion section 203 by the first total reflection, is totally reflected on an interface on the opposite side again and all the light are finally incident on the photoelectric conversion section 203.

FIG. 64 shows behaviors of light which are subjected to a transmitting action in the dichroic film 204 light coming from above in this figure is incident on the microlens 202 and is subjected to a collimating action. Next, the light is incident on the third refractive index area 205 and the fourth refractive index area 206 in order and reach the dichroic film 204g. Only light with a predetermined wavelength is selectively transmitted through the dichroic film 204g and is incident on the fifth refractive index area 207.

Figure 65:
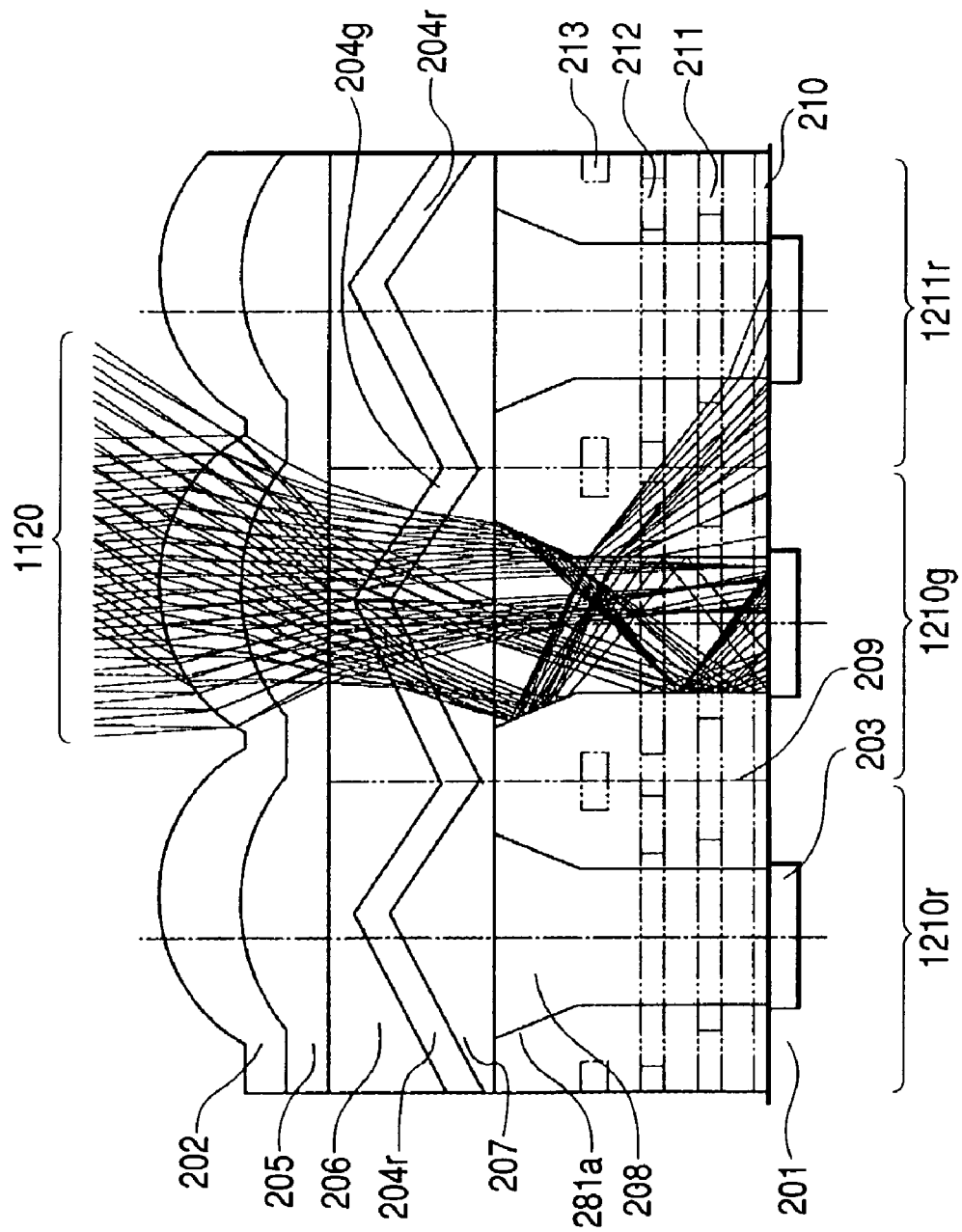
FIG. 65 is a traced view of light (transmitted light) of the sixth embodiment of the present invention.

Then, the light travels to the first refractive index area 208 and is subjected to an action for repeating total reflection on the interface between the first refractive index area 208 and the second refractive index area 209, thereby being guided to the photoelectric conversion section 203. Since the interface between the first refractive index area 208 and the second refractive index area 209 is formed in a taper shape with a widened incident portion, the light can be also totally reflected on the taper surface 281a and guided to the photoelectric conversion section 203. If this taper surface 281a is formed in the same shape as pixels in the vicinity of an optical axis center of an imaging lens as shown in FIG. 65, in some cases, the light totally reflected on the taper surface 281a cannot be totally reflected on a surface on the opposite side and passes through to the second refractive index area 209. In order to prevent this, an angle defined between the optical axis and the taper surface is made smaller than that in the vicinity of the center, whereby an angle of the light reflected on the taper surface does not exceed a critical angle on the surface on the opposite side and light of a sufficiently wide area can be taken in as in the pixels in the vicinity of the center.

Note that, in the form shown in FIG. 62 in this embodiment, angles of taper surfaces are made symmetrical with respect to a central axis of a pixel. However, as is seen from FIGS. 64 and 65, light totally reflected on a slope on a right side can be taken in both sides around the central axis. Therefore, the angles of the taper surface are not always required to be made symmetrical and a different angle may be given to each taper surface forming a taper section.

Seventh Embodiment

Figure 67:
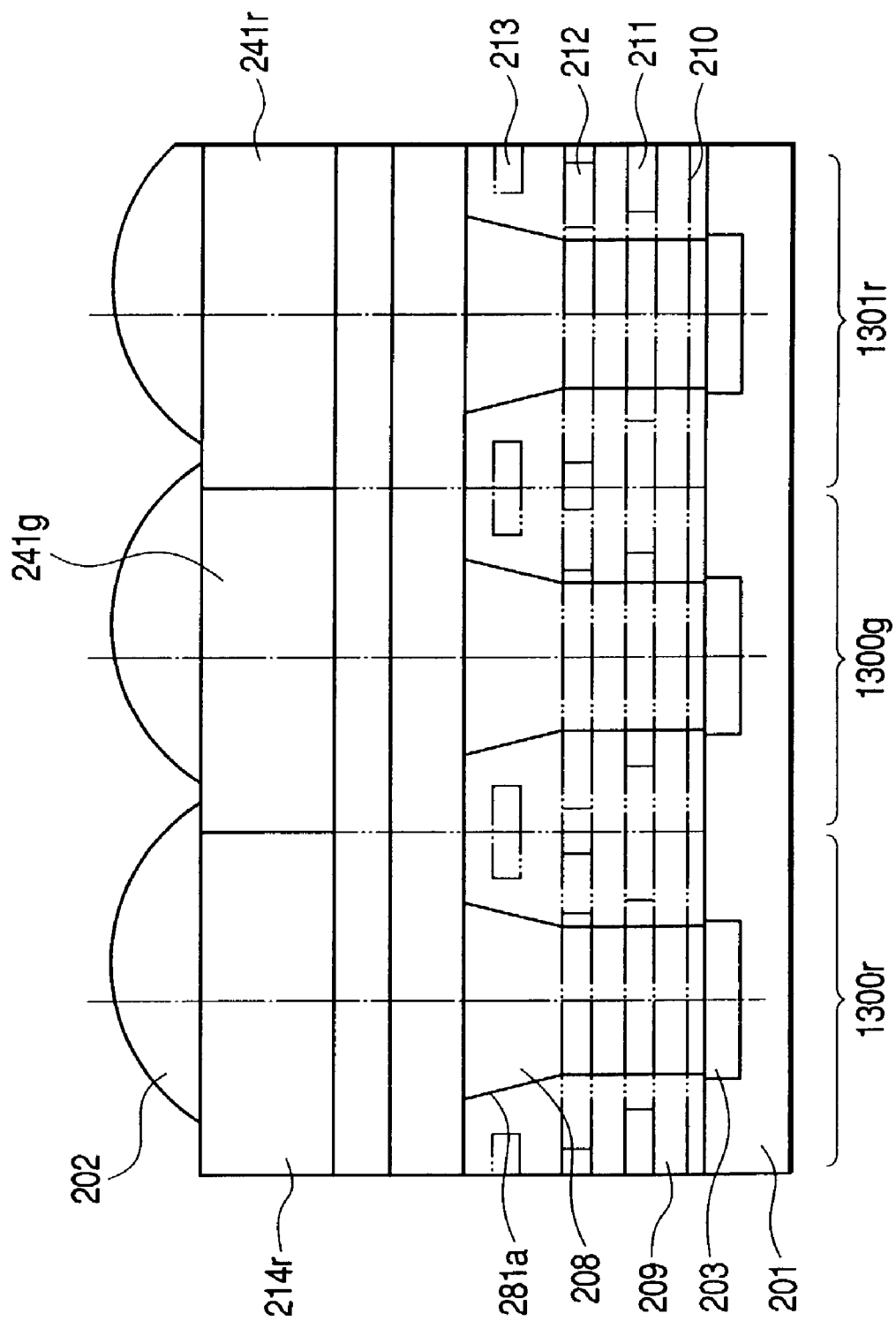
FIG. 67 is a view showing a seventh embodiment of the present invention.
Figure 68:
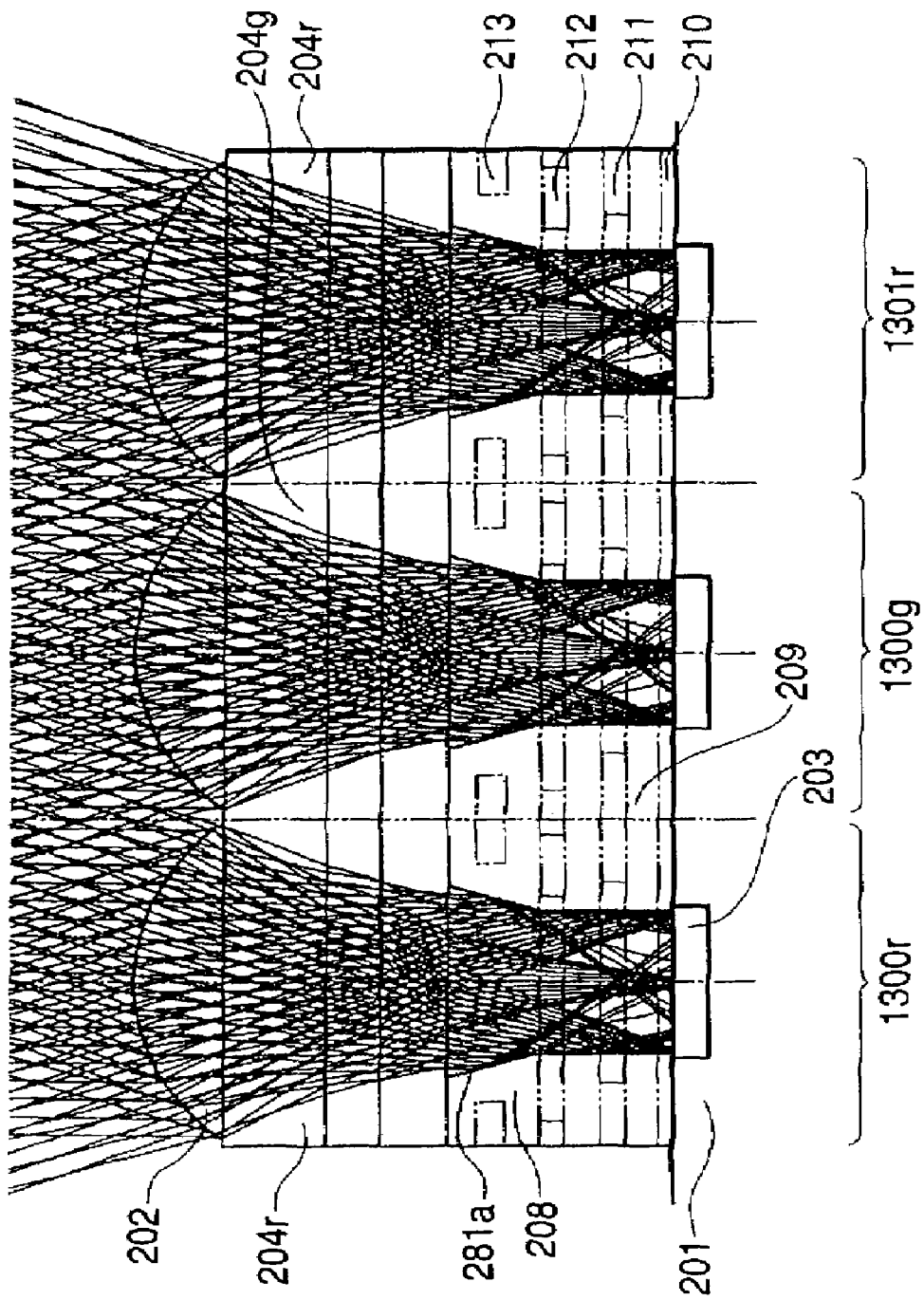
FIG. 68 is a traced view of light (reflected light) of the seventh embodiment of the present invention.
Figure 69:
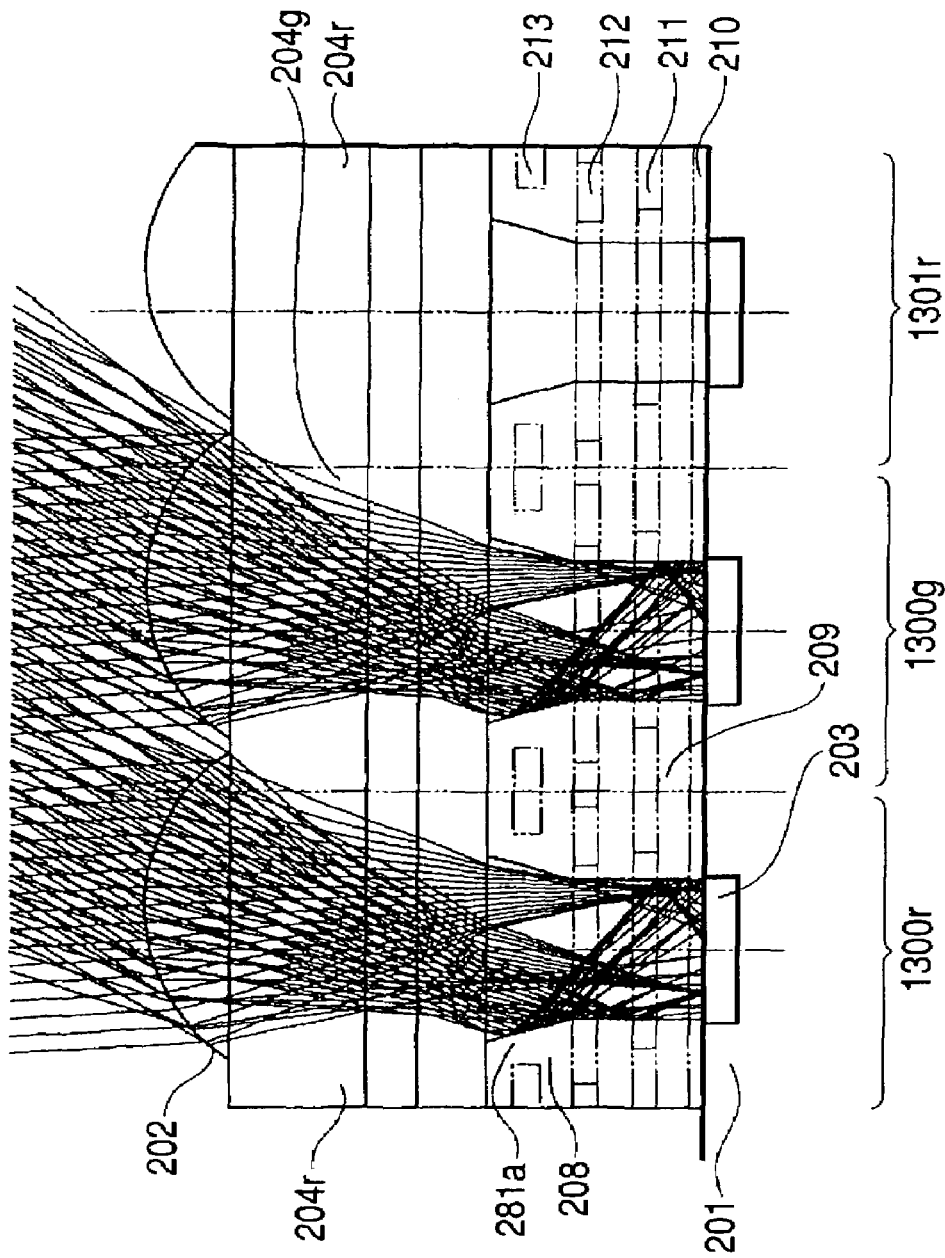
FIG. 69 is a traced view of light (transmitted light) of the seventh embodiment of the present invention.

FIGS. 66 and 67 show a seventh embodiment of the present invention. It is assumed that components denoted by the identical reference symbols as those in FIG. 39 perform the identical functions. FIG. 66 shows pixels in the vicinity of an optical axis center of an imaging lens and FIG. 67 shows pixels located in a place spaced apart from the optical axis center of the imaging lens. Behaviors of light in an image pickup element in this embodiment are as shown in FIGS. 68 and 69. This is an image pickup element in which a structure of this embodiment is used in an image pickup element provided with color filters 241g and 241f using the conventional dyes. Light which has exited a pupil of an imaging lens placed in a sufficiently distant position compared with a size of a pixel, passes through an infrared light cut filter to be incident on the microlens 202 and subjected to a condensing action. Next, the light is incident on the color filers 241 (241g and 241r), and wavelength selection of the transmitted light is performed. Since the cooler filter 241g is a green color filter, only green light is transmitted and light of the other colors is absorbed in the color filter 241.

Then, the light travels to the first refractive index area 208 and is subjected to an action for repeating total reflection on the interface between the first refractive index area 208 and the second refractive index area 209, thereby being guided to the photoelectric conversion section 203. Since the interface between the first refractive index area 208 and the second refractive index area 209 is formed in a taper shape with a widened incident portion, the light can be also totally reflected on the taper surface 281a and guided to the photoelectric conversion section 203. In this embodiment, both the pixels in the vicinity of the optical axis of the imaging lens (FIG. 66) and the pixels spaced apart from the center have the same angle of the taper surface. However, in some cases, if the angles of the taper surface 281a are the same, totally reflected light cannot be totally reflected on a surface on the opposite side and passes through to the second refractive index area 209. In such a case, an angle defined between the optical axis and the taper surface is made smaller than that in the vicinity of the center, whereby an angle of the light reflected on the taper surface does not exceed a critical angle on the surface on the opposite side and light of a sufficiently wide area can be taken in as in the pixels in the vicinity of the center.

A solid-state image pickup element having any one of the structures of the first to seventh embodiments described above may be a charge transfer type such as a CCD solid-state image pickup element or may be an XY address type such as a CMOS image sensor.

An image pickup apparatus using the solid-state image pickup element having any one of the structures described in the first to seventh embodiments described above will be described with reference to FIG. 70.

Figure 70:
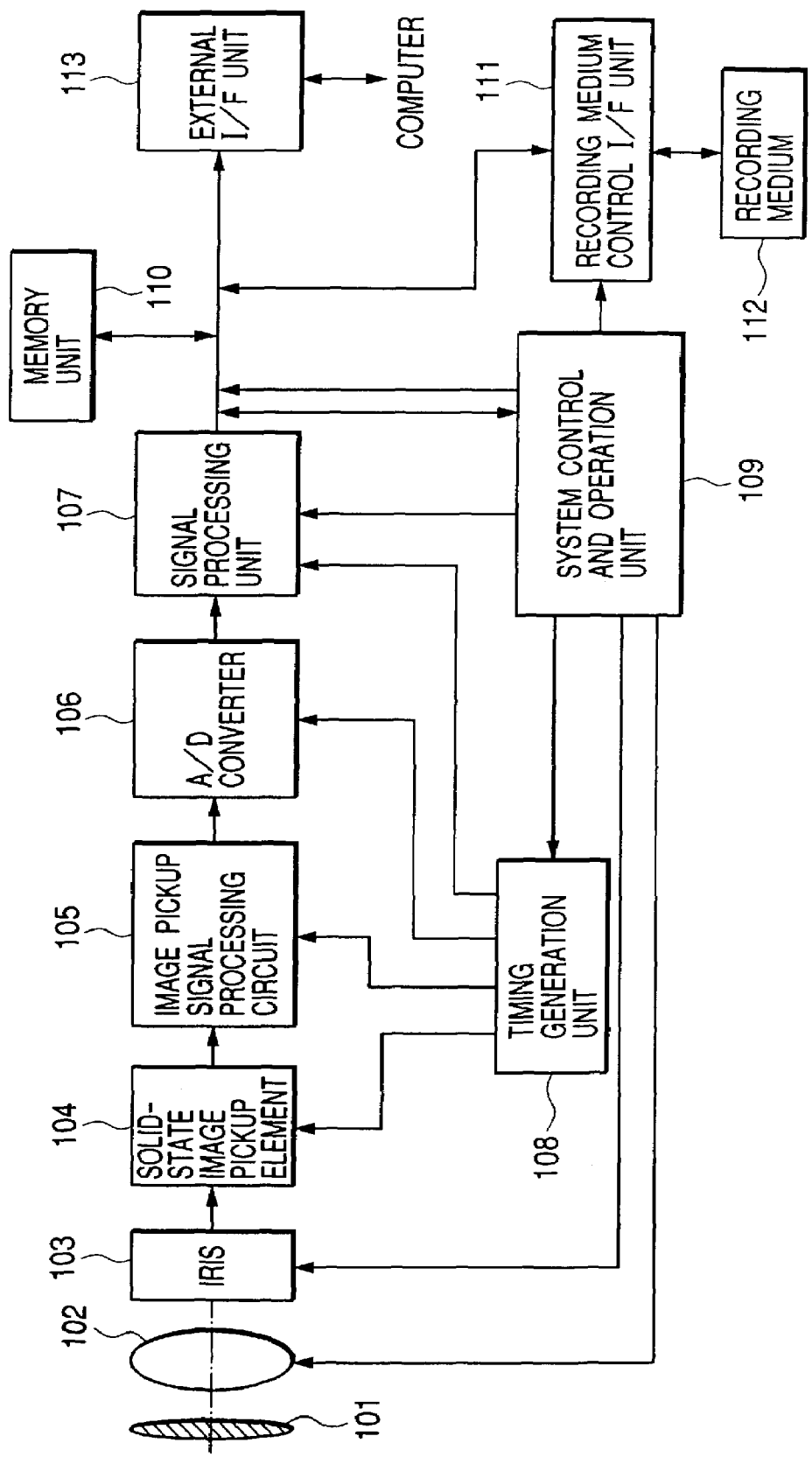
FIG. 70 is a block diagram showing an image pickup apparatus.

In FIG. 70, reference numeral 101 denotes a barrier also severs as a protect for a lens and a main switch; 102, a lens for focusing an optical image of an object on a solid-state image pickup element 104; 103, a stop for varying an amount of light having passed through the lens 102; 104, a solid-state image pickup element for taking in the optical image of the subject focused by the lens 102 as an image signal; 105, an image pickup signal processing circuit including a gain variable amplifier section for amplifying the image signal outputted from the solid-state image pickup element 104, and a gain correction circuit section for correcting a gain value; 106, an A/D converter for performing analog/digital conversion of the image signal outputted from the solid-state image pickup element; 107; a signal processing unit for applying various corrections to the image data outputted from the A/D converter 106 and compressing the data; 108, a timing generation unit for outputting various timing signals to the solid-state image pickup element 104, the image pickup signal processing circuit 105, the A/D converter 106, and the signal processing unit 107; 109, a system control and operation unit which executes various operations and controls an overall image pickup apparatus; 110, a memory unit for temporarily storing the image data; 111, a recording medium control I/F unit for recording the image data on a recording medium and reading out the image data therefrom; 112, a detachable recording medium such as a semiconductor memory on which the image data is recorded and from which the image data is read out; and 113, an external interface unit for communicating with an external computer or the like.

Next, operations of the image pickup apparatus at the time of image pickup in the above-mentioned structure will be described.

When the barrier 1 is opened, a main power supply is turned on, a power supply for a control system is turned on next, and a power supply of an image pickup system circuit such as the A/D converter 106 is further turned on.

Then, in order to control an amount of exposure, the system control and operation unit 109 opens the stop 103, and a signal outputted from the solid-state image pickup element 104 is inputted into the signal processing unit 107 after being converted by the A/D converter 106.

The system control and operation unit 109 performs an arithmetic operation of exposure based on data of the signal. The system control and operation unit 109 judges brightness from a result of performing this photometry and controls the stop 103 according to the result.

Next, the system control and operation unit 109 extracts a high frequency component and performs an arithmetic operation of a distance to an object based on the signal outputted from the solid-state image pickup element 104. Thereafter, the system control and operation unit 109 drives the lens 102 and judges whether or not the lens 102 is focused. When it is judged that it is not focused, the system control and operation unit 109 drives the lens 102 again to perform distance measurement.

Then, after the in-focus has been confirmed, main exposure is started.

When the exposure ends, the image signal outputted from the solid-state image pickup element 104 is A/D converted by the A/D converter 106 and written into the memory unit 110 by the system control and operation unit 109 through the signal processing unit 107. Thereafter, the data stored in the memory unit 110 is recorded on the detachable recording medium 12 such as a semiconductor memory through the recording medium control I/F unit 111 by the control of the system control and operation unit 109.

In addition, the data may be directly inputted in a computer or the like through the external I/F unit 113 to process an image.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup element comprising:
   a photoelectric conversion section;
   a wavelength selection section formed closer to an incident side of light than said photoelectric conversion section, for transmitting light of a predetermined wavelength range and reflecting light of wavelength beyond the predetermined wavelength range;
   a first area having a predetermined refractive index and being formed closer to the incident side of light than said wavelength selection section; and
   a second area having a predetermined refractive index, and being formed closer to the incident side of light than said first area,
   wherein the refractive index of said first area is higher than the refractive index of said second area and the light reflected by said wavelength selection section is reflected at the boundary between said first area and said second area.

2. An image pickup element according to claim 1, further comprising:
   a third area having a predetermined refractive index and being formed between said wavelength selection section and said photoelectric conversion section; and
   a fourth area having a predetermined refractive index and being formed in a peripheral part of said third area,
   wherein the refractive index of said third area is higher than the refractive index of said fourth area.

3. An image pickup element according to claim 2, further comprising:
   a fifth area having a predetermined refractive index and being formed between said third area and said wavelength selection section, wherein the refractive index of said third area is higher than the refractive index of said fifth area.

4. An image pickup element according to claim 1, wherein said second area is a microlens for condensing light.

5. An image pickup element according to claim 1, wherein a microlens for condensing light is provided on said second area.

6. An image pickup element according to claim 4, wherein a surface where the microlens and said second area are in contact with each other has a curvature.

7. An image pickup element according to claim 5, wherein a surface where the microlens and said second area are in contact with each other has a curvature.

8. An image pickup element according to claim 3, wherein said fifth area includes a slope extending from a central part to a peripheral part thereof.

9. An image pickup element according to claim 3, wherein said fifth area has a square pyramid shape.

10. An image pickup element according to claim 1, wherein said wavelength selection section includes a slope extending from a central part to a peripheral part thereof.

11. An image pickup element according to claim 1, wherein said wavelength selection section has a square pyramid shape.

12. An image pickup element according to claim 10, wherein said wavelength selection section transmits light of a first wavelength range, and also, reflects light of a second wavelength range.

13. An image pickup element according to claim 11, wherein said wavelength selection section transmits light of a first wavelength range, and also, reflects light of a second wavelength range.

14. An image pickup apparatus comprising:
    an image pickup element according to claim 1;
    an analog/digital conversion unit which converts a signal from said image pickup element to a digital signal; and
    a signal processing circuit which processes the signal from said analog/digital conversion unit.

* * * * *

UNITED STATES PATENT AND TRADEMARK OFFICE
CERTIFICATE OF CORRECTION

PATENT NO.        : 7,250,973 B2
APPLICATION NO.   : 10/369938
DATED             : July 31, 2007
INVENTOR(S)       : Hideki Dobashi et al.

It is certified that error appears in the above-identified patent and that said Letters Patent is hereby corrected as shown below:

Column 1, line 40, delete "61nmg, 61nmb" and insert --61mng, 61mnb --

Column 1, line 41, delete "61nmr, 61nmg2" and insert -- 61mnr, 61mng2 --

Column 9, line 34, delete "100r and 100r" and insert -- 100r and 101r --

Column 9, line 36, delete "100r and 100r" and insert -- 100r and 101r --

Column 11, line 64, delete "1110g" and insert -- 110g --

Column 16, line 47, delete "pixel 100g" and insert -- pixel 1100g --

Signed and Sealed this

First Day of April, 2008

JON W. DUDAS
*Director of the United States Patent and Trademark Office*